United States Patent
Noguchi et al.

(10) Patent No.: US 7,232,757 B2
(45) Date of Patent: *Jun. 19, 2007

(54) SEMICONDUCTOR INTEGRATED CIRCUIT DEVICE AND FABRICATION METHOD FOR SEMICONDUCTOR INTEGRATED CIRCUIT DEVICE

(75) Inventors: Junji Noguchi, Ome (JP); Naohumi Ohashi, Hannou (JP); Tatsuyuki Saito, Ome (JP)

(73) Assignee: Renesas Technology Corp., Tokyo (JP)

( * ) Notice: Subject to any disclaimer, the term of this patent is extended or adjusted under 35 U.S.C. 154(b) by 252 days.

This patent is subject to a terminal disclaimer.

(21) Appl. No.: 10/811,927

(22) Filed: Mar. 30, 2004

(65) Prior Publication Data

US 2004/0180534 A1 Sep. 16, 2004

Related U.S. Application Data

(63) Continuation of application No. 09/825,946, filed on Apr. 5, 2001, now Pat. No. 6,764,950.

(30) Foreign Application Priority Data

Apr. 5, 2000 (JP) ............................ 2000-104015

(51) Int. Cl.
*H01L 21/44* (2006.01)
(52) U.S. Cl. .................... 438/687; 438/622; 438/637; 438/642; 438/643; 438/644; 438/645; 438/672; 438/675
(58) Field of Classification Search ................ 438/622, 438/637, 642–645, 672, 675, 687
See application file for complete search history.

(56) References Cited

U.S. PATENT DOCUMENTS

| | | | |
|---|---|---|---|
| 6,048,789 A | 4/2000 | Vines | |
| 6,136,680 A | 10/2000 | Lai | |
| 6,153,523 A | 11/2000 | Van Ngo | |
| 6,159,857 A | 12/2000 | Liu | |
| 6,171,957 B1 | 1/2001 | Maekawa | |
| 6,177,347 B1* | 1/2001 | Liu et al. | 438/687 |
| 6,181,012 B1 | 1/2001 | Edelstein | |
| 6,191,007 B1 | 2/2001 | Matsui | |
| 6,242,349 B1 | 6/2001 | Nogami | |
| 6,284,657 B1* | 9/2001 | Chooi et al. | 438/687 |
| 6,348,402 B1 | 2/2002 | Kawanoue | |
| 6,348,410 B1 | 2/2002 | Ngo | |
| 6,355,571 B1 | 3/2002 | Huang | |

(Continued)

FOREIGN PATENT DOCUMENTS

JP 6037038 2/1994

(Continued)

*Primary Examiner*—Michael Trinh
*Assistant Examiner*—Bac H. Au
(74) *Attorney, Agent, or Firm*—Antonelli, Terry, Stout & Kraus, LLP.

(57) ABSTRACT

Cu interconnections embedded in an interconnection slot of a silicon oxide film are formed by polishing using CMP to improve the insulation breakdown resistance of a copper interconnection formed using the Damascene method, and after a post-CMP cleaning step, the surface of the silicon oxide film and Cu interconnections is treated by a reducing plasma (ammonia plasma). Subsequently, a continuous cap film (silicon nitride film) is formed without vacuum break.

20 Claims, 78 Drawing Sheets

U.S. PATENT DOCUMENTS 6,521,532 B1 2/2003 Cunningham
6,593,239 B2 7/2003 Kaufman

FOREIGN PATENT DOCUMENTS

| | | |
|---|---|---|
| JP | 6224194 | 8/1994 |
| JP | 9082798 | 3/1997 |
| JP | 10154709 | 6/1998 |
| JP | 10261715 | 9/1998 |
| JP | 11016912 | 1/1999 |
| JP | 11087349 | 3/1999 |
| JP | 11087509 | 3/1999 |
| JP | 11220023 | 8/1999 |

* cited by examiner

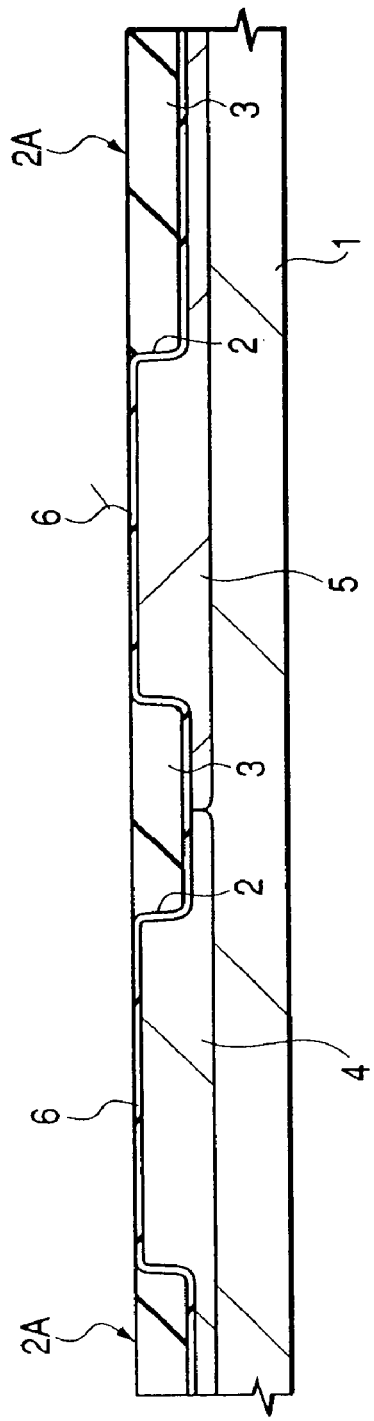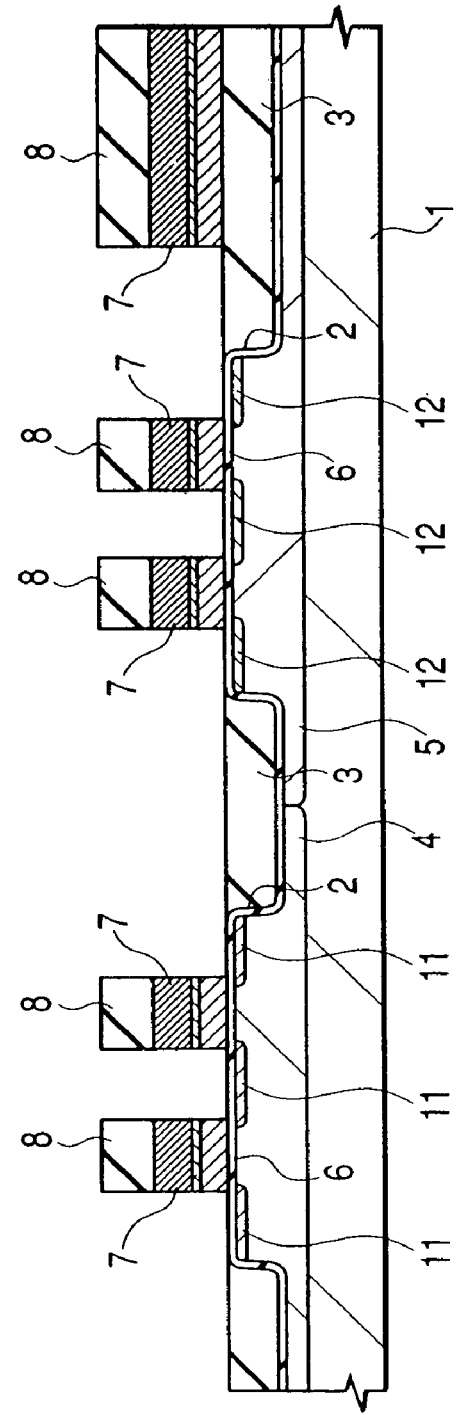

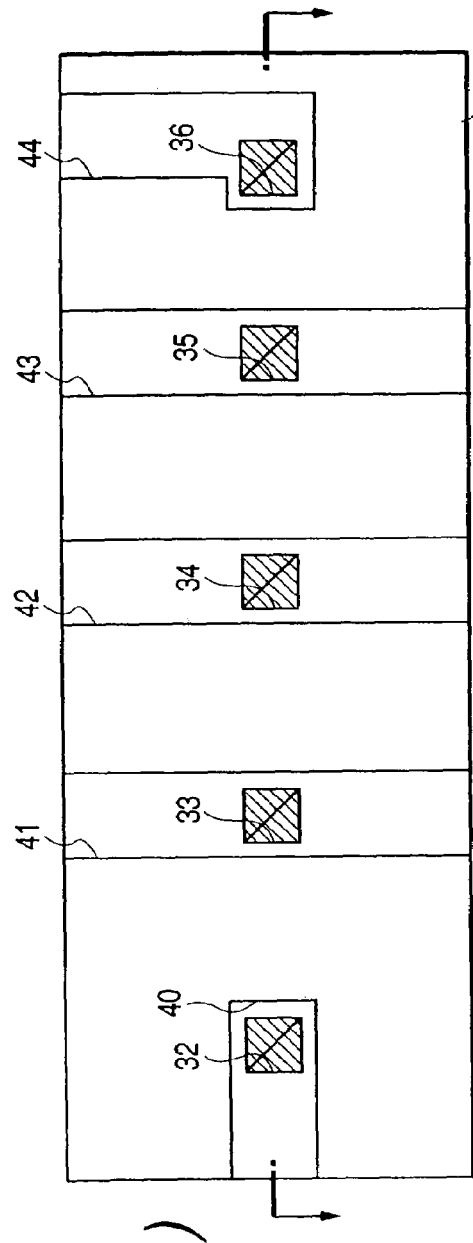
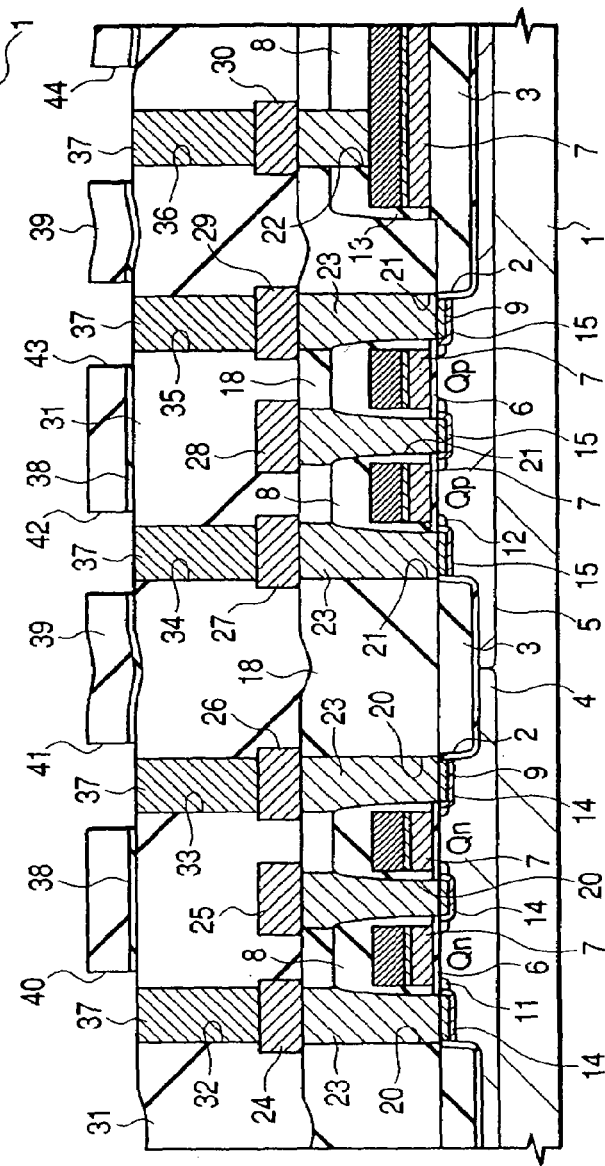
FIG. 7(a)
FIG. 7(b)

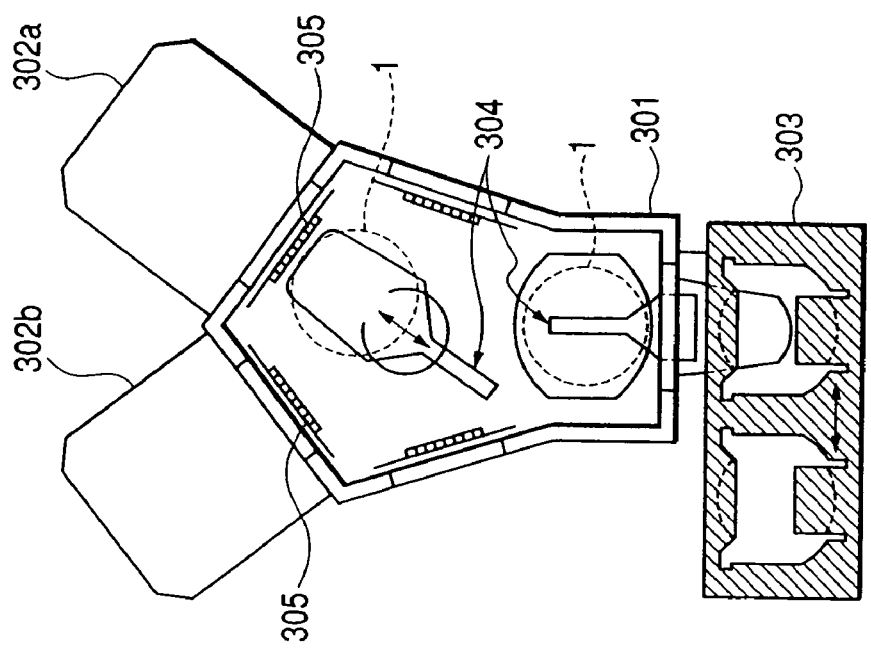
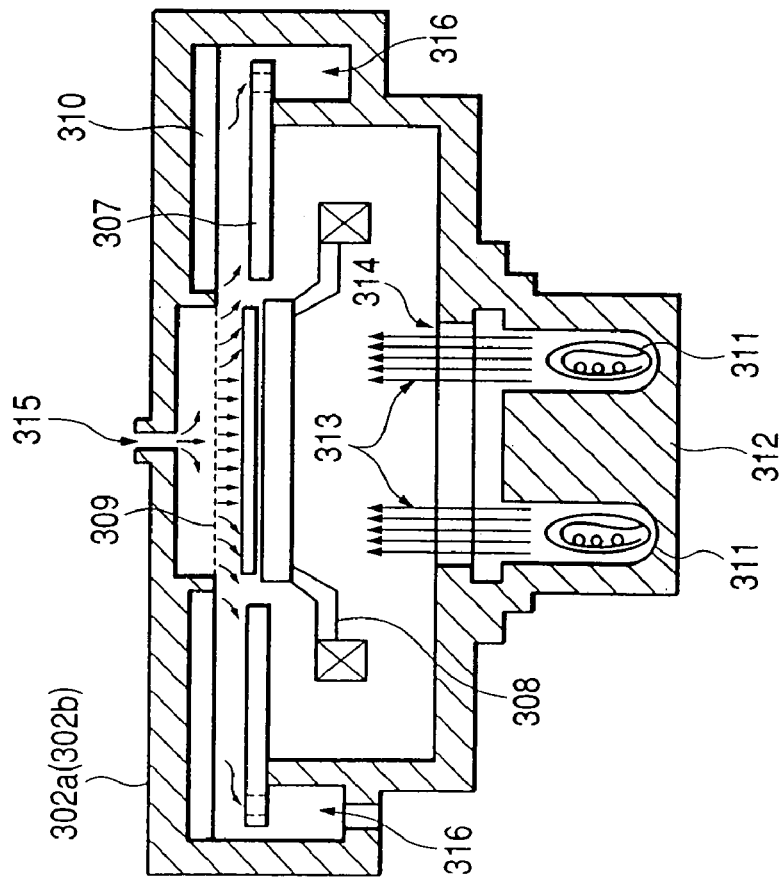

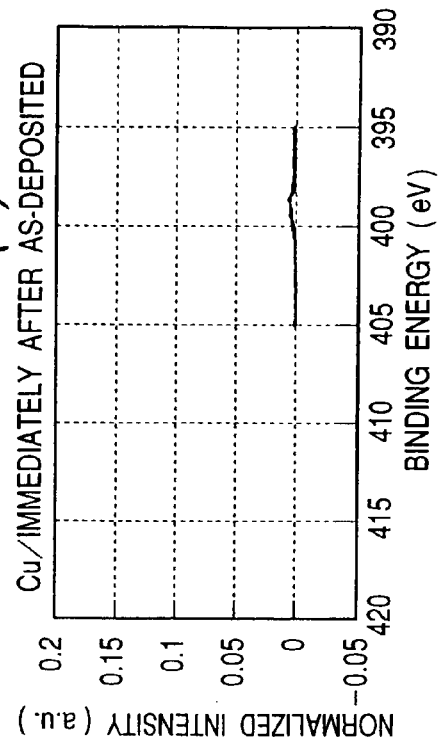
FIG. 22(a) Cu/IMMEDIATELY AFTER AS-DEPOSITED
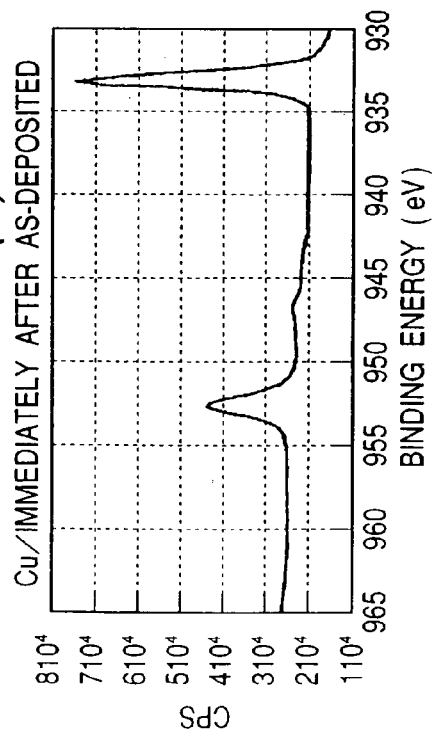
FIG. 22(b) Cu/IMMEDIATELY AFTER AS-DEPOSITED
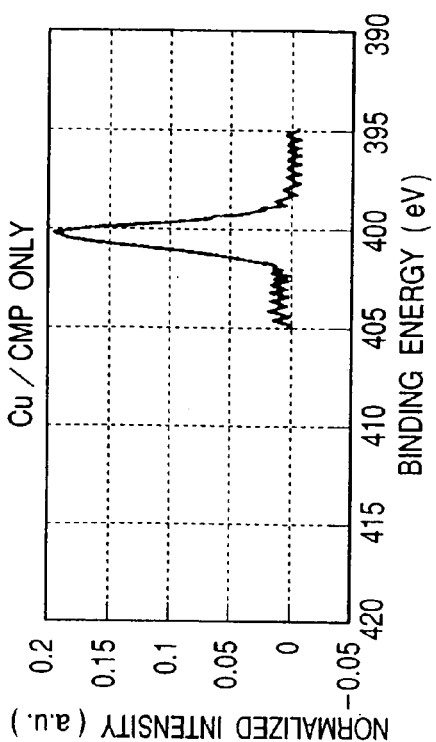
FIG. 22(c) Cu/CMP ONLY
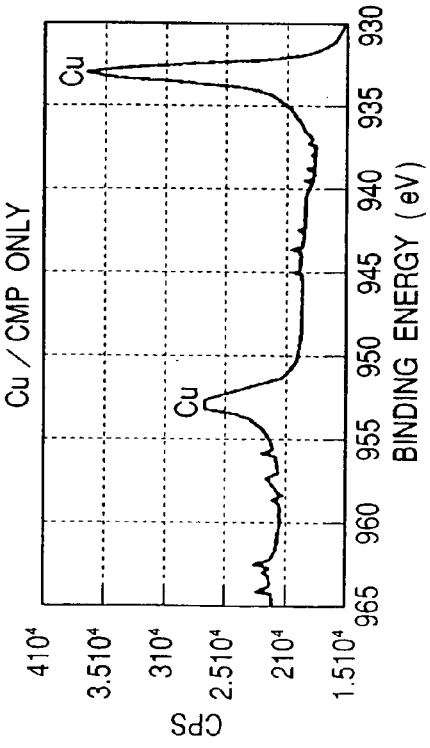
FIG. 22(d) Cu/CMP ONLY

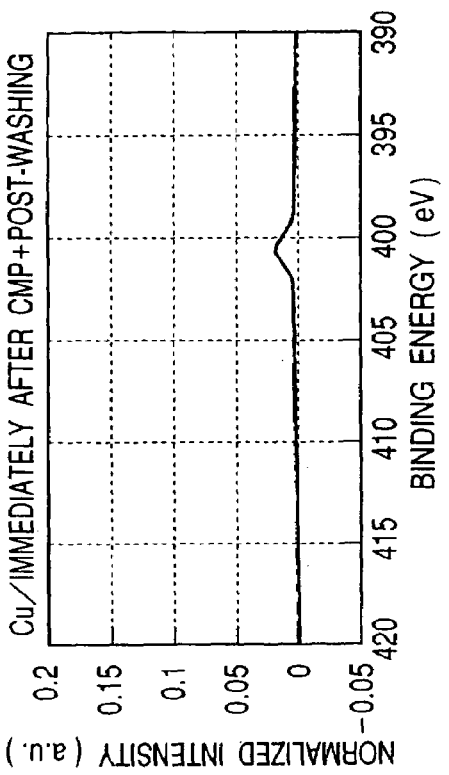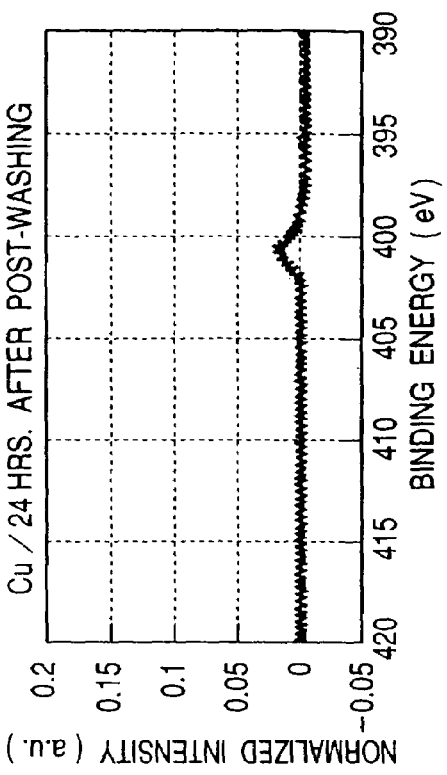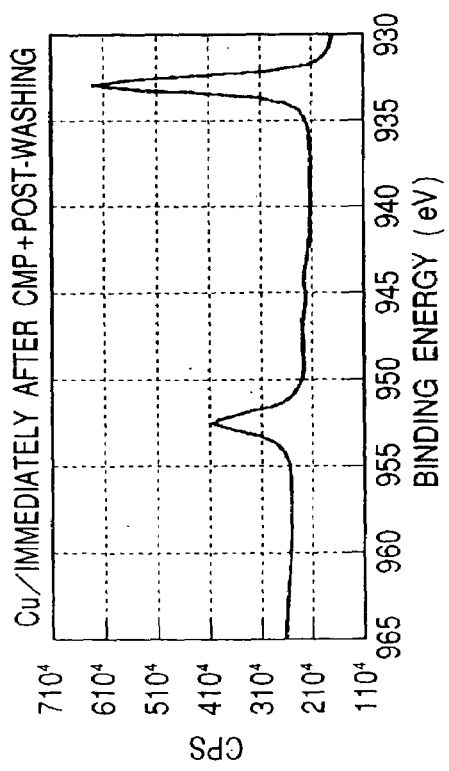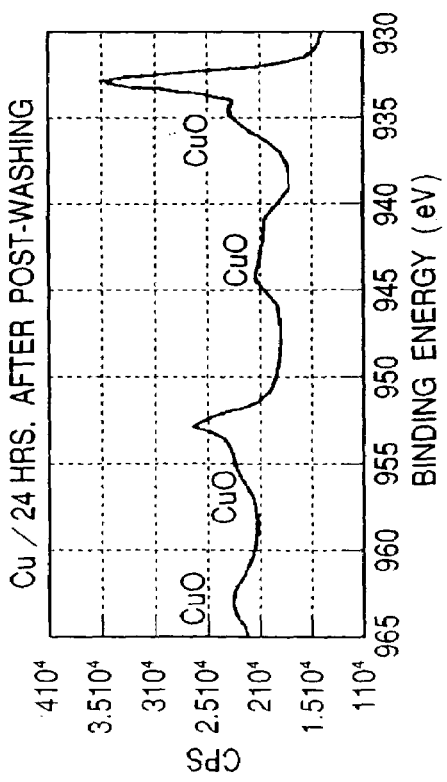

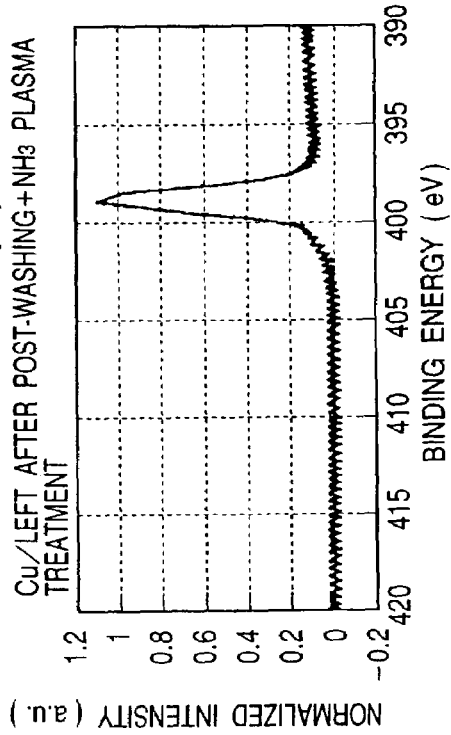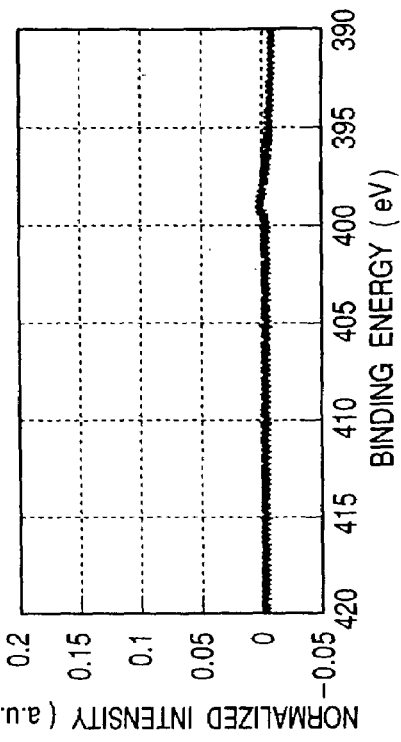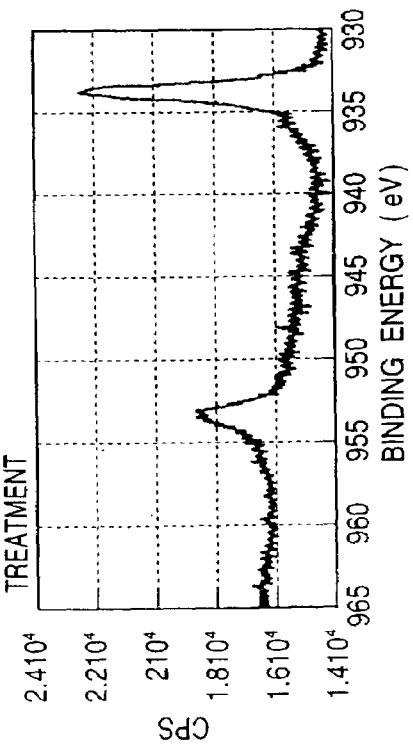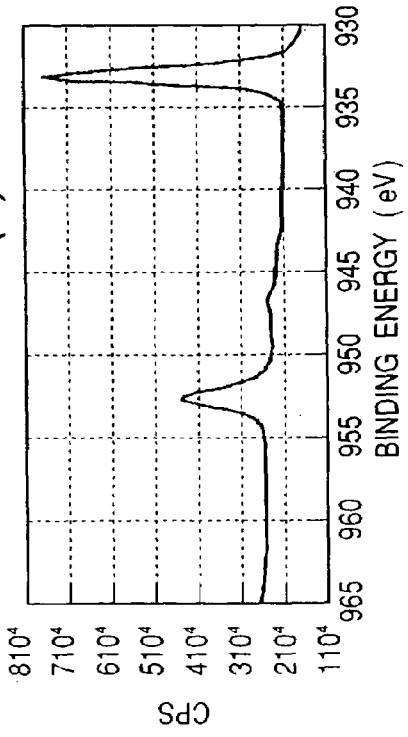
FIG. 24(a) Cu/LEFT AFTER POST-WASHING+NH3 PLASMA TREATMENT
FIG. 24(b) Cu/LEFT AFTER POST-WASHING+NH3 PLASMA TREATMENT
FIG. 24(c)
FIG. 24(d)

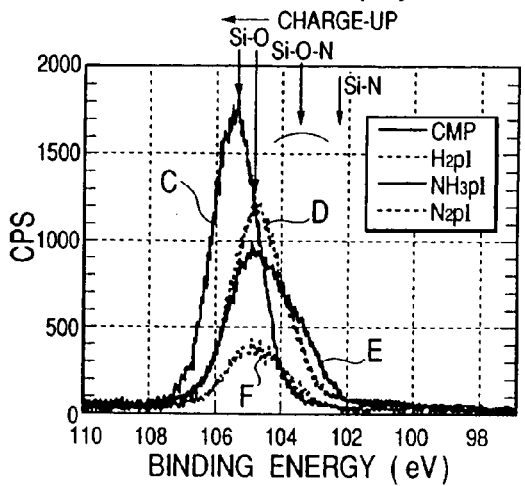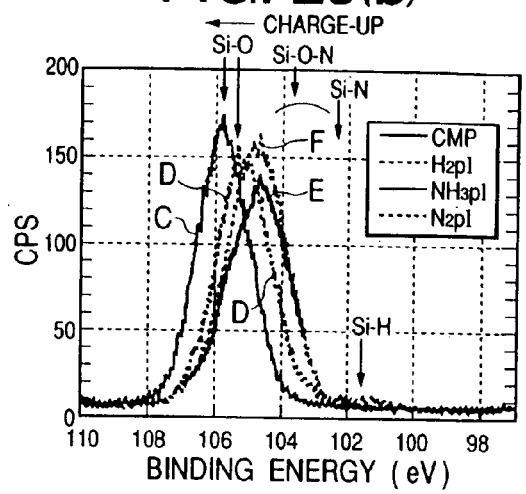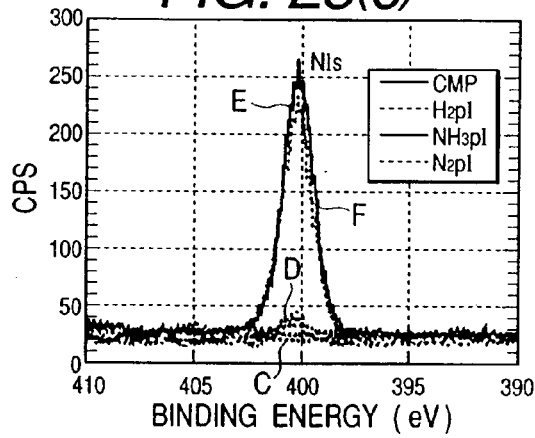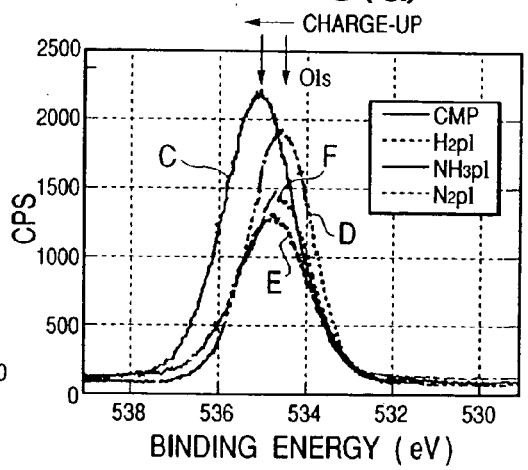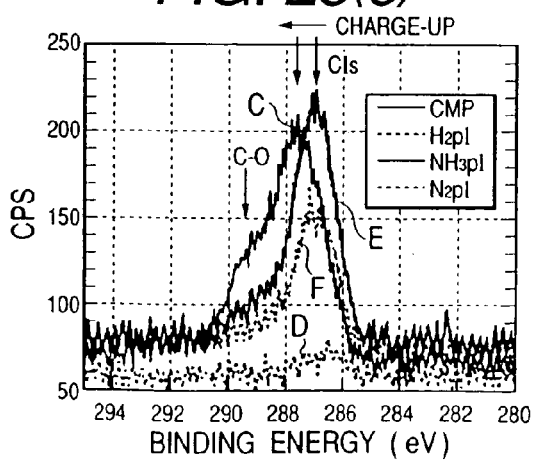

THERMAL DISSOCIATION OF HYDROGEN,
Ar-H m/z=41

THERMAL DISSOCIATION OF ORGANIC SUBSTANCES,
A(CnH2n-1) C2H3 m/z=27

THERMAL DISSOCIATION OF ORGANIC SUBSTANCES,
B(CnH2n+1) C4H9 m/z=57

THERMAL DISSOCIATION OF ORGANIC SUBSTANCES,
C(CnH2n+1O) C3H7O m/z=59

THERMAL DISSOCIATION OF Si
AND ORGANIC SUBSTANCES
Si, C2H4 m/z=28

THERMAL DISSOCIATION OF SiO
AND ORGANIC SUBSTANCES
SiO, C3H6 m/z=44

THERMAL DISSOCIATION OF SiH
AND ORGANIC SUBSTANCES
SiH, C2H5 m/z=29

THERMAL DISSOCIATION OF SiH3
AND ORGANIC SUBSTANCES
SiH3 m/z=31

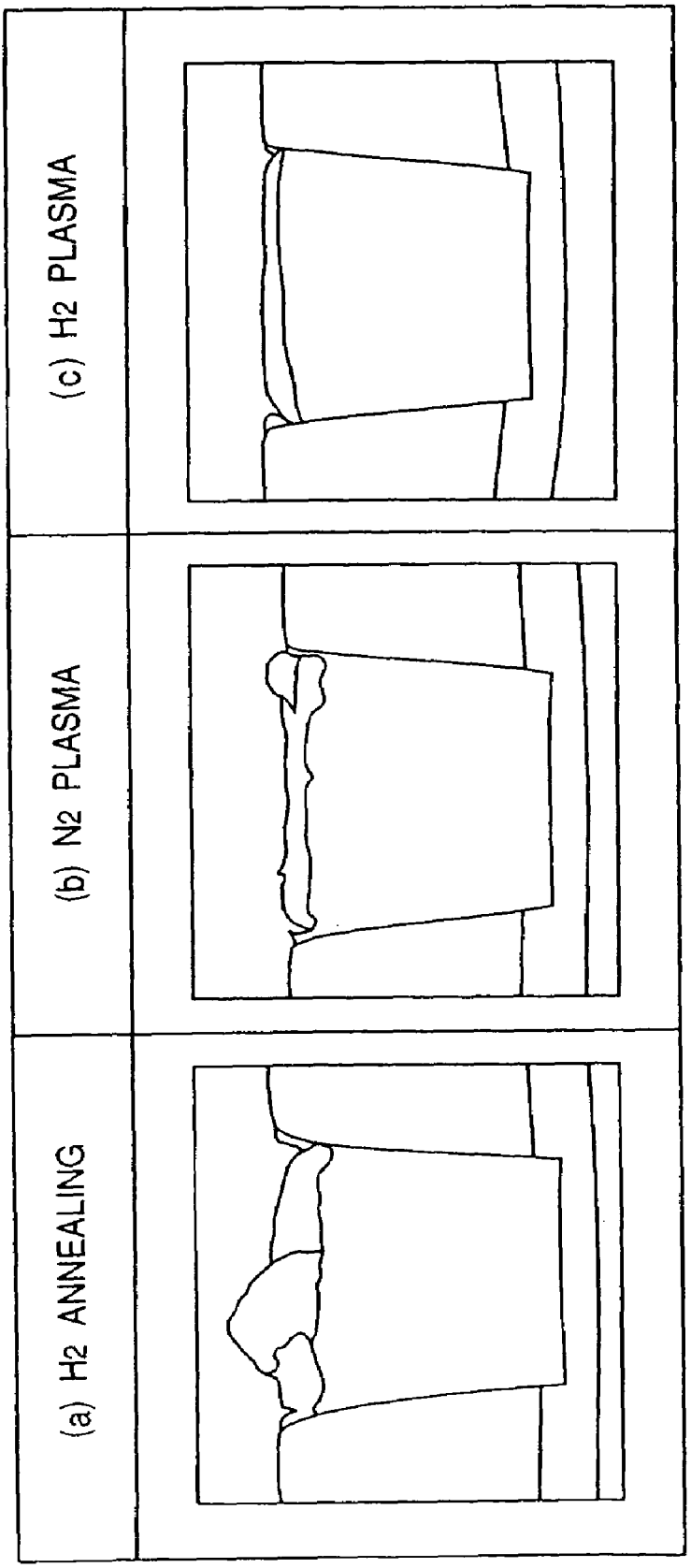

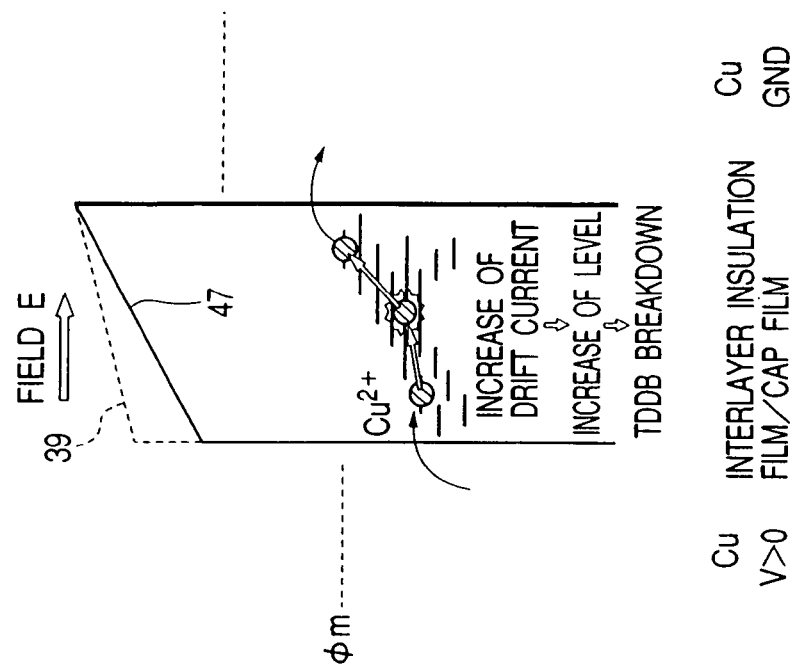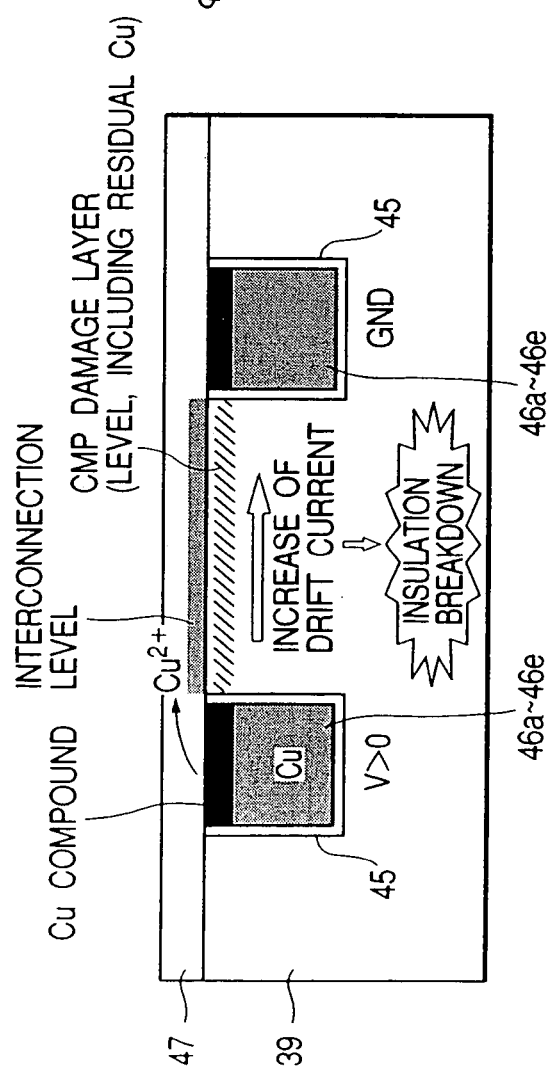

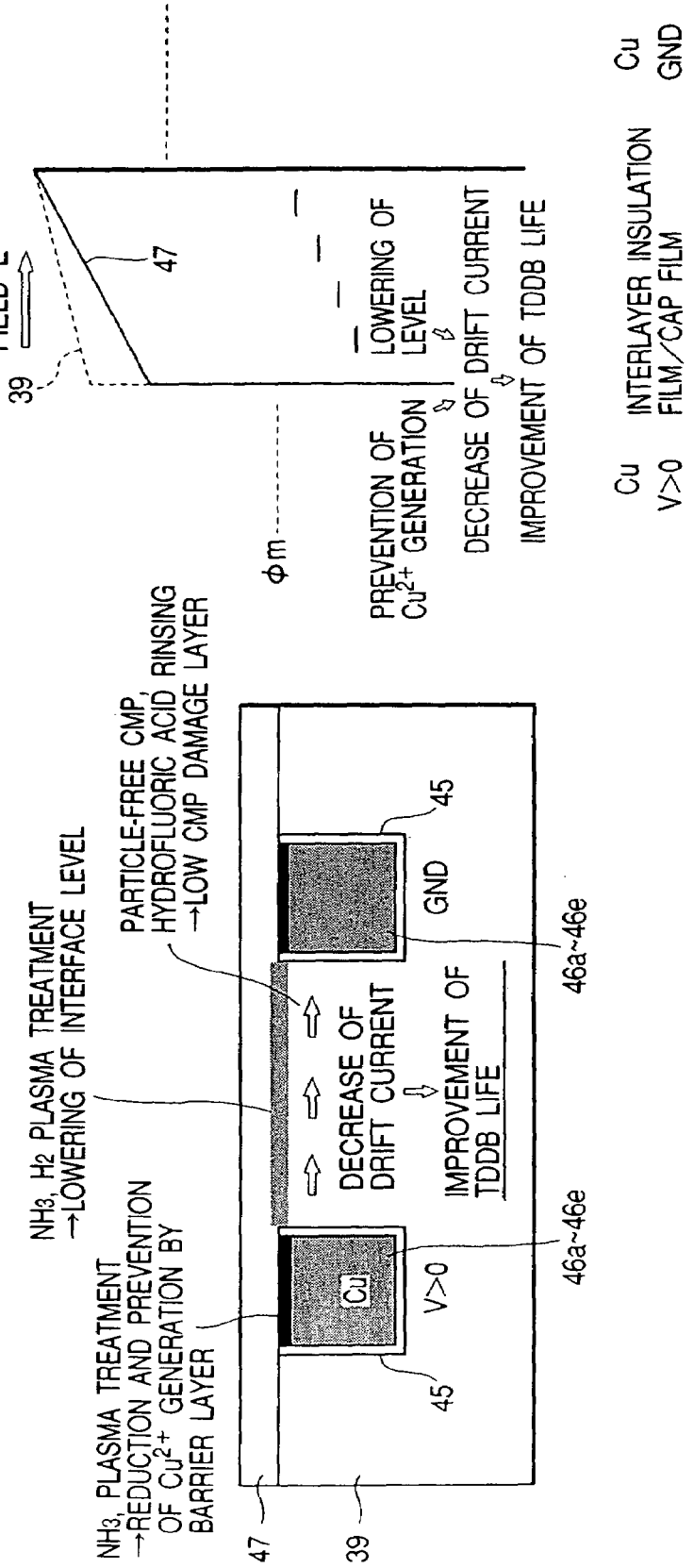

*TiN FILM THICKNESS=FILM THICKNESS AT BASE OF SLOT

SEMICONDUCTOR INTEGRATED CIRCUIT DEVICE AND FABRICATION METHOD FOR SEMICONDUCTOR INTEGRATED CIRCUIT DEVICE

CROSS REFERENCE TO RELATED APPLICATION

This application is a continuation application of U.S. Ser. No. 09/825,946, filed Apr. 5, 2001, now U.S. Pat. No. 6,764,950 the contents of which are incorporated herein by reference.

BACKGROUND OF THE INVENTION

This invention relates to a method of fabricating a semiconductor integrated circuit device, to a semiconductor integrated circuit device technique; and, in particular, to a method of fabricating a semiconductor integrated circuit device comprising an embedded interconnection having copper as the main conducting layer, and an effective technique applied to a semiconductor integrated circuit device.

In a technique for forming interconnections comprising semiconductor integrated circuit devices, semiconductor devices, electronic circuit devices and electronic devices, a conducting film, such as, for example, aluminum or tungsten, is deposited over an insulating film and is patterned by ordinary photolithography and dry etching.

However, in this interconnection forming technique, as devices and interconnections comprising semiconductor integrated circuit devices become finer, interconnection resistances are largely increasing, interconnection delays are occurring, and a limit is being reached to further performance improvements of the semiconductor integrated circuit devices.

In recent years, an interconnection forming technique known as the Damascene method has been developed. This Damascene method may be broadly distinguished into two types, i.e., the Single Damascene method and the Dual Damascene method.

In the Single Damascene method, after forming an interconnection slot in an insulating film, for example, a main conducting layer for forming interconnections is deposited over this insulating film and in the interconnection slot, and an embedded interconnection in the interconnection slot is formed by polishing this main conducting layer by, for example, CMP (Chemical Mechanical Polishing), so that it is left only in the interconnection slot.

In the Dual Damascene method, after forming a connecting hole to connect with the interconnection slot and a substrate interconnection in the insulating film, a main conducting layer for forming interconnections is deposited over this insulating film and in the interconnection slot and connecting hole, and an embedded interconnection in the interconnection slot and the connecting hole is formed by polishing this main conducting layer by, for example, CMP (Chemical Mechanical Polishing), so that it is left only in the interconnection slot and connecting hole.

In both methods, a material such as copper or the like is used as the material of the main conducting layer of the interconnections from the viewpoint of improving the performance of the semiconductor integrated circuit device. Copper has the advantage that, compared to aluminum, its resistance is lower and its permitted current for reliability is more than two orders of magnitude higher. Hence, the film can be made thinner to obtain the same interconnection resistance, and the capacitance between adjacent interconnections can be reduced.

However, compared to other metals, such as aluminum or tungsten, it diffuses easily in the insulating film if copper is used as the interconnection material, therefore, it is necessary to form a thin conducting barrier film to prevent diffusion of copper on the surface of the main conducting layer including copper (bottom surface and side surfaces), i.e., on the inner wall surfaces (side surfaces and bottom surface) of the interconnection slot. There is also a technique to prevent diffusion of copper in the embedded interconnection from the upper surface of the embedded interconnection into the insulating film by depositing a cap film including, for example, silicon nitride so as to cover the upper surface of the embedded interconnection over the entire surface on the upper surface of the insulating film in which the interconnection slot is formed.

This kind of embedded interconnection technique is mentioned in, for example, Japanese Unexamined Patent Publication No. Hei 10(1998)-154709, wherein the embedded properties of a fine contact hole with a high aspect ratio are improved by forming the embedded interconnection of high purity copper having an oxygen concentration or sulfur concentration not exceeding 3 ppm, thus enhancing the surface diffusion properties and fluidity of the copper.

In Japanese Unexamined Patent Publication No. Hei 11 (1999)-87349, for example, a technique is disclosed wherein, after forming the interconnection slot and connecting hole in the insulating film, a copper film is formed by sputtering using a target having a purity of 99.999 wt % (5N) or higher. In this Publication, to facilitate embedding of the copper, a titanium nitride/titanium film is formed as a barrier layer over the surface of the interconnection slot and connecting hole.

In Japanese Unexamined Patent Publication No. Hei 11(1999)-87509 or Japanese Unexamined Patent Publication No. Hei 11 (1999)-220023, for example, a technique is disclosed wherein the barrier layer on the bottom surface of a via is removed to lower the resistance of the via.

In Japanese Unexamined Patent Publication No. Hei 11 (1999)-16912, for example, a technique is disclosed wherein the oxide layer formed in the interconnection part exposed at the bottom of the connecting hole is eliminated by applying heat, plasma or ultraviolet irradiation in a reducing atmosphere.

SUMMARY OF THE INVENTION

However, according to tests performed by the Inventors, the following problems were found in semiconductor integrated circuit device techniques comprising embedded interconnections having copper as the main conducting layer.

Firstly, as the dimensions of the embedded interconnections (line widths, thicknesses, distances between centers of adjacent interconnections and intervals between adjacent interconnections) having copper as the main conducting layer become finer, the cross-sectional surface area of the high resistance conducting barrier film become larger relative to the interconnection cross-sectional surface area, and the resistance of the embedded interconnection is increases. As a result, there is a limit to performance improvement of the semiconductor integrated circuit device even though copper is used to enhance performance.

Secondly, to resolve the first problem, if the barrier film is simply made thinner without performing any special treatment or is eliminated, the interconnection resistance can be reduced, but diffusion of copper occurs and the insulation breakdown resistance between mutually adjacent embedded interconnections falls considerably. As a result, a high reliability semiconductor integrated circuit device cannot be provided. Also, as the yield of the semiconductor integrated circuit device falls, the cost of the semiconductor integrated circuit device increases.

Thirdly, when a silicon nitride film is used as the cap film on the embedded interconnection having copper as the main conducting layer, a silicide substance is formed at the interface of the copper and silicon nitride film, and the resistance of this embedded interconnection increases. It was found for the first time by experiments carried out by the Inventors that diffusion of copper is a major reason for this, as will be described later. Consequently, there is a limit to improving the performance of the semiconductor integrated circuit device. There is also a problem in that the yield and reliability of the semiconductor integrated circuit device are seriously affected.

Fourthly, peeling occurs between the interconnection layer of the embedded interconnection and the insulating film (e.g., the aforesaid cap layer) formed over the upper layer. As a result, the yield and reliability of the semiconductor integrated circuit device is seriously reduced.

It is therefore an object of this invention to provide a technique for reducing the resistance of the embedded interconnection having copper as the main conducting layer.

It is another object of this invention to provide a technique for improving the insulation breakdown resistance between embedded interconnections having copper as the main conducting layer.

It is another object of this invention to provide a technique for improving adhesion between the interconnection layer and the cap film of embedded interconnections having copper as the main conducting layer.

It is another object of this invention to provide a technique for improving the reliability of an integrated circuit semiconductor device comprising embedded interconnections having copper as the main conducting layer.

It is another object of this invention to provide a technique for improving the yield of an integrated circuit semiconductor device comprising embedded interconnections having copper as the main conducting layer.

It is another object of this invention to provide a technique for improving the performance of an integrated circuit semiconductor device comprising embedded interconnections having copper as the main conducting layer.

The above and other objects and novel features of the invention will become clear from the following description and the drawings.

The following is a simple description in outline of the aspects and features of the present invention disclosed in this application.

This invention comprises an embedded interconnection having copper as a main component embedded in a depression formed in an insulating film via a conducting barrier film, and a cap insulating film formed so as to cover the upper surface of the insulating film and embedded interconnection layer, the concentration of components other than copper in the embedded interconnection not exceeding 0.8 At. % in the finished semiconductor chip.

In accordance with a feature of this invention, as regards the side wall part of the aforesaid depression, the thickness of the thickest part or thinnest part of the conducting barrier film is less than 10 nm.

In accordance with another feature of this invention, as regards the side wall part of the aforesaid depression, the thickness of the thickest part or thinnest part of the conducting barrier film is not more than 2 nm.

In accordance with another feature of this invention, the conducting barrier film in the aforesaid depression does not exist.

In accordance with still another feature of this invention, an embedded metal interconnection layer is in direct contact in the aforesaid depression.

This invention comprises a method including a step of forming a depression in an insulating film formed over a semiconductor substrate, a step of depositing a conducting barrier film over the insulating film including the interior of the depression, a step of depositing a metal film having copper as the main component over the conducting barrier film including the interior of the depression, and a step of forming an embedded metal interconnection layer via the conducting barrier film in the interior of the depression by removing the metal film and conducting barrier film, the concentration of components apart from copper in the embedded metal interconnection layer when the semiconductor chip formed from the aforesaid semiconductor substrate is finished, not exceeding 0.8 At. %, and the purity of the copper in the metal film when the metal film having copper as the principal component is formed, being at least 99.999%.

In the aforesaid method of this invention, the aforesaid metal film is formed by a sputtering technique using a target including copper of at least 99.999% purity.

This method of the present invention, comprises a step wherein, after removing the aforesaid metal film by chemical mechanical polishing to form the embedded interconnection, the upper surface of the insulating film and indebted interconnection layer is plasma treated in a gas atmosphere having reducing properties, and a step wherein a cap insulating film is formed over the insulating film and embedded metal interconnection layer after plasma treatment.

In the method of this invention, the gas atmosphere having reducing properties has hydrogen as its main component.

In this method, the gas atmosphere having reducing properties also has a nitriding action.

In this method, the gas atmosphere having reducing provinces contains ammonia as its main component.

In this method, the step of forming the embedded metal interconnection layer by removing the metal film is performed by abrasive particle-free chemical mechanical polishing.

In this method, the concentration of components apart from copper does not exceed 0.02 At. %.

In this method, the thickness of the thickest part or thinnest part of the conducting barrier film in the side wall of the aforesaid depression is less than 10 nm.

In this method, the thickness of the thickest part or thinnest part of the conducting barrier film in the side wall of the aforesaid depression is not more than 2 nm.

This method further comprises a step wherein, after forming the aforesaid depression, and prior to the step of depositing the conducting barrier film, the semiconductor substrate is plasma treated in a gas atmosphere having reducing properties.

The method of this invention comprises a step of forming a depression in an insulating film formed over a semiconductor substrate, a step of depositing a metal film having copper as the main component over the insulating film including the interior of the depression without the intervention of a conducting barrier film, and a step of forming an embedded metal interconnection layer in the interior of the depression without the intervention of a conducting barrier film by removing the metal film, the concentration of components apart from copper in the embedded metal interconnection layer, when the semiconductor chip formed from the aforesaid semiconductor substrate is finished, not exceeding 0.8 At. %, and the purity of the copper in the metal film, when the metal film having copper as the principal component is formed, being at least 99.999%.

The method of this invention comprises a Damascene interconnection forming step, comprising a step of forming a depression in an insulating film formed over a semiconductor substrate, a step of depositing a conducting barrier film over the insulating film including the interior of the depression, a step of depositing a metal film having copper as the main component over the conducting barrier film including the interior of the depression, a step of forming an embedded metal interconnection layer via the conducting barrier film in the interior of the depression by removing the metal film and conducting barrier film, and a step of forming a cap insulating film over the insulating film and embedded metal interconnection layer, the concentration of components apart from copper in the embedded metal interconnection layer, when the semiconductor chip formed from the aforesaid semiconductor substrate is finished, not exceeding 0.8 At. %, and the purity of the copper in the metal film, when the metal film having copper as the principal component is formed, being at least 99.999%.

The method of this invention comprises a Dual Damascene interconnection forming step, comprising a step of forming an embedded interconnection slot and connecting hole in an insulating film formed over a semiconductor substrate, a step of depositing a conducting barrier film over the insulating film including the embedded interconnection slot and connecting hole, a step of depositing a metal film having copper as the main component over the conducting barrier film including the embedded interconnection slot and connecting hole, a step of forming an embedded metal interconnection layer via the conducting barrier film in the embedded interconnection slot and connecting hole by removing the metal film and conducting barrier film, and a step of forming a cap insulating film over the insulating film and embedded metal interconnection layer, the concentration of components apart from copper in the embedded metal interconnection layer, when the semiconductor chip formed from the aforesaid semiconductor substrate is finished, not exceeding 0.8 At. %, and the purity of the copper in the metal film, when the metal film having copper as the principal component is formed, being at least 99.999%.

The method of this invention comprises a step wherein, after forming the embedded interconnection slot and connecting hole, the aforesaid semiconductor substrate is plasma treated in a gas atmosphere having reducing properties prior to a step of depositing the conducting barrier film.

The method of this invention comprises a step wherein, after a step of forming the embedded interconnection layer by removing the metal film by chemical mechanical polishing, the upper surface of the insulating film and embedded interconnection layer is plasma treated in a gas atmosphere having reducing properties prior to the step of forming the cap insulating film.

BRIEF DESCRIPTION OF THE DRAWINGS

FIG. 1 is a cross-sectional view of the essential parts of a semiconductor substrate showing a method of forming a semiconductor integrated circuit device which represents a first embodiment (Embodiment 1) of this invention.

FIG. 2 is a cross-sectional view of the essential parts of a semiconductor substrate showing a step in the fabrication of Embodiment 1.

FIG. 7($a$) is a plan view and FIG. 7($b$) is a cross-sectional view of the essential parts of a semiconductor substrate showing a step in the fabrication of Embodiment 1.

FIG. 15($a$) is a cross-sectional view showing an outline of a plasma treatment apparatus used for ammonia plasma treatment and silicon nitride film deposition; and, FIG. 15($b$) is a plan view of the same.

FIGS. 22($a$) to 22($d$) are graphs showing XPS data.

FIGS. 23($a$) to 23($d$) are graphs showing XPS data.

FIGS. 24($a$) to 24($d$) are graphs showing XPS data.

FIGS. 25($a$) to 25($e$) are graphs showing XPS data, and FIG. 25($f$) is a table showing composition ratios.

FIG. 30 is a chart showing sectional diagrams which trace TEM photographs for comparison purposes.

FIGS. 31(a) and 31(b) are diagrams showing the mechanism of TDDB deterioration.

FIGS. 32(a) and 32(b) are diagrams showing the mechanism of TDDB enhancement.

FIGS. 85(a) to 85(c) are diagrams which show samples used for TDDB life measurement, in which FIG. 85(a) is a plan view, and FIG. 85(b) and FIG. 85(c) are cross-sectional diagrams respectively showing a section taken along line B–B' and a section taken along line C–C' in FIG. 85(a).

DETAILED DESCRIPTION OF THE INVENTION

In describing the embodiments of this invention, the basic meaning of the terminology used in this Application is as follows.

Figure 85A:
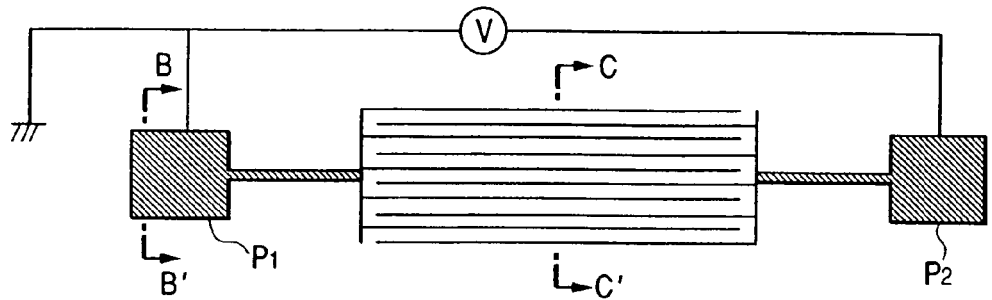
Figure 85B:
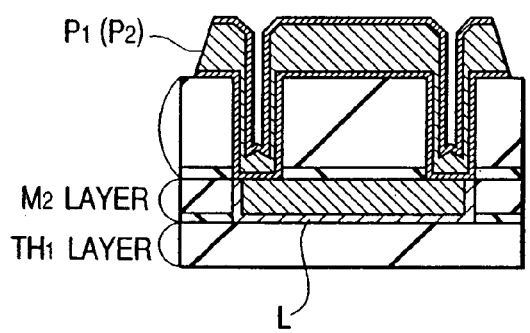
Figure 85C:
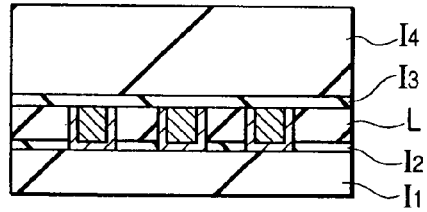

1. TDDB (Time Dependence on Dielectric Breakdown) life means a time calculated by applying a comparatively high voltage between electrodes under measurement conditions at a predetermined temperature (for example, 140° C.), plotting a graph of the time from applying the voltage to insulation breakdown relative to the applied electric field, and extrapolating to the actual field intensity used (for example, 0.2 MVP/cm). FIG. 85(a) shows a sample used for the TDDB life measurement. FIG. 85(a) is a plan view, and FIG. 85(b) and FIG. 85(c) respectively show a section taken along line B–B' and a section taken along line C–C' in FIG. 85(a). This sample can be formed in the TEE (Test Equipment Group) region of a semiconductor wafer. A pair of comb-shaped interconnections L are formed in a second interconnection layer M2, as shown in the diagram, and the interconnections L are respectively connected to pads P1, P2 of an uppermost layer. An electric field is applied between these comb-shaped interconnections L, and the electric current is measured. The pads P1, P2 are measurement terminals.

Figure 86:
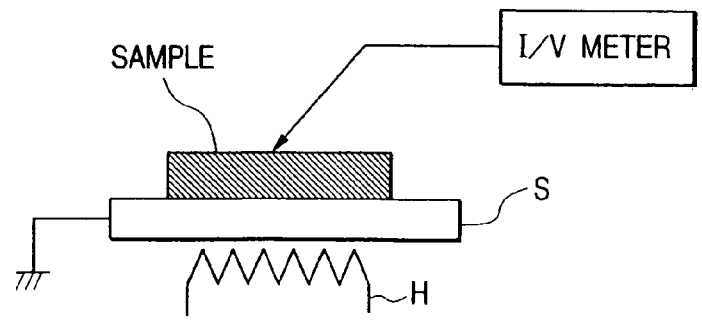
FIG. 86 is a diagram showing the essential features of the measurement.
Figure 87:
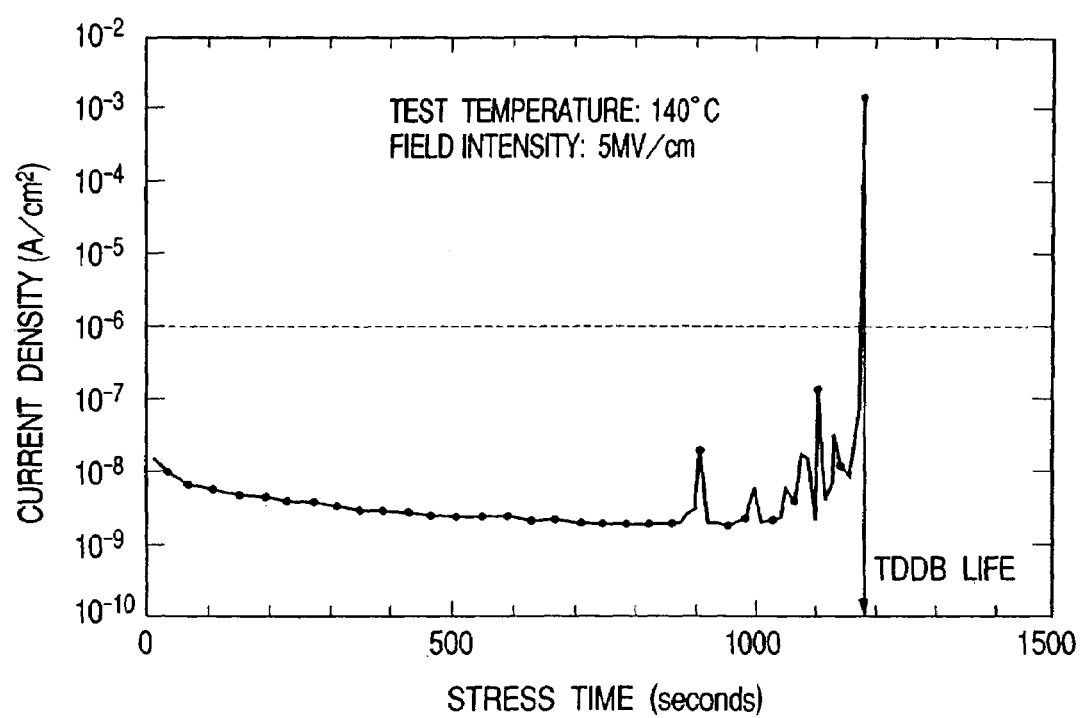
FIG. 87 is a graph of current-voltage measurement results.

The line widths, line intervals and line thicknesses of the comb-shaped interconnections L are all 0.5 μm. The interconnection facing lengths were $1.58 \times 10^5$ μm. FIG. 86 is a conceptual diagram showing the essential features of the measurement. The sample is held on a measurement stage S, and a current-voltage measuring instrument (I/V meter) is connected between the pads P1, P2. The sample stage S is heated by a heater H, and the sample temperature is adjusted to 140° C. FIG. 87 is a graph showing an example of current-voltage measurement results. The case using a 140° C. sample temperature and a field intensity of 5 MVP/cm was taken as an example. The constant voltage stress method or the low current stress method may be used for the TDDB life measurement, but in this Application, the constant voltage stress method wherein the average electric field applied to an insulating film is fixed, is used. After applying the voltage, the current density decreases with time, and a rapid increase in current (insulation breakdown) is observed thereafter. Here, the time when the leakage current density reached 1 μA/cm$^2$ was taken as the TDDB life (TDDB life at 5 MVP/cm).

In this Application, although the term TDDB life means the breakdown time (life) at 0.2 MVP/cm unless otherwise specified, the term TDDB life may be used in a wider sense as the time until breakdown if a predetermined field intensity is specified.

Unless otherwise specified, TDDB life refers to the case where the sample temperature is 140° C. Further, TDDB life refers to measurements performed on the above-mentioned comb-shaped interconnection L, but it will be understood to reflect the breakdown life between actual interconnections.

2. Plasma treatment refers to a process wherein, when a member, such as an insulating film and a metal film, are formed over a substrate surface or over a substrate in a plasma state, the surface of the member is exposed, and the surface is subjected to the chemical and mechanical (bombardment) action of the plasma.

Although plasma is usually generated by filling a reaction chamber, in which the atmosphere has been replaced by a specific gas (treatment gas), with more treatment gas, and ionizing the gas by the action of a high frequency field etc., the gas in the chamber cannot be completely replaced by the treatment gas. Therefore, in this Application, although reference is made to an ammonia plasma, for example, a perfect ammonia plasma is not meant, and the possible presence of impurity gases (nitrogen, oxygen, carbon dioxide, steam, etc.) in the plasma cannot be discarded. Likewise, this does not exclude the possibility that other diluting gases and added gases are contained in the plasma.

A plasma of a reducing atmosphere means a plasma environment wherein reactive species, such as radicals, ions, atoms and molecules which have a reducing action, i.e., an action which withdraws oxygen, exist dominantly, atomic or molecular radicals or ions being included in said radicals and ions.

Moreover, in such an environment, not only a single reactive species, but two or more reactive species may be included. For example, an environment where hydrogen radicals and NH2 radicals exist simultaneously may be sufficient.

3. In this Application, gas concentration shall refer to flow rate ratio in mass flow rates. That is, in a mixture of Gas A and Gas B, when the concentration of Gas A is 5%, it means Fa/(Fa+Fb)=0.05 where the mass flow rate of Gas A is Fa and the mass flow rate of Gas B is Fb.

4. Chemical mechanical polishing (CMP) usually means a process where a surface to be polished is brought in contact with a polishing pad comprising a sheet of relatively soft cloth, etc., and polishing is performed by making a relative movement in the direction of the surface while a slurry is supplied. This Application shall also be understood to refer to a CML (Chemical Mechanical Lapping) where the surface to be polished is moved relative to a hard abrasive stone, the use of other fixed abrasive particles, and abrasive particle-free CMP which does not use abrasive particles.

Abrasive particle-free chemical mechanical polishing usually means chemical mechanical polishing with a slurry having a weight concentration of abrasive particles of 0.5% or less, and abrasive particle polishing means chemical mechanical polishing using a slurry having a higher concentration of abrasive particles than a weight concentration of 0.5%. However, these are relative terms, and when the polishing of the first step is an abrasive particle-free chemical mechanical polishing and the polishing of the following second step is an abrasive particle polishing, or the polishing concentration of the first step is smaller than the polishing concentration of the second step by one or more orders of magnitude, and preferably two or more orders of magnitude, the polishing of the first step may be referred to as abrasive particle-free chemical mechanical polishing. In this Specification, when using the term abrasive particle-free chemical mechanical polishing, it shall be understood to include not only the case where the whole planarizing process of the target metal film is performed by abrasive particle-free chemical mechanical polishing, but also the case where the main process is performed by abrasive particle-free chemical mechanical polishing and the secondary process is performed by abrasive particle polishing.

5. Polishing liquid (slurry) generally means a suspension in which polishing abrasive particles are mixed with chemical etching reagents, and in the context of this Application, due to the nature of the Invention, it shall be understood to include the case where polishing abrasive particles are not mixed with the reagents.

Moreover, abrasive particles (slurry particles) means a powder such as is usually included in a slurry (alumina, silica).

6. Anticorrosives mean reagents which prevent or suppress polishing by CMP, by forming a protective film which has the property of corrosion resistance or hydrophobicity, or both, on the surface of a metal, benzotriazole (BTA) or the like usually being employed for this purpose (see Japanese Unexamined Patent Publication No. Hei 8(1996)-64594.

7. Conductive barrier film is an electrically conducting film having a diffusion barrier property formed in the side face or the bottom surface of an embedded interconnection comparatively thinly in order to prevent copper from diffusing into an interlayer insulating film, or a lower layer, and in general, high melting point metals or their nitrides, such as titanium nitride (TiN), tantalum (Ta) and tantalum nitride (TaN), are used.

8. An embedded interconnection or an embedded metal-interconnection generally means an interconnection which is patterned by an interconnection forming technique wherein a conducting film is embedded in slot formed in an insulating film, and unnecessary conducting film on the insulating film is removed, such as Single Damascene or Dual Damascene. Single Damascene is generally an embedded interconnection process wherein a plug metal and an interconnection metal are embedded in two stages. Likewise, Dual Damascene is generally an embedded interconnection process wherein the plug metal and interconnection metal are embedded in one operation. In general, copper embedded interconnections are often used in multilayer compositions.

9. When referring to selective removal, selective polishing, selective etching and selective chemical mechanical polishing, the selection ratio in all cases is 5 or more.

10. When it is said that the selection ratio of A to B (or B with respect to A) is X, it means that, taking the polishing rate as an example, the polishing rate of A, calculated based on the polishing rate of B, is X.

11. The expression semiconductor integrated circuit device in this Application refers not only to devices formed on single crystal silicon substrates, but also those formed on other substrates such, as a Silicon On Insulator substrate or a TFT (Thin Film Transistor) liquid crystal substrate, except when otherwise specified. Moreover, wafer means a single crystal silicon substrate (in general, substantially disk-shaped), SOS substrate, glass substrate, other insulating, half-insulating or semiconductor substrates, or compounds of same, used in the fabrication of semiconductor integrated circuit devices.

12. The expression semiconductor integrated circuit wafer (semiconductor integrated circuit substrate) or semiconductor wafer (semiconductor substrate) means silicon or other single crystal substrates (in general, substantially disk-shaped), sapphire substrate, glass substrate, other insulating, semi-insulating or semiconductor substrates, or compound-type substrates, used in the fabrication of semiconductor integrated circuit devices. In addition, part or all of the substrate surface, or part or all of the gate electrode, may be formed of other semiconductors, for example, SiGe.

A semiconductor integrated circuit chip (semiconductor integrated circuit substrate) or a semiconductor chip (semiconductor substrate) means a semiconductor wafer finished in a wafer step divided into groups of individual circuits.

13. The expression silicon nitride, or a silicon nitride film, includes not only S'3N, but also insulating films which are silicon nitrides of similar composition.

14. A cap film is an insulating film having high insulating properties and high diffusion barrier properties formed in addition to an electrical connecting part of the information of an embedded interconnection, and is generally formed of a material different from the main part of the interlayer insulating film, for example, a silicon nitride film.

15. The term wafer process is also known as a preliminary process, and is a process wherein, starting from a mirror wafer, a device and an interconnection forming step is performed, a surface protecting film is formed, and electrical tests are then performed by a probe.

Figure 88:
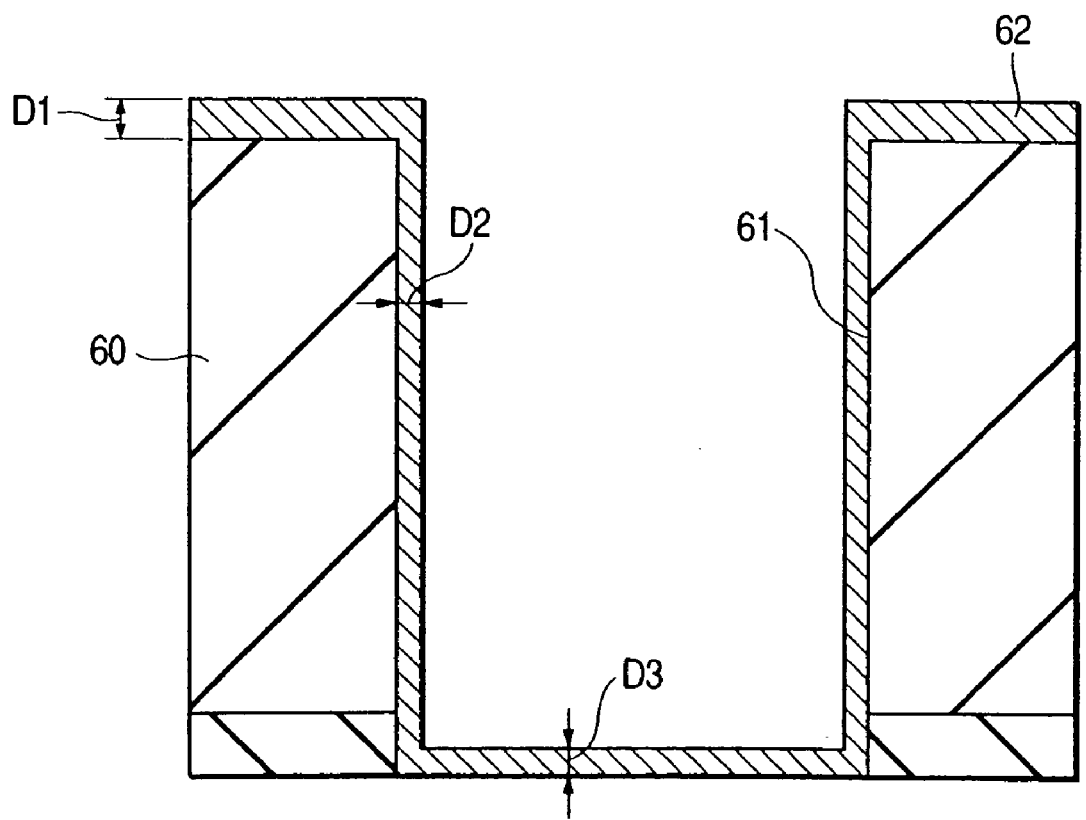
FIG. 88 is a diagram showing the coverage in an interconnection slot or connecting hole of a conductive barrier film.

16. The coverage in the interconnection slot (depression) or conducting hole (depression) of the conducting barrier film comprises side coverage and bottom coverage. FIG. 88 schematically shows the upper surface of an insulating film 60, and a state where a barrier film 62 is deposited by sputtering in an interconnection slot 61 formed in the insulating film 60. The deposited film thickness of the barrier film generally refers to a film thickness D1 of the barrier film 62 on the upper surface of the insulating film 60. Side coverage means the amount of covering of the barrier film 62 in a side wall part in the interconnection slot 61 (including the angle part in the intersection of the side and bottom), and the film thickness D2 in this part is the thinnest. Bottom coverage means the amount of covering of the barrier film 62 on the bottom surface in the interconnection slot 61, and the film thickness D3 in this part is the next thickest after the aforesaid deposited film thickness. For example, according to experimental results obtained by the Inventors, when a barrier film was deposited in an interconnection slot having an aspect ratio of 1 in the usual sputtering method, which does not take directivity into particular consideration, the deposited film thickness of the barrier film was 100 nm, the side coverage was about 30 nm and the bottom coverage was about 50 nm. Moreover, when the barrier film was deposited by the long throw sputtering technique, the deposited film thickness of the barrier film was 100 nm, the side coverage was about 20 nm and the bottom coverage was about 90 nm.

17. Long throw sputtering means a sputtering method in which there is an improvement in bottom coverage, wherein the distance between target and substrate is increased, and stable discharge at a low voltage is performed in order to make only the perpendicular component of the sputtering particles reach the substrate.

18. Collimate sputtering is a technique having a mechanism wherein, when a film is formed in a depression such as an interconnection slot or connecting hole having a large aspect ratio, in order to obtain sufficient film thickness up to the base, a lattice plate is intercalated between the target and substrate to forcibly increase the perpendicular component.

The following embodiments are divided into plural sections or embodiments when required for convenience of description, but unless otherwise stated, they are not unrelated to each other, one part being related to part or all of the others by way of modifications, details and supplementary description.

Moreover, in the following embodiments, when the number of components is mentioned (including numbers, numerical values, amounts, ranges, etc.), the invention is not limited to these specific numbers, except when otherwise specified or when it is clearly limited to these specific numbers, and it may pertain to numbers which are higher or lower than these specific numbers.

Further, in the following embodiments, it will be understood that the invention is not necessarily limited to the described component elements (including component steps), except when otherwise specified or when they are clearly indispensable.

Likewise, in the following embodiments, when referring to shapes and positional relationships of component elements, they shall be understood to include substantially approximate or similar shapes, except when otherwise specified or when this is clearly not the case. This also applies to the above-mentioned numerical values and ranges.

In all the diagrams used for describing the embodiments, elements having identical functions are assigned the same symbols, and their description is not repeated.

Moreover, in this embodiment, a Metal Insulator Field Effect Transistor which is representative of field effect transistors is abbreviated to MIS, p channel MISFET is abbreviated to PMIS, and n channel MISFET is abbreviated to NMIS.

(Embodiment 1)

In this embodiment 1, the application of this invention to a method of fabricating a CMOS (Complementary MOS)-LSI (Large Scale Integrated Circuit), for example, will be described in a sequence of steps with reference to FIG. 1–FIG. 19.

First, as shown in FIG. 1 for example, after forming a device isolation slot 2 to a depth of about 350 nm in a semiconductor substrate (henceforth substrate) 1 comprising p type single crystal silicon having a resistivity of about 1–10 $\Omega$cm by photolithography and dry etching, a silicon oxide film 3 is deposited by the CVD method over the substrate 1 including the interior of the slot. The surface of the silicon oxide film 3 overlying the slot is then planarized by chemical mechanical polishing (CMP). This forms a slot type isolation part 2A (trench isolation). Subsequently, after forming a p type well 4 and a n type well 5 by carrying out ion implantation of a p type impurity (boron) and a n type impurity (for example, phosphorus) to the substrate 1, a gate insulation film 6 of about 6 nm film thickness is formed over the surface of the p type well 4 and n type well 5 by steam oxidation of the substrate 1. The film thickness of the gate insulation film 6 here is a silicon dioxide equivalent film thickness, and it may not be in agreement with the actual film thickness.

The gate insulation film 6 may comprise a silicon oxide/nitride film instead of a silicon oxide film. A silicon oxide/nitride film is more effective than a silicon oxide film in suppressing the generation of interface levels in the film, or reducing electron traps, so a silicon oxide/nitride film can improve the hot carrier resistance of the gate insulation film 6, and can improve its dielectric strength. To form a silicon oxide/nitride film, it is sufficient, for example, to heat the substrate 1 in a nitrogen-containing gas atmosphere, such as NO, NO$_2$ or NH$_3$. The same effect is achieved by forming the gate insulation film 6 including silicon oxide in the surface of each of the p type well 4 and n type well 5, heat-treating the substrate 1 in the aforesaid nitrogen-containing gas atmospheres, and segregating nitrogen at the interface of the gate insulation film 6 and substrate 1.

The gate insulation film 6 may also be formed of, for example, a silicon nitride film, or a compound film comprising a silicon oxide film and a silicon nitride film. If the gate insulation film 6 comprising silicon oxide is made less than 5 nm, and, more particularly, less than 3 nm in terms of silicon dioxide equivalent film thickness, the decrease of insulation breakdown voltage is remarkable due to generation of a direct tunnel current or hot carriers due to stress. Since the dielectric constant of the silicon nitride film is higher than that of a silicon oxide film, its silicon dioxide equivalent film thickness is thinner than its real film thickness.

That is, even when a silicon nitride film is provided and it is physically thick, approximately the same capacitance as that of a relatively thin silicon dioxide film can be obtained. Therefore, by forming the gate insulation film 6 from a single silicon nitride film or a compound film of this and silicon oxide, the effective film thickness can be made thicker than that of a gate insulation film 6 comprising a silicon oxide film, so a decrease of the insulation breakdown voltage due to generation of tunnel leakage current or hot carriers can be suppressed. Further, it is more difficult for impurities to penetrate a silicon oxide/nitride film than a silicon oxide film; therefore, by forming the gate insulation film 6 from a silicon oxide/nitride film, the fluctuation of threshold voltage resulting from diffusion of impurities of the gate electrode material into the semiconductor substrate can be suppressed.

If the specific inductive capacitance of an insulating film is $\epsilon i$, its film thickness is di and the specific inductive capacitance of silicon oxide is $\epsilon S$, the silicon dioxide equivalent film thickness (hereafter, referred to also as equivalent film thickness) of a single insulating film or a compound insulation film dr is a film thickness defined by the following equation.

$$dr = \sum \frac{\varepsilon i}{\varepsilon s} di \qquad \text{[Equation 1]}$$

For example, the dielectric constants of silicon oxide (SiO$_2$) and silicon nitride (Si$_3$N$_4$) are respectively 4–4.2 and 8. Then, if the dielectric constant of silicon nitride is calculated as twice the dielectric constant of silicon oxide, the silicon dioxide equivalent film thickness of a silicon nitride film of 6 nm film thickness, for example, will be 3 nm. That is, a gate insulation film comprising a silicon nitride film of 6 nm film thickness, and a gate insulation film comprising a silicon oxide film of 3 nm film thickness, have equal capacitance. Moreover, the capacitance of a gate insulation film comprising a compound film comprising a silicon oxide film of 2 nm film thickness and a silicon nitride film of 2 nm film thickness (converted film thickness=1 nm), is the same as the capacitance of a gate insulation film comprising a single silicon oxide film of 3 nm film thickness.

Next, as shown in FIG. 2, a gate electrode 7 comprising a low resistance polycrystalline silicon film, WN (tungsten nitride) film, and W (tungsten) film is formed over the upper part of the gate insulation film 6. The polycrystalline silicon film can be formed by CVD, and the WN film and W film can be formed by sputtering. The gate electrode 7 is formed by the patterning of these deposited films. The gate electrode 7 may be formed using a deposited film wherein a W silicide film or cobalt (Co) silicide film is deposited over a low resistance polycrystalline silicon film. The material of the gate electrode 7 may also be an alloy of polycrystalline or single crystal silicon (Si) and germanium (Ge). After forming such a gate electrode 7, a n$^-$ semiconductor region 11 of low impurity concentration is formed in the p type well 4, and a p$^-$ semiconductor region 12 of low impurity concentration is formed in the n type well 5 by ion implantation.

Figure 3:
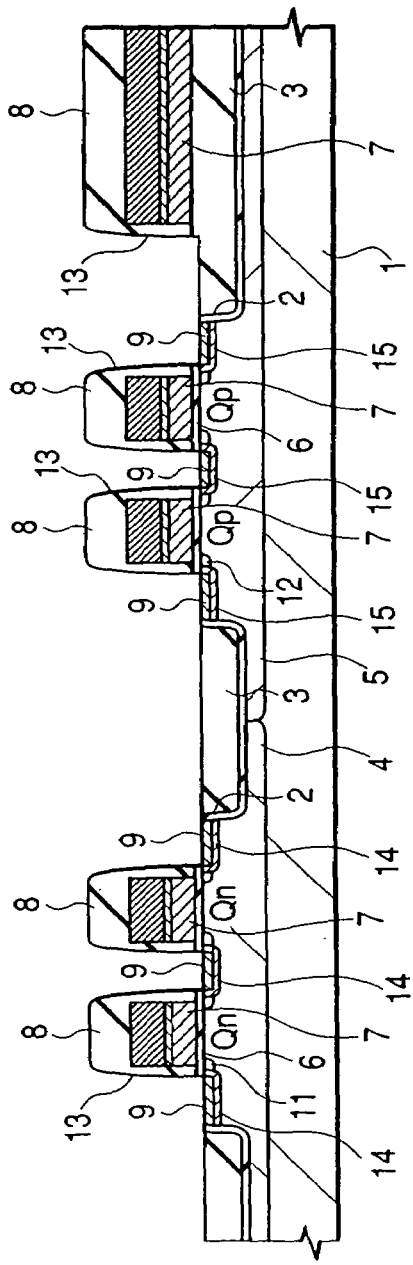
FIG. 3 is a cross-sectional view of the essential parts of a semiconductor substrate showing a step in the fabrication of Embodiment 1.

Next, as shown in FIG. 3, a silicon nitride film is deposited by CVD for example, and a side wall spacer 13 is formed in the side wall of the gate electrode 7 by anisotropic etching. Subsequently, a n$^+$ semiconductor region 14 (source, drain) of high impurity concentration is formed in the p type well 4, and a p$^+$ semiconductor region 15 (source, drain) of high impurity concentration is formed in the n well 5 by ion implantation. The n type impurity is typically phosphorus or arsenic, and the p type impurity is typically boron. Subsequently, metal films such as titanium and cobalt are deposited, and silicide layers 9 are formed in the surface of the n$^+$ semiconductor region 14 (source, drain) and the surface of the p$^+$ semiconductor region 15 (source, drain) using the so-called salicide method which removes unreacted metal film after heat treatment. The performing of the above steps completes the fabrication of a n channel MISFETQn and p channel MISFETQp.

Figure 4:
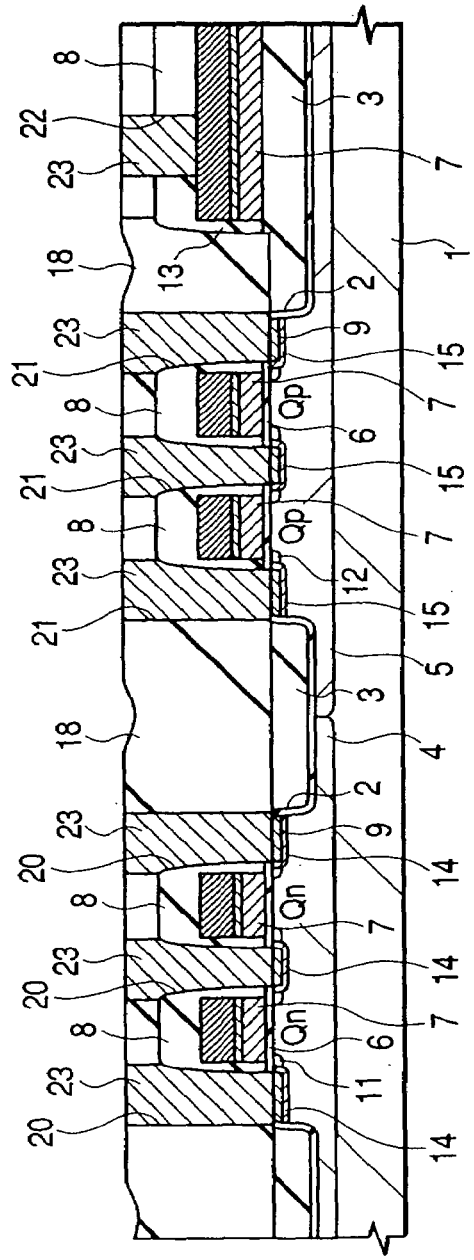
FIG. 4 is a cross-sectional view of the essential parts of a semiconductor substrate showing a step in the fabrication of Embodiment 1.

Next, as shown in FIG. 4, a silicon oxide film 18 is deposited over the substrate 1 by CVD, and by dry etching the silicon oxide film 18 using a photoresist film as a mask, a contact hole 20 is formed over the n$^+$ semiconductor region 14 (source, drain), and a contact hole 21 is formed over the p$^+$ semiconductor region 15 (source, drain). A contact hole 22 is formed also over the gate electrode 7 at this time.

The silicon oxide film 18 comprises a film with high reflow properties which can be embedded in the narrow space between the gate electrodes 7, 7, for example, a BPSG (Boron-doped Phospho Silicate Glass) film. A SOG (Spin On Glass) film formed by the spin coating method may also be used.

Next, a plug 23 is formed inside the contact holes 20, 21 and 22. To form the plug 23, for example, a TiN film and a W film are deposited by CVD over the upper part of the silicon oxide film 18 including the inside of the contact holes 20, 21 and 22. Unnecessary TiN film and unnecessary W film over the upper part of the silicon oxide film 18 are removed by chemical mechanical polishing (CMP) or the etch back method, leaving these films only on the insides of the contact holes 20, 21 and 22.

Figure 5:
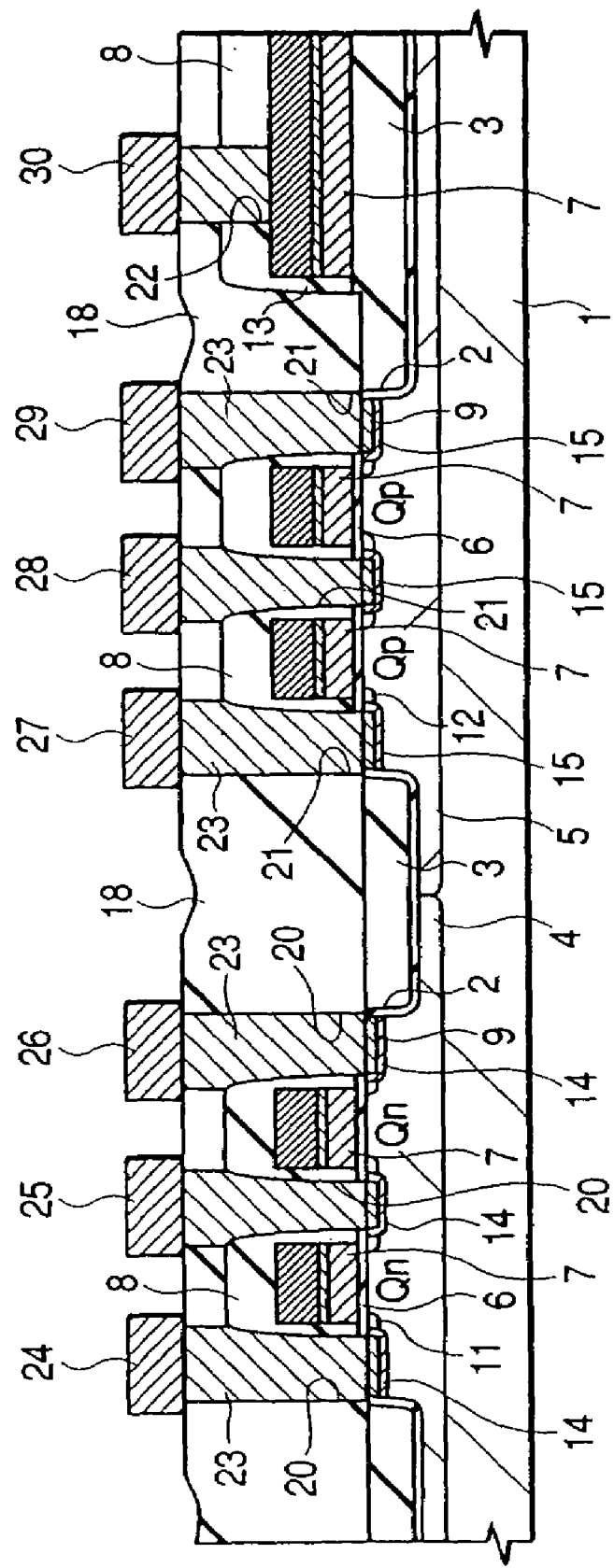
FIG. 5 is a cross-sectional view of the essential parts of a semiconductor substrate showing a step in the fabrication of Embodiment 1.

Next, as shown in FIG. 5, W interconnections 24 to 30 which form a first interconnection layer are formed over the silicon oxide film 18. To form the W interconnections 24 to 30, a W film is for example deposited over the upper part of the silicon oxide film 18 by sputtering, and the W film is dry etched using a photoresist film as a mask. The first layer of W interconnections 24 to 30 are electrically connected with the source and drain of the n channel MISFETQn (n$^+$ semiconductor region), source and drain of the p channel MISFETQp (p$^+$ semiconductor region), or the gate electrode 7 through the contact holes 20, 21 and 22.

Figures 6A, 6B:
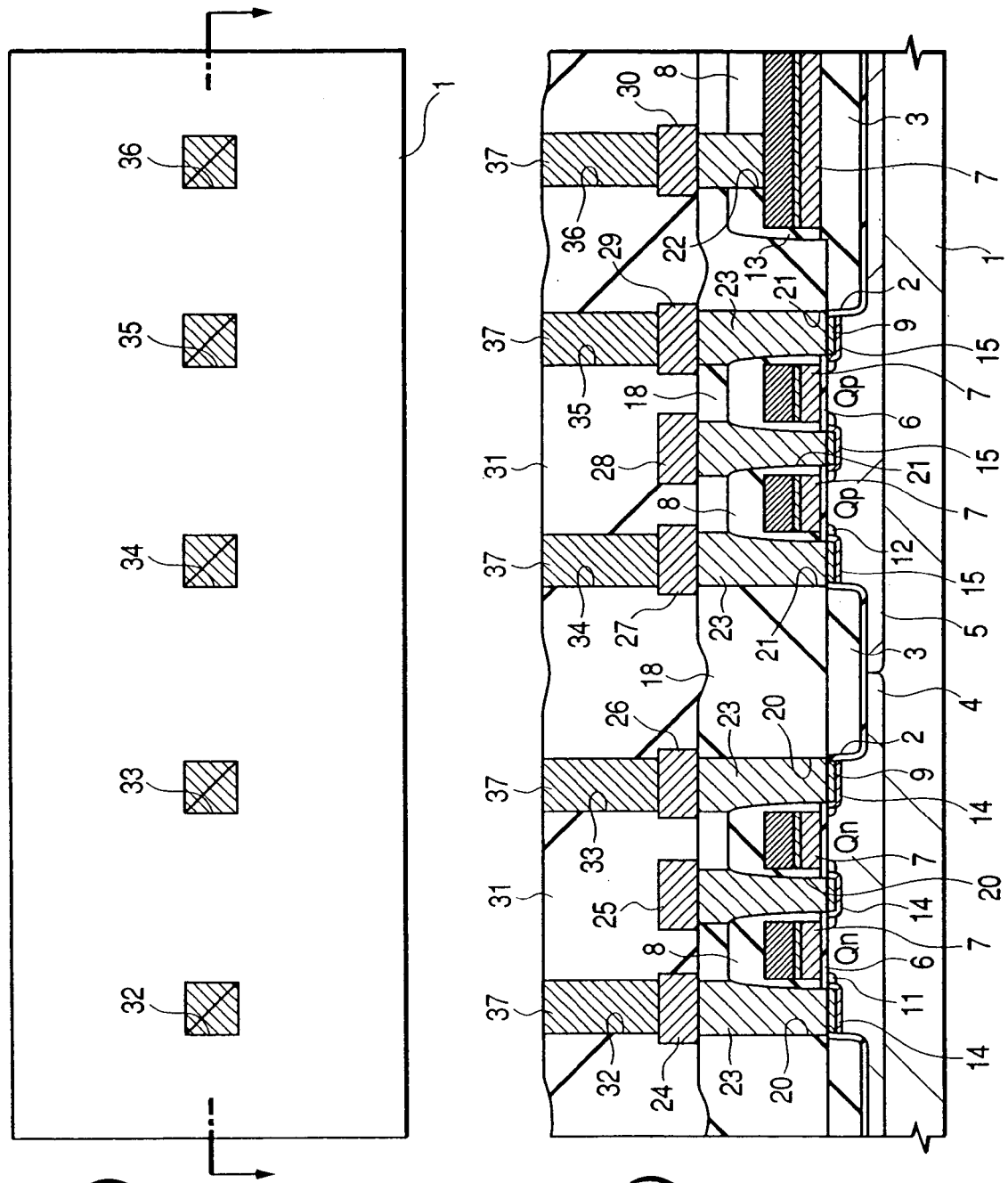
FIG. 6($a$) is a plan view and FIG. 6($b$) is a cross-sectional view of the essential parts of a semiconductor substrate showing a step in the fabrication of Embodiment 1.

Next, as shown in FIGS. 6(*a*) and 6(*b*), after depositing the silicon oxide film 31 over the first layer of W interconnections 24 to 30, and forming through holes 32 to 36 in the silicon oxide film 31 by dry etching using a photoresist film as a mask, a plug 37 is formed in the through holes 32 to 36. FIG. 6(a) is a plan view of the essential parts of the main surface of the semiconductor substrate, and FIG. 6(b) is a sectional view taken along a line A—A in FIG. 6(a).

The silicon oxide film 31 is deposited by plasma CVD using for example ozone (or oxygen) and tetraethoxysilane (TEOS) as the source gas. The plug 37 may also comprise a W film, and is formed by the same method as used for the aforesaid plug 23 formed inside the contact holes 20, 21 and 22.

Next, as shown in FIGS. 7(a) and 7(b), a thin silicon-nitride film 38 of 50 nm film thickness is deposited by plasma CVD over the upper part of the silicon oxide film 31, and a silicon oxide film 39 of about 450 nm film thickness is then deposited by plasma CVD over the upper part of the silicon nitride film 38. Subsequently, the silicon oxide film 39 and silicon nitride film 38 overlying the through holes 32 to 36 are removed by dry etching using a photoresist film as a mask so as to form interconnection slots 40 to 44. FIG. 7(a) is a plan view of the essential parts of the main surface of the semiconductor substrate, and FIG. 7(b) is a sectional view taken along line A—A in FIG. 7(a).

To form the interconnection slots 40 to 44, the silicon oxide film 39 is first selectively etched using the silicon nitride film 38 as an etching stopper, and then the silicon nitride film 38 is etched. By forming the thin silicon nitride film 38 underneath the silicon oxide film 39 in which the interconnection slots 40 to 44 are formed, temporarily stopping the etching at the surface of this silicon nitride film 38 and then etching the silicon nitride film 38, the depth can be controlled with high precision without producing over-etching of the interconnection slots 40 to 44.

Next, the embedded Cu interconnection, which is the second interconnection layer, is formed by the following method inside the interconnection slots 40 to 44.

Figure 8:
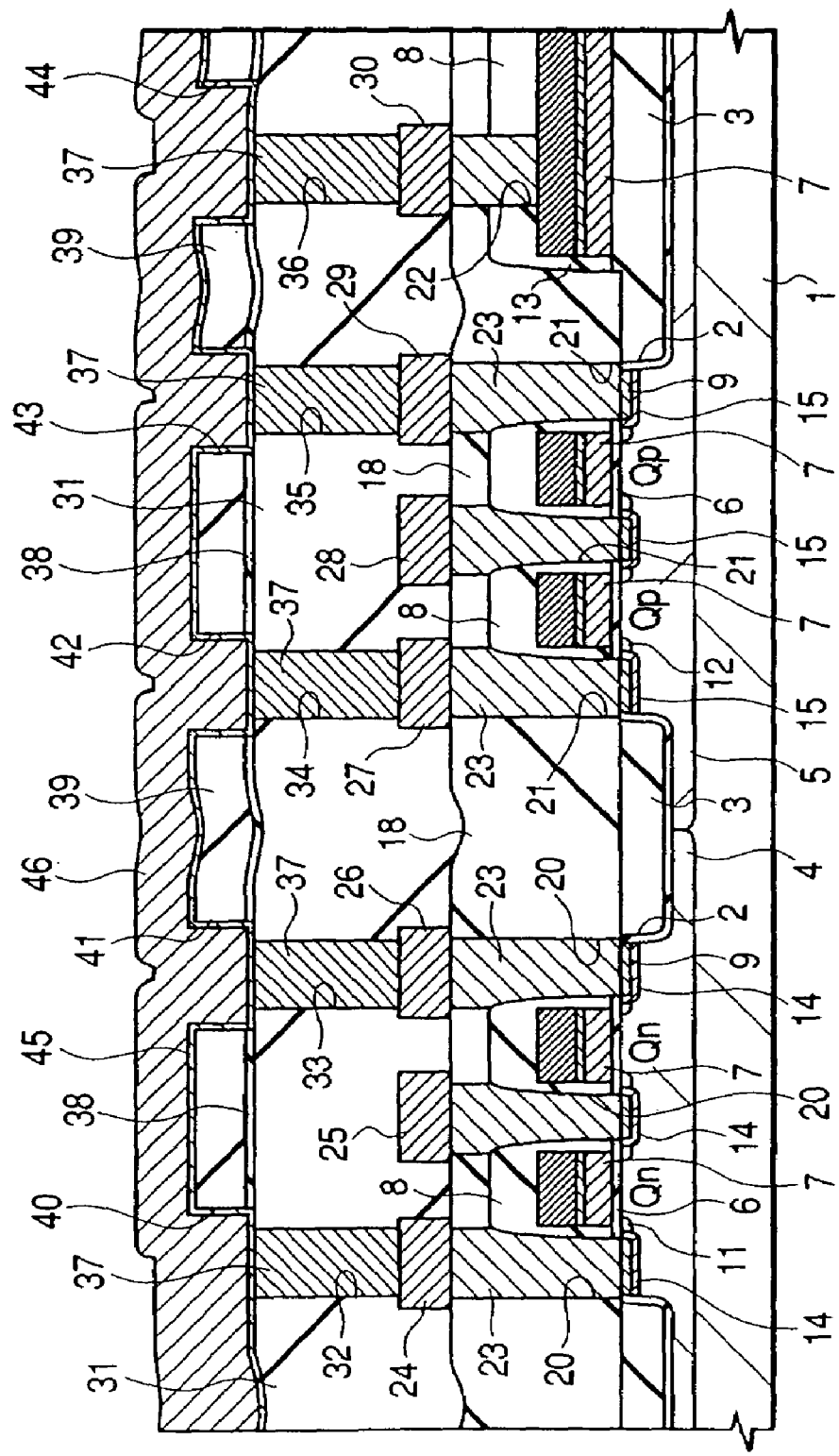
FIG. 8 is a cross-sectional view of the essential parts of a semiconductor substrate showing a step in the fabrication method of Embodiment 1.

First, as shown in FIG. 8, after depositing a thin TiN (titanium nitride) film 45 over the upper part of the silicon oxide film 39 including the inside of the interconnection slots 40 to 44 by sputtering, a Cu film 46 of a film thickness sufficiently larger than the depth of the interconnection slots 40 to 44 (for example, about 800 nm) is deposited over the upper part of the TiN film 45 by sputtering. For the sputtering of this TiN film 45 and Cu film 46, the usual sputtering methods may be used, and highly directional sputtering methods, such as long throw sputtering and collimate sputtering, may also be used.

Then, by heat-treating the substrate 1, for example in a non-oxidizing atmosphere (for example, a hydrogen atmosphere) at about 475° C., reflow of the Cu film 46 is performed to embed the Cu film 46 inside the interconnection slots 40 to 44 without any gaps. Herein, the Cu film 46 was formed by sputtering and then embedded by reflow, but instead a thin Cu film may be formed by sputtering, and a Cu film of high purity corresponding to the Cu film 46 subsequently formed by plating.

The TiN film 45 has the function of preventing diffusion of Cu. The TiN film 45 also has the function of improving the adhesive properties of the Cu film 46 and silicon oxide film 39. The TiN film 45 further has the function of increasing the wettability of the Cu film 46 at the time of reflow of the Cu film 46.

In this Embodiment 1, although a case has been described where the thickness of the thickest part of the TiN film 45 was 50 nm, according to results obtained by the Inventors, it is clear that this TiN film 45 can be made still thinner or eliminated. This will be described later with reference to Embodiment 6 and subsequent embodiments.

It is preferable to use high melting point metal nitrides which hardly react with Cu, such as WN, and TaN (tantalum nitride), instead of TiN as the film having such functions. Moreover, materials wherein Si is added to high melting point metal nitrides or high melting point metals such as Ta, Ti, W or TiW alloy which cannot react easily with Cu, can also be used instead of TiN.

Figure 9:
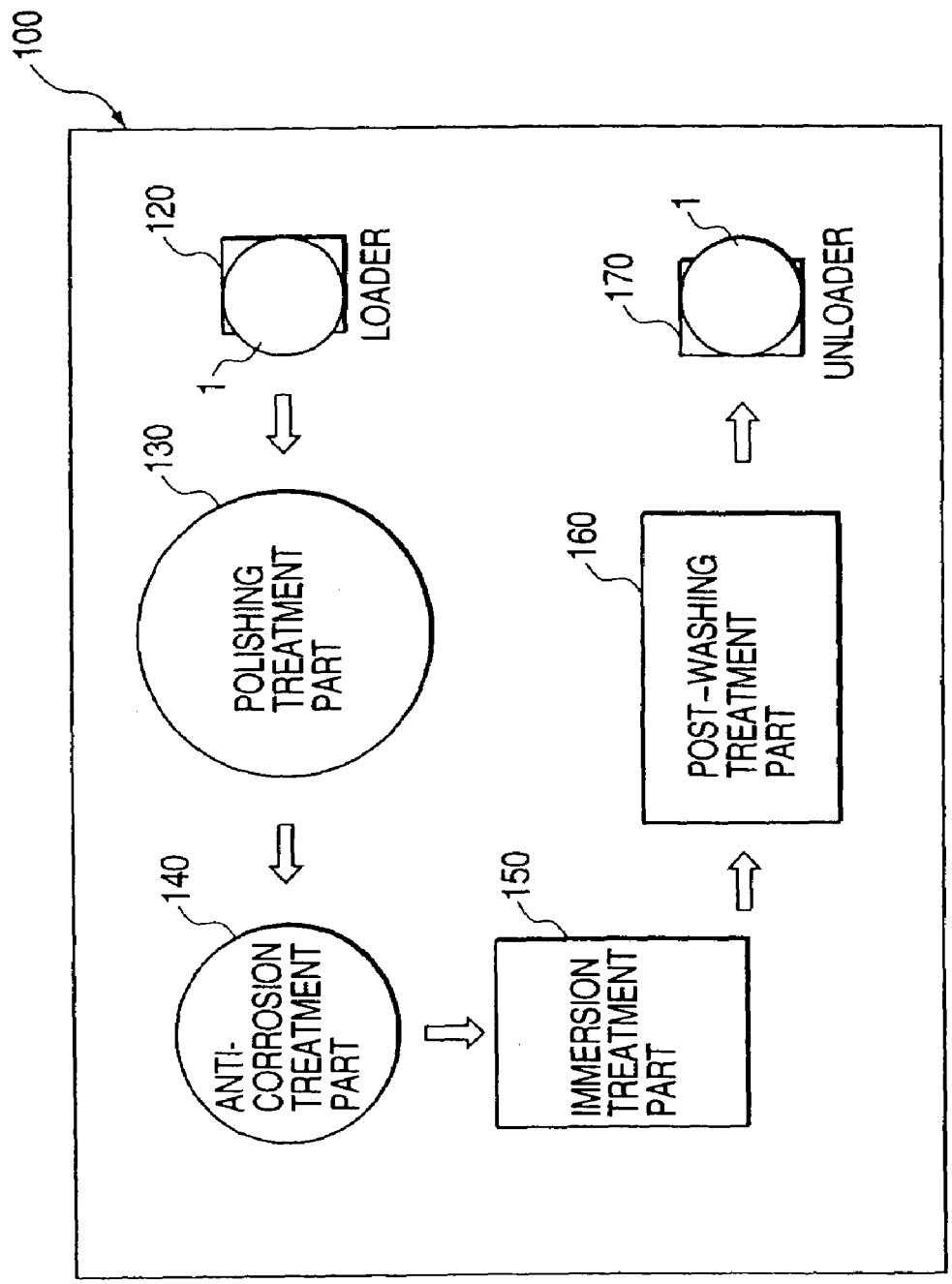
FIG. 9 is a schematic diagram showing an example of the overall construction of a CMP apparatus used in forming an embedded Cu interconnection.

Next, the Cu film 46 and TiN film 45 are polished by the above CMP method. An example of the overall construction of the CMP apparatus used for this polishing step is shown in FIG. 9.

This CMP apparatus 100 is a single wafer treatment CMP apparatus used for polishing the Cu film 46. It comprises a loader 120, which accommodates plural substrates 1 having the Cu film 46 formed in the surface; a polishing treatment part 130 which polishes and planarizes the Cu film 46; an anticorrosion treatment part 140, which applies anticorrosion treatment to the surface of the substrate 1 that has received polishing treatment; an immersion part 150, which ensures that the surface does not dry until the substrate 1, which has received anticorrosion treatment, is subjected to post-washing; a post-washing part 160, which post-washes the substrate 1 which has received anticorrosion treatment; and an unloader 170, which accommodates plural substrates 1 that have been subjected to post-washing.

Figure 10:
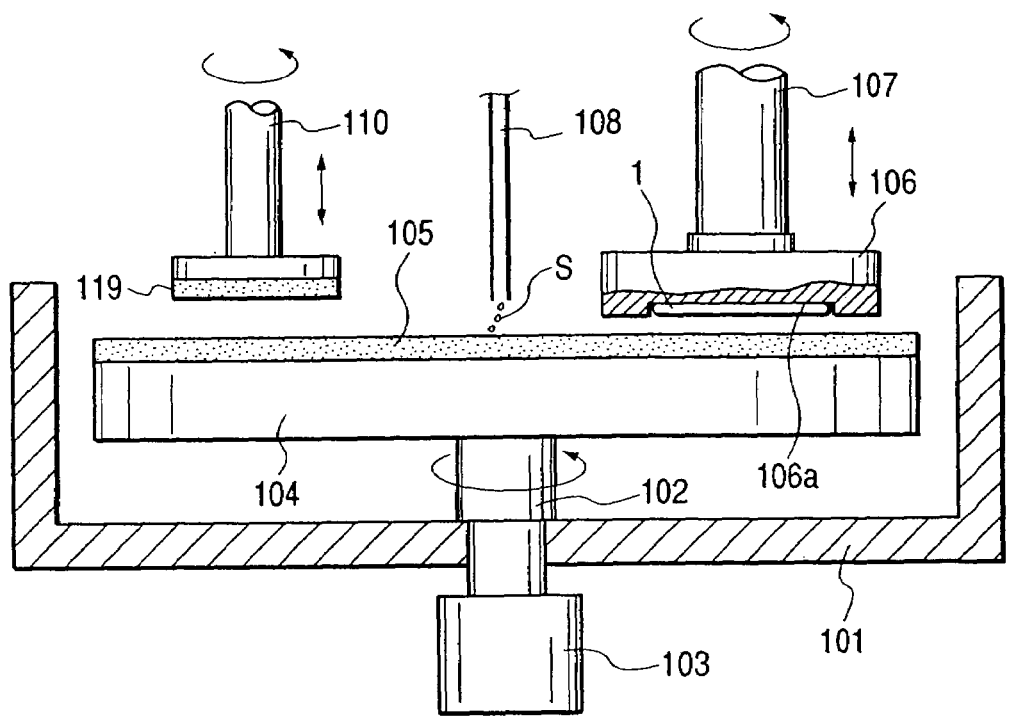
FIG. 10 is a diagram showing part of the construction of a CMP apparatus used in forming an embedded Cu interconnection.

As shown in FIG. 10, the polishing treatment part 130 of the CMP apparatus 100 comprises a frame 101 of which the upper part is open, and a polishing plate (platen) 104 driven by a motor 103 is attached to the upper end of a rotation shaft 102 that is attached to this frame 101. A polishing pad 105, which is formed by uniformly attaching a synthetic resin having plural pores, is attached to the surface of this polishing plate 104.

This polishing treatment part 130 is equipped with a wafer carrier 106 for retaining the substrate 1. A drive shaft 107, to which the wafer carrier 106 is attached, is driven by a motor, not shown, together with the wafer carrier 106, and moves up and down above the polishing plate 104.

The substrate 1 is retained in the wafer carrier 106, with its main surface, i.e., polished surface, facing down, by a vacuum adsorption mechanism, not shown, provided in the wafer carrier 106. A depression 106a, in which the substrate 1 is accommodated, is formed at the lower end of the wafer carrier 106; and, when the substrate 1 is accommodated in this depression 106a, the surface to be polished is almost flush with or slightly protrudes from the underside surface of the wafer carrier 106.

A slurry supply pipe 108 for supplying a polishing slurry (S) between the surface of the polishing pad 105 and the surface of the substrate 1 to be polished, is provided above the polishing plate 104, and the surface of the substrate 1 to be polished is polished chemically and mechanically by the polishing slurry (S) supplied from its lower end. The main components of the polishing slurry (S) are abrasive particles, such as alumina, and oxidizing agents, such as hydrogen peroxide water or aqueous ferrous nitrate solution, these being dispersed or dissolved in water.

The polishing treatment part 130 comprises a dresser 109, which is a tool for dressing the surface of the polishing pad. This dresser is attached to the lower end of a drive shaft 110 which moves up and down above the polishing plate 104 and is driven in rotation by a motor, not shown.

In the anticorrosion treatment part 140, the surface of the substrate 1, which has received polishing treatment, then receives anticorrosion treatment. The anticorrosion treatment part 140 has a construction similar to that of the polishing treatment part 130. Here, after the main surface of the substrate 1 is pushed against the polishing pad attached to the surface of the polishing plate (platen) to remove the polishing slurry mechanically, a hydrophobic protective film is formed in the surface part of the Cu interconnection formed over the main surface of the substrate 1 by supplying a chemical solution containing an anticorrosion agent, such as benzotriazole (BTA), to the main surface of the substrate 1.

Figure 11:
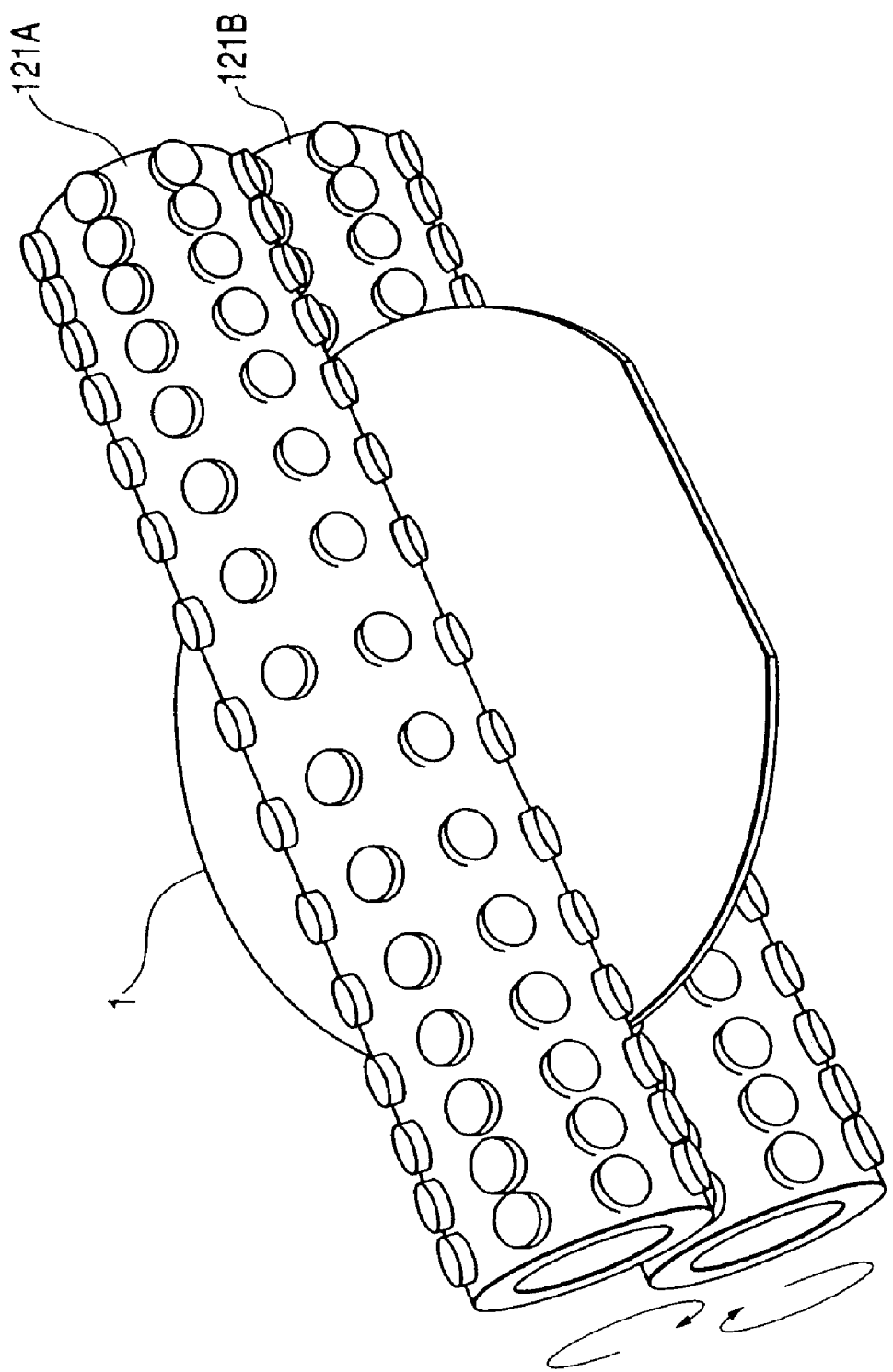
FIG. 11 is a perspective view showing a wafer scrub and rinse method.

In mechanical cleaning (pre-washing) of the polishing slurry, as shown for example in FIG. 11, both sides of the substrate 1, rotated in a horizontal plane, are gripped by cylindrical brushes 121A, 121B comprising a porous body of a synthetic resin, such as PVA (polyvinyl alcohol), and both surfaces of the substrate 1 are simultaneously washed while the brushes 121A, 121B are rotated in a plane perpendicular to the surface of the substrate 1. In the anticorrosion treatment after pre-washing, by performing a pure water scrub wash, pure water ultrasonic cleaning, pure water cleaning with running water or pure water spin washing prior to or at the same time as anticorrosion treatment, the oxidizing agent in the polishing slurry which adhered to the main surface of the substrate 1 in the polishing treatment part 130 is completely removed, and the hydrophobic protective film is formed under conditions in which the oxidizing agent has no substantial effect.

The substrate 1 which has received anticorrosion treatment is temporarily held by the immersion treatment part 150 in order to prevent dryness of the surface. The immersion treatment part 150 is intended to stop the surface of the substrate 1 which has received anticorrosion treatment from drying until the post-washing stage, and it has a construction in which, for example, a predetermined plural number of the substrates 1 are immersed in an immersion tank (stocker) overflowing with pure water. At this time, the corrosion of the Cu interconnections 28 to 30 can be further definitively prevented by supplying pure water, cooled to a low temperature at which the electrochemical corrosion reaction of the Cu interconnections 28 to 30 does not proceed to any great extent, to the immersion tank.

The dryness of the substrate 1 may be prevented by methods other than storage in the above-mentioned immersion tank, such as, for example, a pure water shower, provided that the surface of the substrate 1 can at least be maintained in the wet state.

The substrate 1 transported to the post-washing treatment part 160 is immediately given a post-washing, where the wet state of the surface is maintained. Here, after scrub washing (or brush washing) the surface of the substrate 1, while supplying weak alkaline chemical solutions, such as a washing liquid containing NH40H, to neutralize the oxidizing agent, an aqueous hydrofluoric acid solution is supplied to the surface of the substrate 1 to remove foreign matter (particles) by etching. Also, the surface of the substrate 1 may be subjected to a pure water scrub wash, pure water ultrasonic cleaning, pure water cleaning with running water or a pure water spin wash, and the undersurface of the substrate 1 subjected to a pure water scrub wash, prior to or at the same time as the aforesaid scrub wash.

After a pure water rinse and spin drying, the substrate 1 which has received the post-washing is accommodated in the unloader 170 in the dry state and is transported in plural units to the following step.

Figure 12:
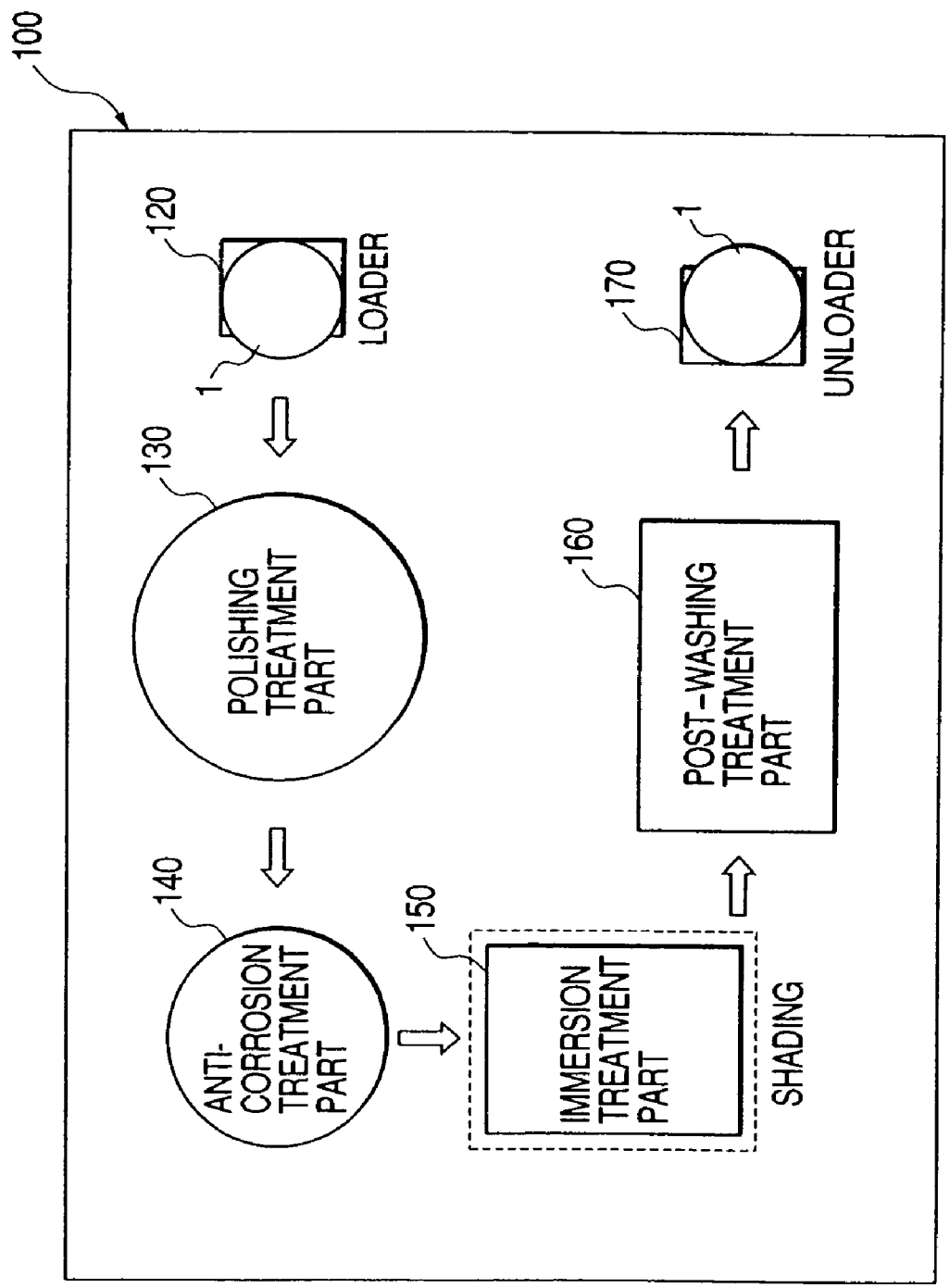
FIG. 12 is a schematic diagram showing another example of the overall construction of a CMP apparatus used in forming an embedded Cu interconnection.

In addition, the immersion treatment part (wafer storage part) 150 for preventing surface dryness of the substrate 1, which has received anticorrosion treatment, may be given a shielded structure so that the surface of the substrate 1 under storage can be prevented from being irradiated by lighting, as shown in FIG. 12. This can prevent generation of short-circuit currents by the photovoltaic effect. When the immersion treatment part 150 is given a shielded structure, the area around the immersion tank (stocker) is covered with a shield, etc., so that the illuminance inside the immersion tank (stocker) does not exceed 500 lux, preferably does not exceed 300 lux, and more preferably does not exceed 100 lux.

Figure 13:
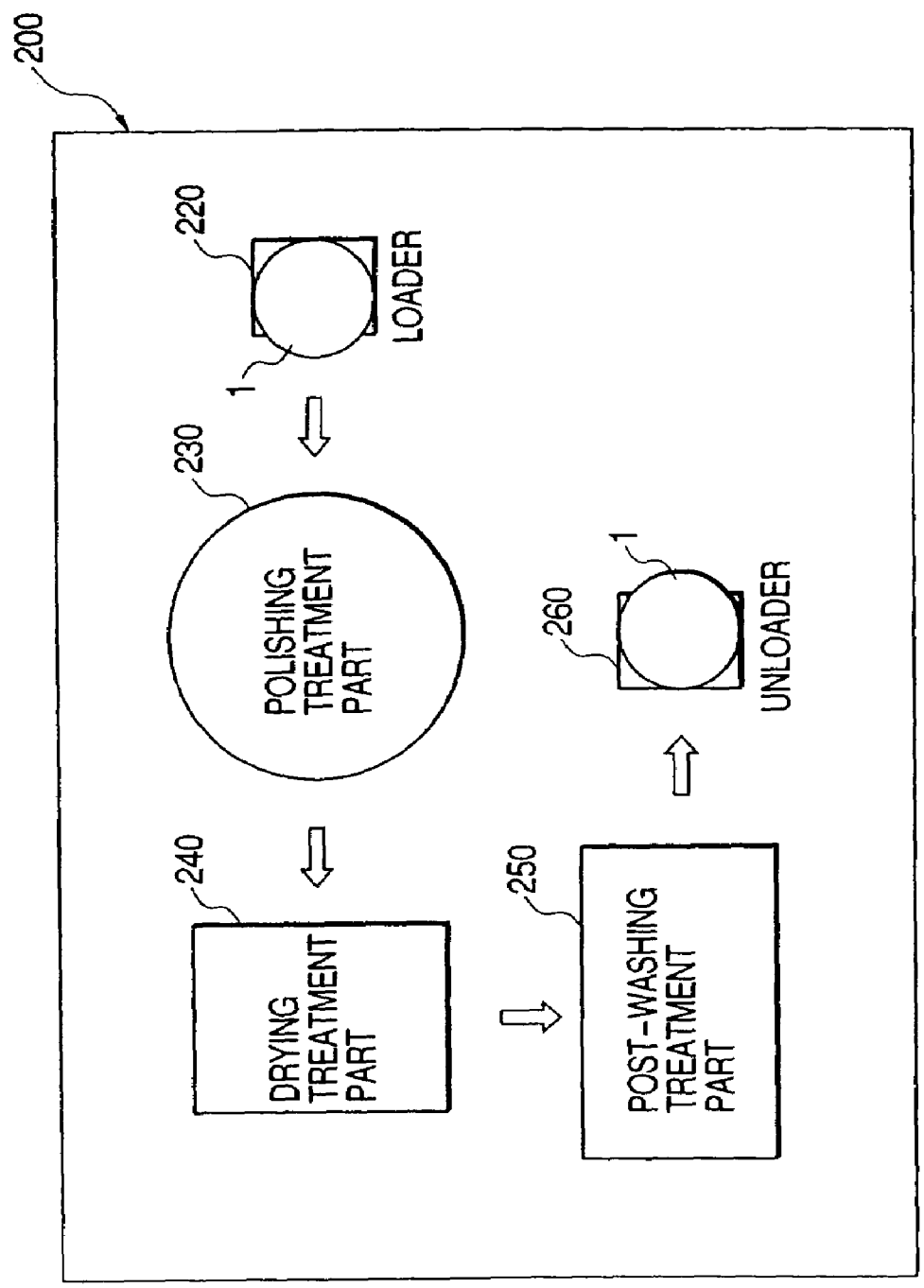
FIG. 13 is a schematic diagram showing yet another example of the overall construction of a CMP apparatus used in forming an embedded Cu interconnection.

As shown in FIG. 13, immediately after polishing, i.e., before the electrochemical corrosion reaction by the oxidizing agent in the polishing slurry remaining on the surface starts, the substrate 1 may be immediately transported to the drying treatment part, and the moisture in the polishing slurry removed by forced drying. The CMP apparatus 200 shown in FIG. 13 comprises a loader 220, which accommodates plural substrates 1 having a Cu film formed over the surface; a polishing treatment part 230, which polishes and planarizes the Cu film and forms interconnections; a drying treatment part 240, which dries the surface of the substrate 1 that has received polishing treatment; a post-washing treatment part 250, which carries out post-washing of the substrate 1; and an unloader 260, which accommodates plural substrates 1 that have received post-washing. In the Cu interconnection forming process using this CMP apparatus 200, the substrate 1 subjected to polishing treatment in the polishing treatment part 230 is transported to the drying treatment part 240 immediately after the polishing treatment, i.e., before the electrochemical corrosion reaction due to the oxidizing agent in the polishing slurry remaining on the surface starts, and the moisture in the polishing slurry is removed by forced drying. Then, the substrate 1 is transported to the post-washing treatment part 250 while the dry state is maintained, and after it is given a post-washing treatment, it is accommodated in the unloader 260 after a pure water rinse and spin drying. In this case, since the surface of the substrate 1 is maintained in the dry state immediately, after polishing treatment until post-washing is started, the start of the electrochemical corrosion reaction is suppressed, and corrosion of the Cu interconnections can thus be effectively prevented.

Figure 14:
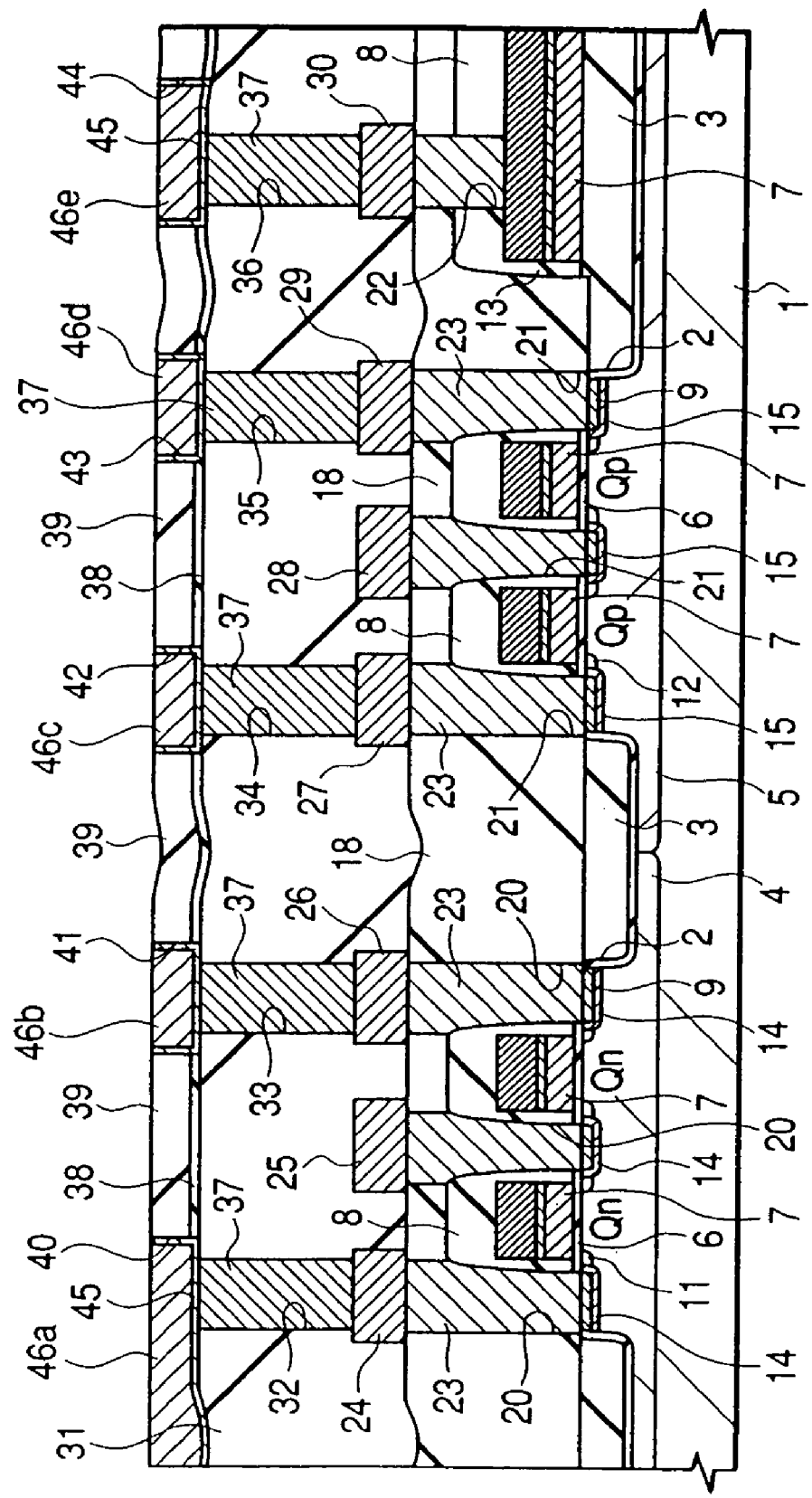
FIG. 14 is a cross-sectional view of the essential part of a semiconductor substrate showing a step in the fabrication of Embodiment 1.

After the polishing step in this CMP method, the Cu film 46 and TiN film 45 over the silicon oxide film 39 are removed, and, as shown in FIG. 14, Cu interconnections 46a to 46e are formed in the interconnection slots 40 to 44.

Next, plasma treatment is given to the surface of the Cu interconnections 46a to 46e and silicon oxide film 39. FIG. 15(a) is a sectional view and FIG. 15(b) is a plan view showing an example of the apparatus used for plasma treatment. This plasma treatment is disclosed by Japanese Unexamined Patent Publication No. Hei 11 (1999)-226876 submitted by the Inventors.

In this treatment apparatus, two treatment chambers 302a, 302b and a cassette interface 303 are attached to a load lock chamber 301. A robot 304 which transports the substrate 1 is provided in the load lock chamber 301. A gate valve 305 is provided between the load lock chamber 301 and treatment chambers 302a, 302b, so that the high vacuum state of the load lock chamber 301 can be maintained.

A susceptor 306 which holds the substrate 1, a baffle plate 307 which adjusts the gas flow, a supporting member 308 which supports the susceptor 306, a mesh-shaped electrode 309 disposed facing the susceptor 306 and an insulating plate 310 disposed substantially opposite the baffle plate 307, are arranged in the treatment chambers 302a, 302b. The insulating plate 310 has an action which suppresses parasitic discharges in unnecessary regions other than between the susceptor 306 and electrode 309. A lamp 312 is installed in a reflective unit 311, arranged on the rear side of the susceptor 306, and infrared rays 313 emitted by the lamp 312 pass through a quartz aperture 314 to irradiate the susceptor 306 and substrate 1. Thereby, the substrate 1 is heated. The substrate 1 is installed face up on the susceptor 306.

The interior of the treatment chambers 302a, 302b can be evacuated to a high vacuum, and treatment gas together with high frequency power is supplied from a gas port 315. The treatment gas is supplied to the vicinity of the substrate 1 via the mesh-shaped electrode 309. The treatment gas is evacuated from a vacuum manifold 316, and the pressure is controlled by controlling the supply flow rate and discharge rate of treatment gas. The high frequency power is applied to the electrode 309, and it generates a plasma between the susceptor 306 and electrode 309. The high frequency power uses, for example, a frequency of 13.56 MHz.

In the treatment chamber 302a, the ammonia plasma treatment to be described below is performed, for example. In the treatment chamber 302b, a cap film (silicon nitride film) to be described later is deposited. The treatment chamber 302a and treatment chamber 302b are connected via the load lock chamber 301, so the substrate can be transported to the treatment chamber 302b without vacuum breakdown after ammonia plasma treatment, and ammonia plasma treatment and forming of the cap film may be performed continuously.

Next, ammonia plasma treatment is performed on the substrate 1 using the aforesaid plasma treatment apparatus. The substrate 1 is transported into the load lock chamber 301 by the robot 304 from the cassette interface 303. The load lock chamber 301 is evacuated until the pressure is sufficiently reduced, and the substrate 1 is then transported to the treatment chamber 302a by the robot 304.

The gate valve 305 of the treatment chamber 302 is closed, and after evacuating the treatment chamber 302a until it is at a sufficient degree of vacuum, ammonia gas is introduced to the treatment chambers 302a and is maintained at a predetermined pressure by pressure adjustment.

Figure 16:
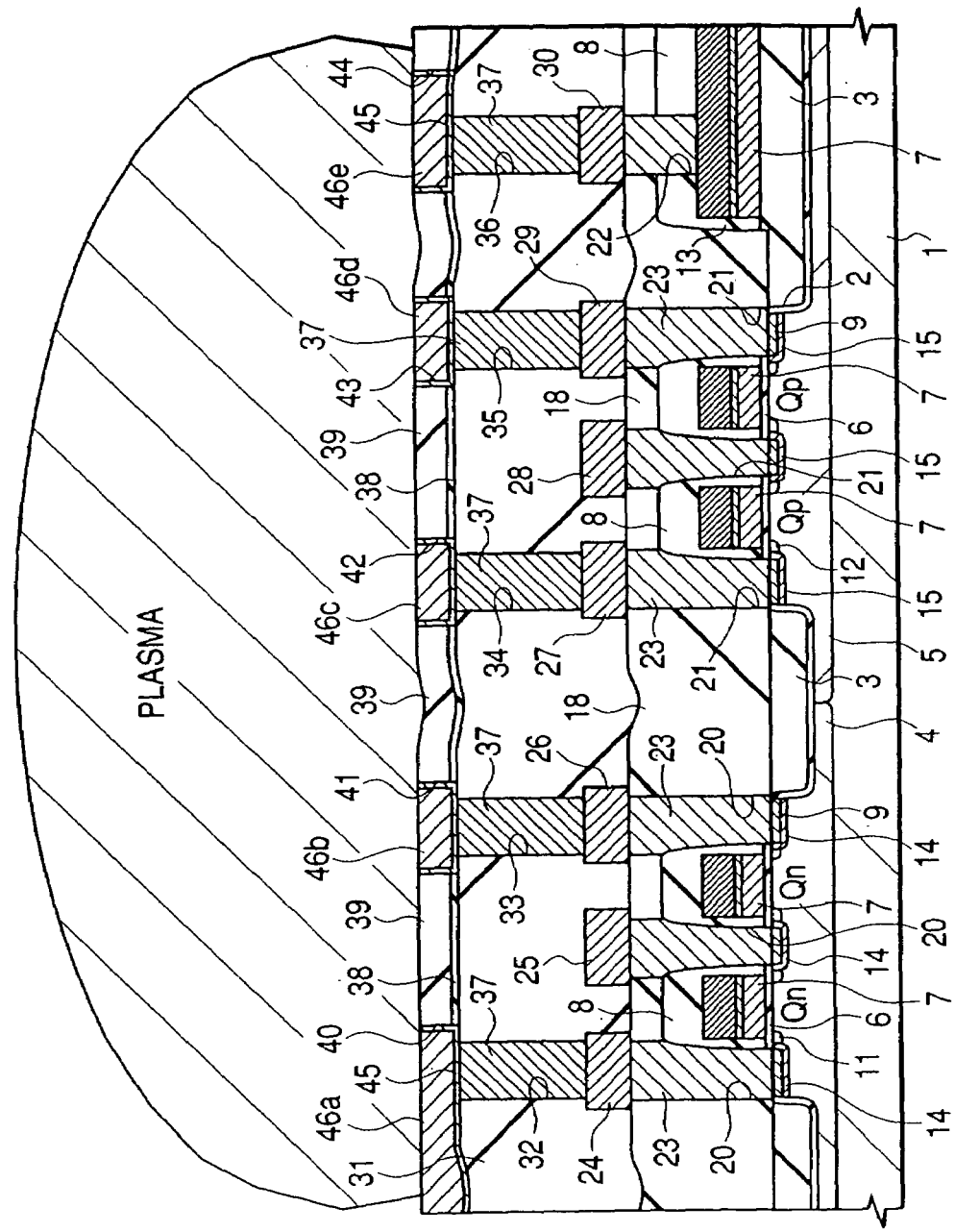
FIG. 16 is a cross-sectional view of the essential parts of a semiconductor substrate showing a step in the fabrication of Embodiment 1.

Subsequently, as shown in FIG. 16, an electric field is applied to the electrode 309 from the high frequency power supply, and the surface of the substrate 1 is plasma treated. After a predetermined time has elapsed, the high frequency field is stopped and the plasma is stopped. Subsequently, the interior of the treatment chamber 302a is evacuated, the gate valve 305 is opened and the substrate 1 is transported to the load lock chamber 301 by the robot 304. The load lock chamber 301 is maintained at a high level of vacuum so that the surface of the substrate 1 is not exposed to the atmosphere.

When the size of the substrate 1 is eight inches about 20 cm), for example, plasma treatment conditions may be pressure 5.0 Torr (=6.6661×10² Pa), RF power 600 W, substrate temperature 400° C., ammonia flow rate 200 sccm and treatment time 10 seconds. The inter-electrode distance was 600 mils. The plasma treatment conditions are of course not the limited to those shown here.

According to experiments performed by the Inventors, the higher the pressure, the more the plasma damage can be reduced, the higher the substrate temperature is; while the scatter in the substrate regarding TDDB life is reduced and longer will be the life that is obtained. It was also observed that a hillock occurs more easily on the Cu surface, the higher the substrate temperature is, the larger the RF power is and the longer the treatment time is. In view of these observations and the scatter in the conditions due to the construction of the apparatus, the pressure may be set to 0.5 6 Torr (=0.6666×10² to 7.99932×10² Pa), the RF power to 300–600 W, the substrate temperature to 350–450° C., the ammonia flow rate to 20–500 sccm, the treatment time to 5–180 seconds, and the inter-electrode distance to 300–600 mils.

By performing plasma treatment on the surface of the copper interconnections 46a to 46e and silicon oxide film 39, silicon nitride films of base layer material may be formed in very thin regions of the surfaces of the copper interconnections 46a to 46e and silicon oxide film. Hence, the adhesion between the cap film (silicon nitride film), which will be described next, the Cu interconnections 46a to 46e and the silicon oxide film 39 can be improved, and TDDB life can be remarkably enhanced.

This point will be described in more detail later together with an analysis of the experimental results obtained by the Inventors.

Figure 17:
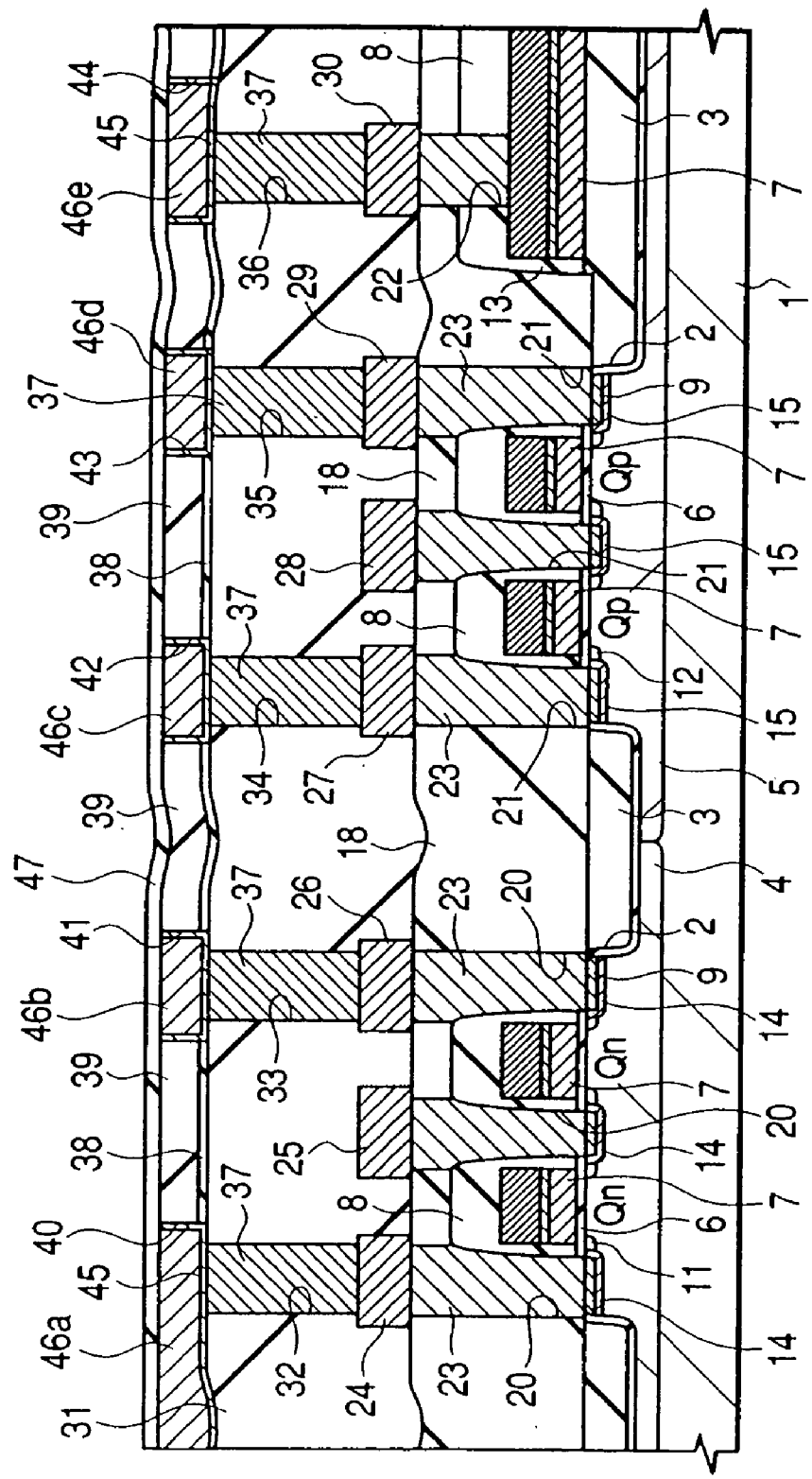
FIG. 17 is a cross-sectional view of the essential parts of a semiconductor substrate showing a step in the fabrication of Embodiment 1.

Next, the substrate 1 is transported to the treatment chamber 302b using the robot 304. The gate valve 305b of the treatment chamber 302b is closed, and after evacuating the treatment chamber 302b to a sufficient degree of vacuum, a mixture of silane (SiH$_4$), ammonia and nitrogen is introduced to the treatment chamber 302b, and the pressure is maintained at a predetermined pressure by performing pressure adjustment. Subsequently, a plasma is generated by applying an electric field to the electrode 309 from the high frequency power supply; and, as shown in FIG. 17, a silicon nitride film 47 (cap film) is deposited over the surface of the Cu interconnections 46a to 46e and silicon nitride film 39. After a predetermined time has elapsed, the high frequency field is stopped and the plasma is stopped. Subsequently, the interior of the processing chamber 302b is evacuated, the gate valve 305 is opened and the substrate 1 is transported to the load lock chamber 301 by the robot 304. The substrate 1 is further discharged into the cassette interface 303 by the robot 304.

Figure 18:
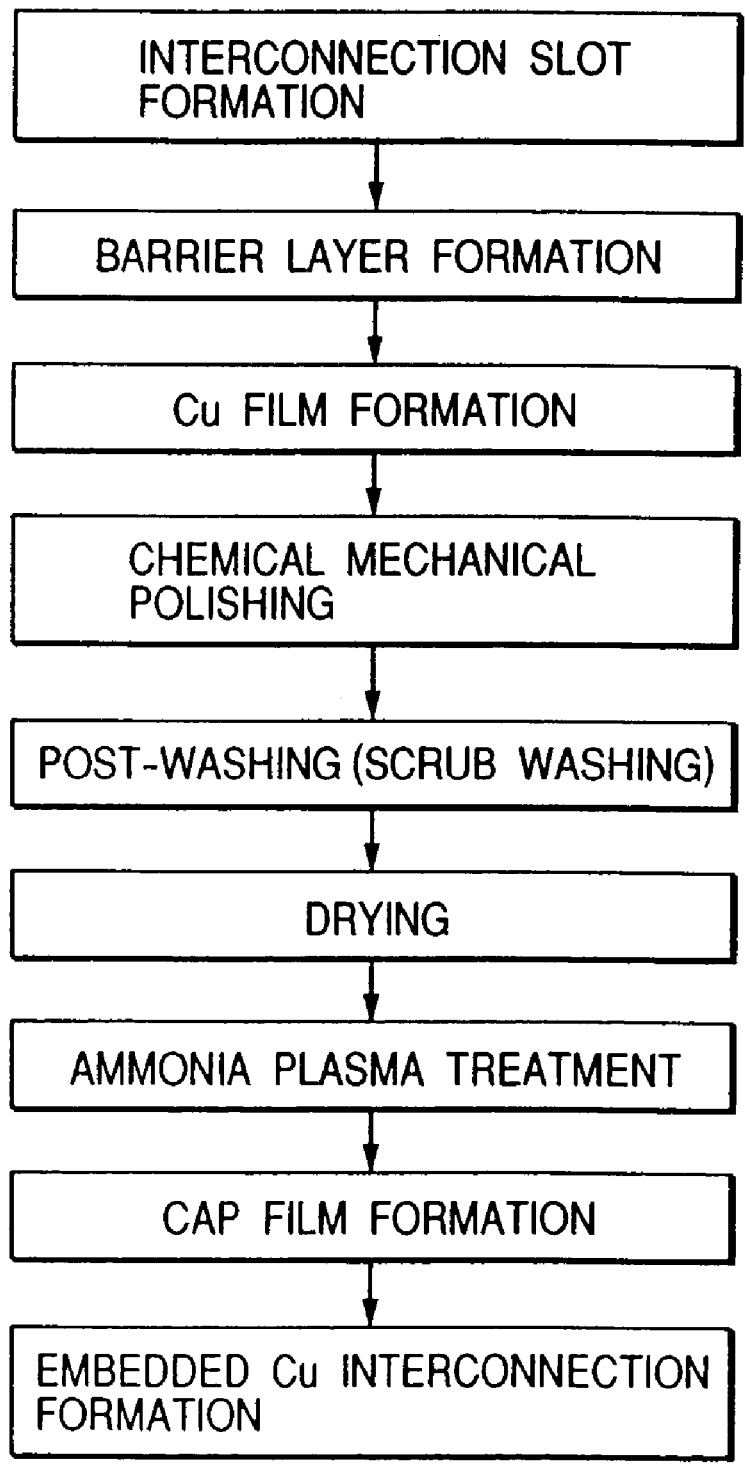
FIG. 18 is a flow diagram showing a method of fabricating the semiconductor integrated circuit device of Embodiment 1.

The film thickness of the silicon nitride film 47 may be 50 nm, for example. Subsequently, a silicon oxide film is formed so as to form a plug connecting a third interconnection layer and second interconnection layer (Cu interconnections 46a to 46e), the third and subsequent embedded copper interconnections being formed by the same method as described above. FIG. 18 shows the overall flow of the process for forming the Cu interconnections 46a to 46e.

Figure 19:
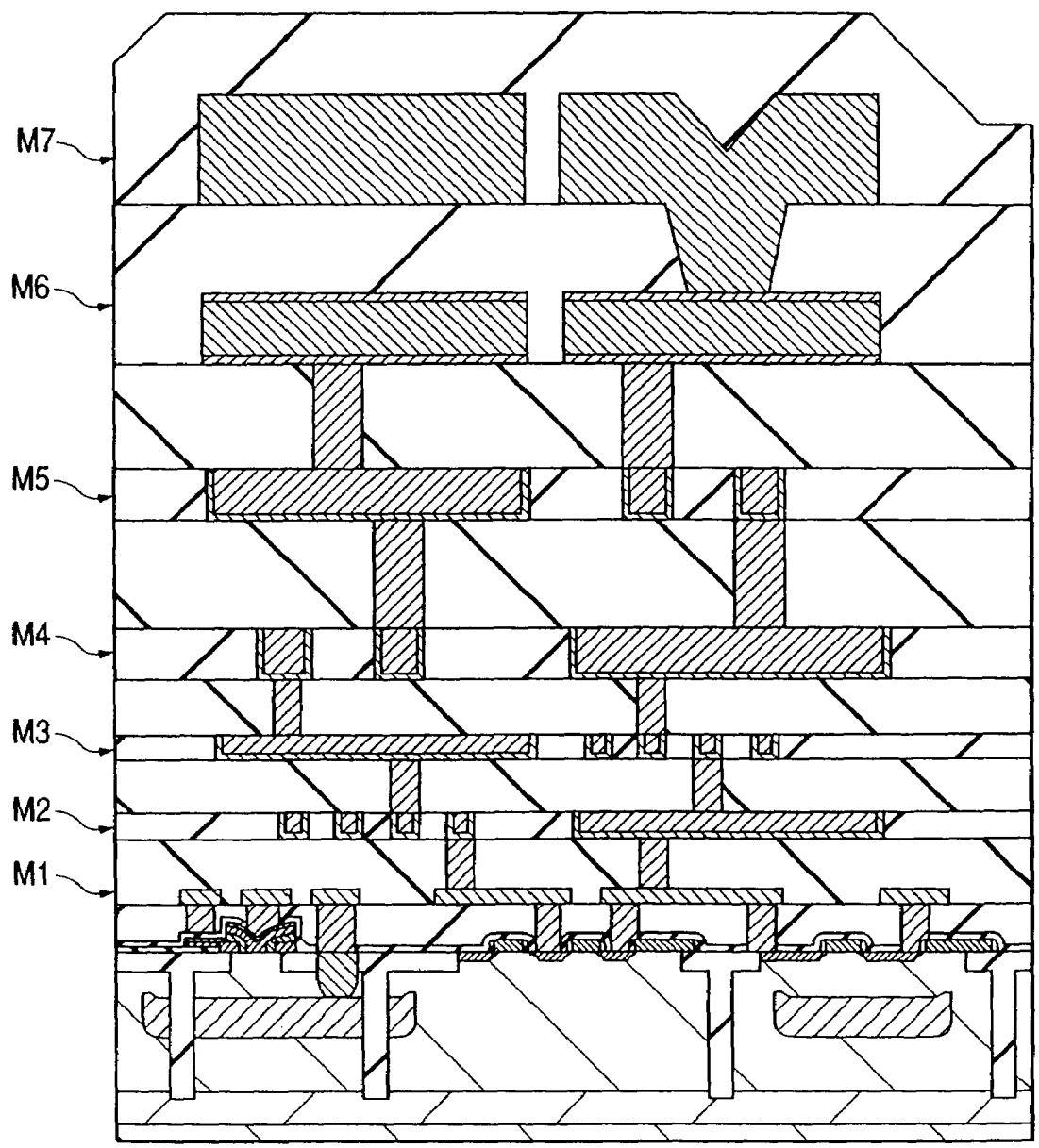
FIG. 19 is a sectional view showing the essential features of the semiconductor integrated circuit device of Embodiment 1.

FIG. 19 shows an example of a CMOS-LSI in which interconnections are formed up to a seventh interconnection layer. The first interconnection layer (M1) comprises a tungsten film as described above. The film thickness of the first interconnection layer and the line pitch (distance between centers of adjacent interconnections) are, for example, of the order of 0.4 μm or 0.25 μm.

The second interconnection layer (M2) to the fifth interconnection layer (M5) are fabricated by the above method of forming Cu interconnections. The thickness of the TiN film of the second interconnection layer (M2) and third interconnection layer (M3) is, for example, of the order of 0.05 μm, the thickness of the Cu film is, for example, of the order of 0.35 μm, and the line width and line pitch are, for example, of the order of 0.5 μm or 0.25 μm. The thickness of the TiN film of the fourth interconnection layer (M4) and fifth interconnection layer (M5) is, for example, of the order of 0.05 μm, the thickness of the Cu film is, for example, of the order of 0.95 μm, and the line width and line pitch are, for example, of the order of 1.0 μm or 0.25 μm.

The sixth interconnection layer (M6) may, for example, have a three layer composition of tungsten film, alumina film and tungsten film. The seventh interconnection layer (M7) comprises, for example, an aluminum film. A pad electrode is formed on or a bonding wire is connected to a pad of the seventh interconnection layer (M7), but this is not shown in the diagram. One reason why the seventh interconnection layer (M7) is comprised of a laminated film of alumina and tungsten, is that this laminated film is used as the uppermost layer of ordinary semiconductor integrated circuit devices not employing a Damascene interconnection structure, and connections to bump electrodes or bonding wires have been found to be reliable from experience.

The diameter of the through hole connecting the first interconnection layer M1 and second interconnection layer M2 may be of the order of 0.45 µm or 0.25 µm, for example. The diameter of the through hole connecting the second interconnection layer M2 and third interconnection layer M3 may be of the order of 0.5 µm or 0.25 µm, for example. The diameter of the through hole connecting the third interconnection layer M3 and fourth interconnection layer M4 may be of the order of 0.5 µm or 0.25 µm, for example. The diameter of the through hole connecting the fourth interconnection layer M4 and fifth interconnection layer M5 may be of the order of 1.0 µm or 0.25 µm, for example. The diameter of the through hole connecting the fifth interconnection layer M5 and sixth interconnection layer M6 may be of the order of 0.5 µm or 0.25 µm, for example.

Figure 20:
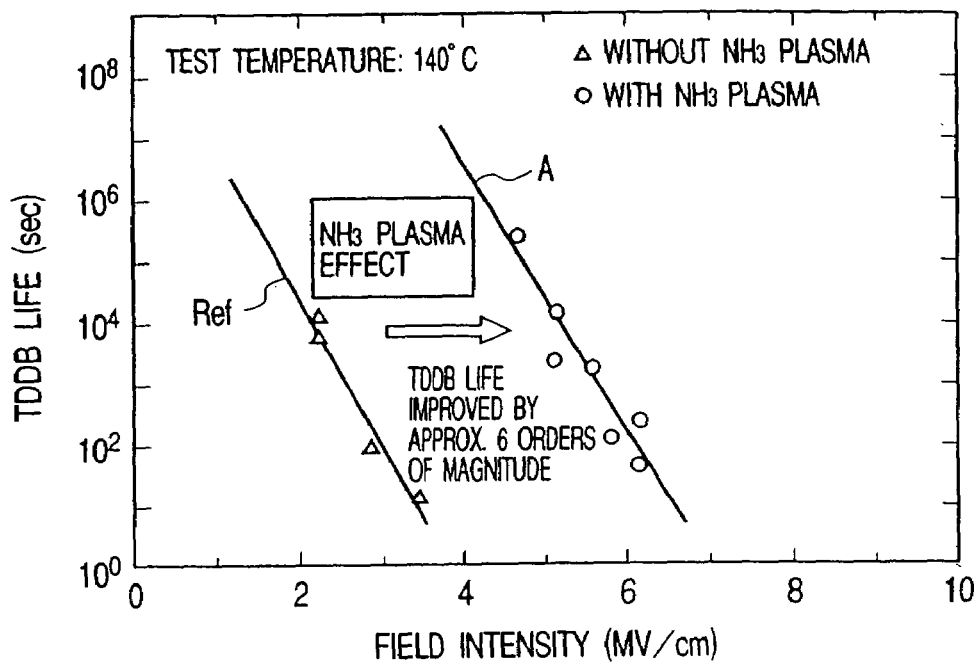
FIG. 20 is a graph showing TDDB life.

According to this embodiment, the TDDB life is largely improved. FIG. 20 is a graph showing the TDDB life of a TEG sample formed in the same layer as the second interconnection layer M2 (Cu interconnections 46a to 46e) of this embodiment, the data for this embodiment being shown by a line A. As a comparison, TDDB life data (the line Ref) when ammonia plasma treatment is not performed is also shown. As is clear from the diagram, according to this embodiment, a life improvement of approximately six orders of magnitude is found compared to the comparison data.

Figure 21:
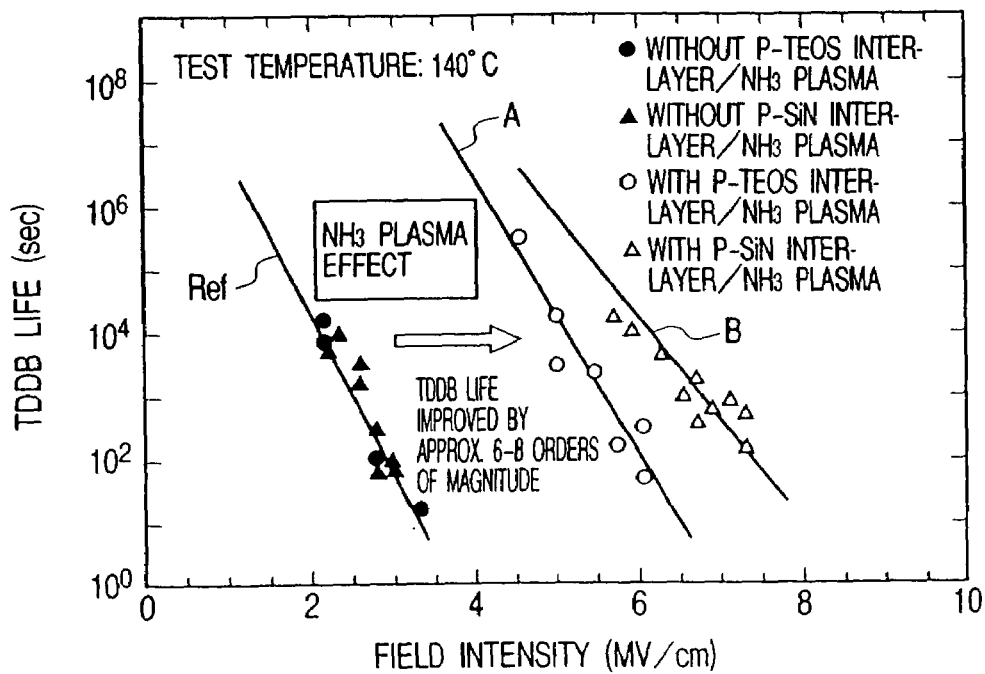
FIG. 21 is a graph showing TDDB life.

FIG. 21 shows data (line B) when the silicon oxide film 39 used in this embodiment is replaced by a hard silicon nitride film which has a finer construction. Even when the insulating film is replaced by silicon nitride, if ammonia plasma treatment is not performed, there is no difference whatsoever from the case where a silicon oxide film is used (line Ref). On the other hand, if a silicon nitride film is used as the insulating film and ammonia plasma treatment is performed, TDDB life is improved more than in the present embodiment. However, the amount of this improvement is not large, and it is seen that the performing of ammonia plasma treatment is the determining factor.

This shows that the factors which determine TDDB life are more predominantly governed by the interface of the insulating film than by its bulk.

The Inventors performed a surface examination of copper and silicon oxide films to analyze the mechanism whereby TDDB life is improved by ammonium plasma treatment. The results of this analysis will now be described.

FIG. 22(a)–FIG. 24(d) are graphs showing the results of an XPS (X-ray Photoelectron Spectroscopy) of a Cu interconnection surface. FIGS. 22(a), 22(c), 23(a), 23(c), 24(a), and 24(c) show spectral results for Cu2p, and FIGS. 22(b), 22(d), 23(b), 23(d), 24(b), and 24(d) show the spectral results for N1s.

FIGS. 22(a), 22(b) show the results of analyzing the Cu interconnection surface in the as-deposited state. Since a peak was observed due to Cu2p and the peak due to N1s is of the same level as background noise, it is seen that nitrogen is not present in the as-deposited Cu film. FIGS. 22(c), 22(d) show the results of analyzing the Cu interconnection surface immediately after CMP alone was performed on the Cu film. Here, a N1s peak is observed together with the peak due to Cu2p. As the slurry contains BTA as described above, it may be conjectured that nitrogen in the BTA remaining on the Cu surface is being observed. FIGS. 23(a), 23(b) show the results of analyzing the Cu interconnection surface up to the stage where post-washing is performed after CMP. There is no change in the Cu2p peak, but the N1s peak declines. This is probably due to the removal of BTA by washing. FIGS. 23(c), 23(d) show the results of analyzing the Cu interconnection surface which was left for 24 hours in the atmosphere after post-washing. A CuO peak is observed together with the Cu2p peak. No change is however observed in the N1s peak. Thus, leaving the sample in the atmosphere caused oxidation of the Cu surface to produce CuO.

The results of analyzing the Cu interconnection surface when ammonia plasma treatment was performed on the Cu interconnection oxidized in this way are shown in FIGS. 24(a), 24(b). The peak due to CuO almost disappears. On the other hand, the peak due to N1s is clearly visible. This is probably due to the fact the Cu surface was reduced, oxygen was removed and the surface was nitridized. As a comparison, the Cu interconnection surface was analyzed when hydrogen annealing at 350° C. was performed on the oxidized Cu interconnection. The results are shown in FIGS. 24(c), 24(d). Comparing FIG. 24(c) with FIG. 24(a), the Cu2p peak is closer to the as-deposited state (FIG. 22(a)), so it would appear that hydrogen annealing has a strong reducing action. On the other hand, the N1s peak is hardly observed at all, thus only the Cu surface is reduced by hydrogen annealing.

From the above results, it is seen that the surface of the Cu interconnections 46a to 46e is reduced and a nitride film is formed by ammonia plasma treatment. This nitride film prevents reaction between silane contained in the raw material gas and copper when the silicon nitride film is deposited after ammonia plasma treatment, and it evidently has the effect of suppressing the formation of copper silicide. Prevention of silicide formation has the effect of suppressing an increase of the interconnection resistance.

FIGS. 25(a) to 25(f) are graphs showing the results of performing an XPS analysis of a silicon oxide film surface. FIGS. 26(a) to 26(d) and FIGS. 27(a) to (d) are graphs showing the result of performing a mass spectrum (TDS-APIMS) analysis of a silicon oxide film. The analysis of the silicon oxide film was performed for the State up to washing after CMP (profile C), the State where hydrogen plasma treatment was performed after CMP post-washing (profile D), the state where ammonia plasma treatment was performed after CMP post-washing (profile E), and the state where nitrogen plasma treatment was performed after CMP post-washing (profile F). The shift in the high-energy direction of about 1 eV in profile C is due to a charge-up effect.

FIGS. 25(a), 25(b) show observed data for Si2p spectra. FIG. 25(a) shows an analysis at a depth of about 10 nm, and FIG. 25(b) shows an analysis at a depth of about 2 nm. FIGS. 25(c), 25(d), 25(e) show observed data for N1s, O1s, C1s spectra.

In FIG. 25(b), a broad peak is observed (vicinity of 102 eV) at a low energy of hydrogen plasma treatment (profile D). This is probably due to the presence of Si—H bonds, and the formation of Si—H on the silicon oxide film surface due to the hydrogen plasma treatment.

In FIG. 25(a), the peak at 105 eV for ammonia plasma treatment (profile E) and nitrogen plasma treatment (profile F) has become an asymmetrical peak broadened towards the low energy side. The peak in the asymmetrical part (103.5 eV) is probably due to Si—O—N bonds. It may be conjectured that the surface of the silicon oxide film was nitrided by the ammonia plasma treatment and nitrogen plasma treatment. Also, from a comparison of FIG. 25(a) and FIG. 25(b), it appears that nitriding is stronger on the surface. The nitriding due to ammonia plasma treatment and nitrogen plasma treatment can be confirmed also from FIG. 25(c).

In FIG. 25(e), in hydrogen plasma treatment (profile D), almost no carbon is detected. This means that organic substances on the surface are removed by hydrogen plasma treatment. Also, the peak at 289 eV after CMP (profile C) is thought to be due to C—O bonds. It appears that some slurry remains after CMP.

FIG. 25(f) calculates the population ratio of Si peaks and N peaks, and shows an estimated value for the N amount. It would appear that effectively the same amount of nitriding takes place in both ammonia plasma treatment and nitrogen plasma treatment.

FIGS. 26(a), 26(b), 26(c), 26(d) are graphs which respectively show a measure of mass number 41 (Ar—H), mass number 27 (C2H3), mass number 57 (C4H9) and mass number 59 (C3H70) FIGS. 27(a), 27(b), 27(c), 27(d) are graphs which respectively show a measure of mass number 28 (Si, C2H4), mass number 44 (SiO, C3H6), mass number 29 (SiH, C2H5) and mass number 31 (SiH3).

Figure 26A:
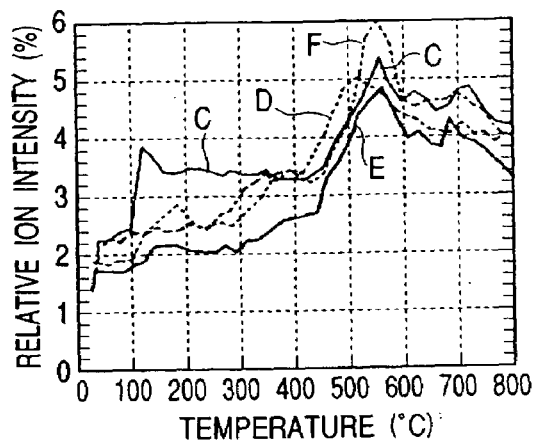
FIGS. 26($a$) to 26($d$) are graphs showing mass analysis results.

In FIG. 26(a), there is almost no difference in the hydrogen desorption amount due to plasma treatment, and the desorption temperature of hydrogen plasma treatment (profile D) is low at 520° C. compared to other cases where it is 560° C.

Figure 26B:
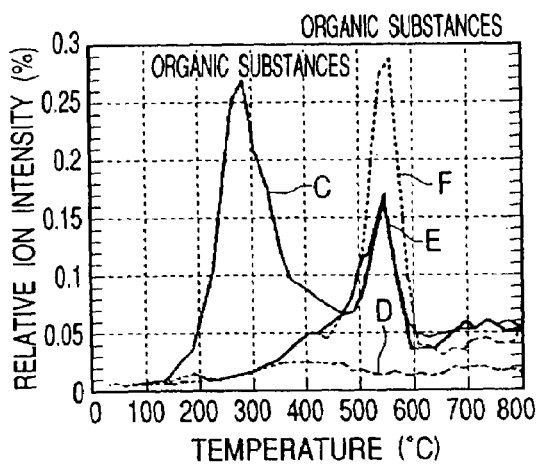
Figure 26C:
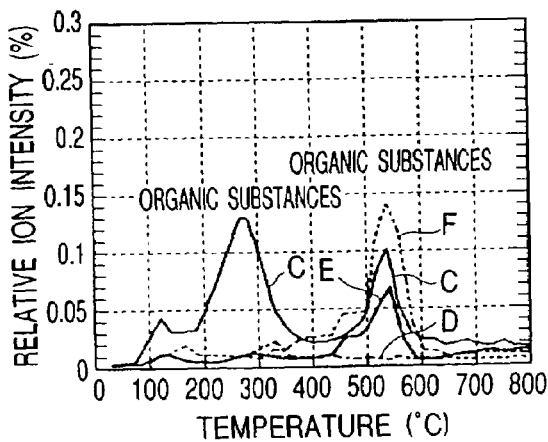
Figure 26D:
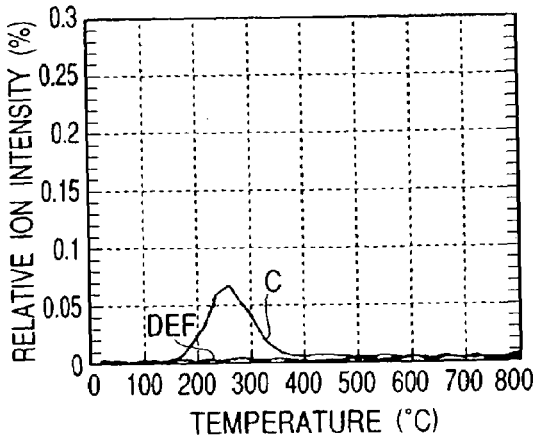
Figure 27A:
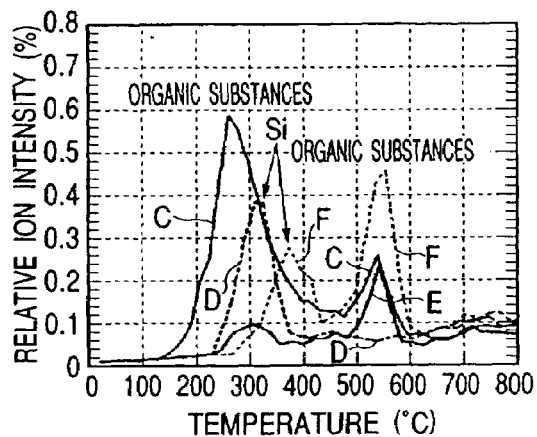
FIGS. 27($a$) to 27($d$) are graphs showing mass analysis results.
Figure 27B:
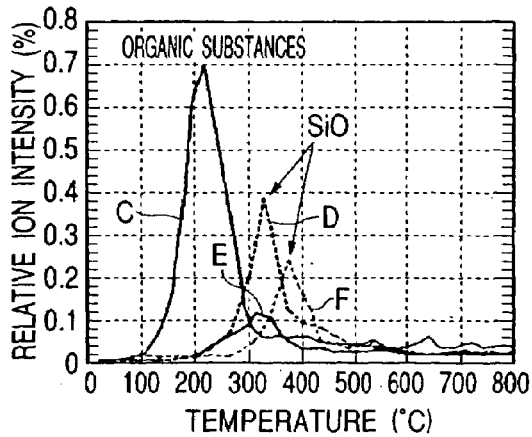
Figure 27C:
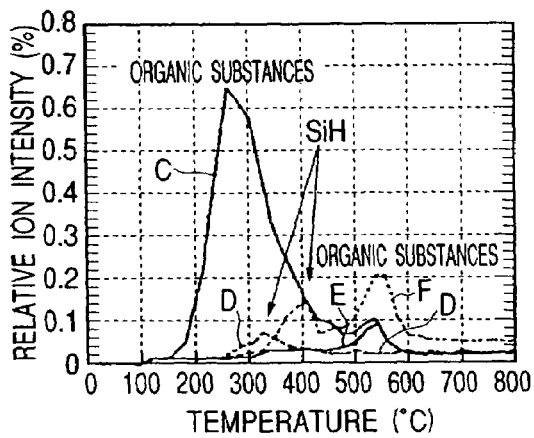
Figure 27D:
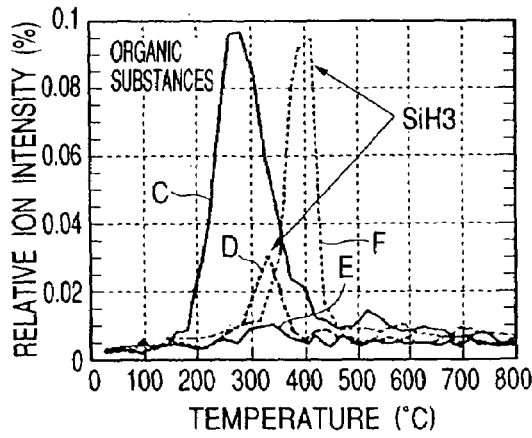

From FIGS. 26(a), 26(b), 26(c), desorption of organic substances can be observed in all processes. However, in FIGS. 27(a)–27(d), peaks other than those due to desorption of organic substances are observed. Specifically, peaks at 300–400° C. are probably due to Si, SiO, SiH and SiH3. Comparing the diagrams, breakup of SiO is observed in hydrogen, ammonia and nitrogen plasma treatments, but breakup of SiH, SiH3 is hardly observed at all in ammonia plasma treatment. This is because Si—O—N bonds are formed by ammonia plasma treatment, and these break up at a relatively low energy. Regarding the energy required for breakup, this energy is highest for nitrogen plasma treatment, and effectively identical for hydrogen plasma treatment and ammonia plasma treatment.

From these results, it appears that Si—OH and Si—O which give rise to dangling bonds on the silicon oxide film surface are terminated by weak Si—O—N bonds due to ammonia plasma treatment. In the process for forming a silicon nitride film after ammonia plasma treatment, Si—O—N which is present only on the surface breaks up, and Si—O bonds in the bulk bonds firmly to Si—N in the silicon nitride film to form a continuous interface. This appears to be the mechanism whereby the adhesion properties of the interface are improved. On the other hand, if ammonia plasma treatment is not performed, the surface of the silicon oxide film which originally comprises a large number of Si—OH bonds undergoes a condensation reaction with ammonia which is the raw material gas of the silicon nitride film, and a large number of Si—O bonds leading to dangling bonds appear to be formed. If large numbers of such dangling bonds are present at the interface between the silicon oxide film and the silicon nitride film, they will form a leakage path, giving rise to a leakage current between the interconnections and causing insulation breakdown.

From the above analysis, the surfaces of oxidized Cu interconnections are reduced by ammonia plasma treatment and converted to elemental Cu. This produces an electrical state which is more stable than that of ionized copper; and, since a continuous, strong film is formed at the silicon oxide film/silicon nitride film interface, the leakage current decreases, and TDDB life is largely improved.

The Inventors took TEM photographs of the interface between the interconnection layer and silicon nitride film (cap film) when ammonia plasma treatment was performed and when it was not. As a result, in the case of this embodiment where ammonia plasma treatment was performed, a thin coating was found to be present at the interface. This film and coating evidently comprise the aforesaid silicon nitride layer. On the other hand, when ammonia plasma treatment was not performed, this coating was not observed.

Figure 28:
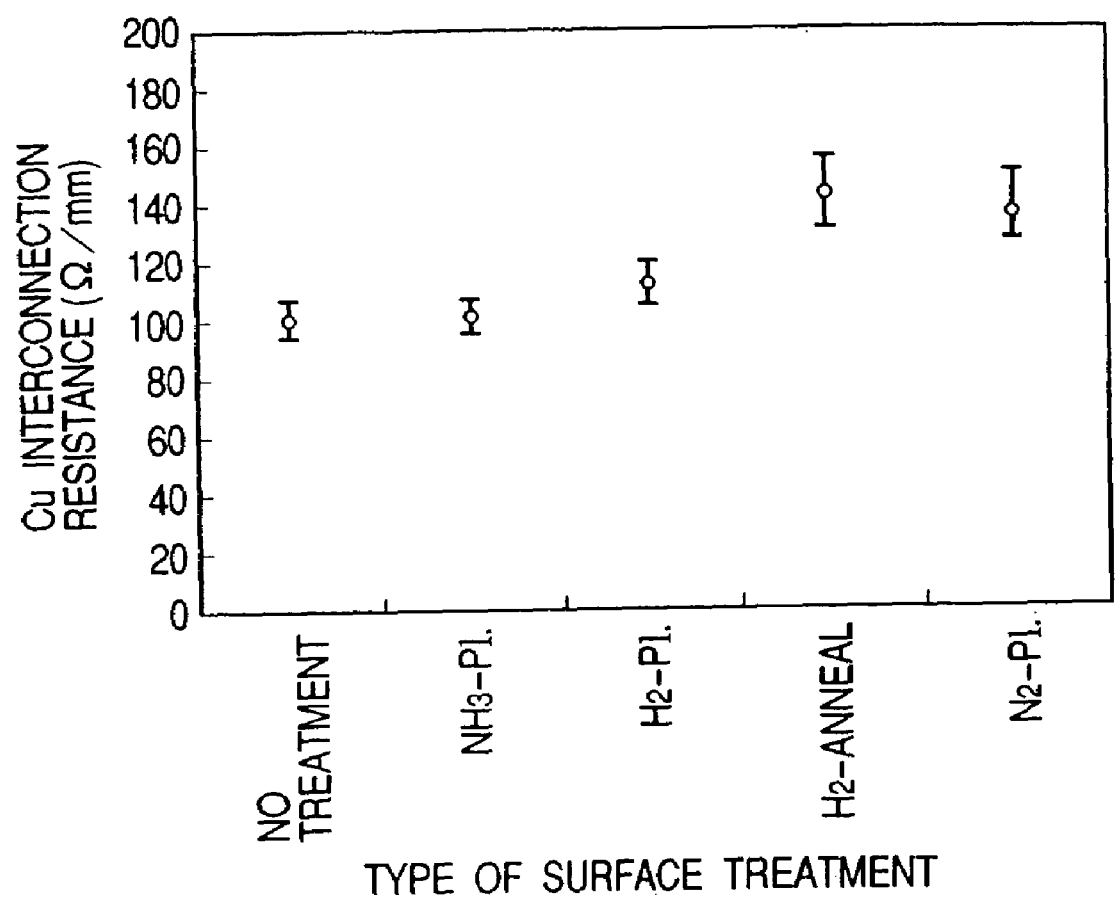
FIG. 28 is a graph showing interconnection resistance.
Figure 29:
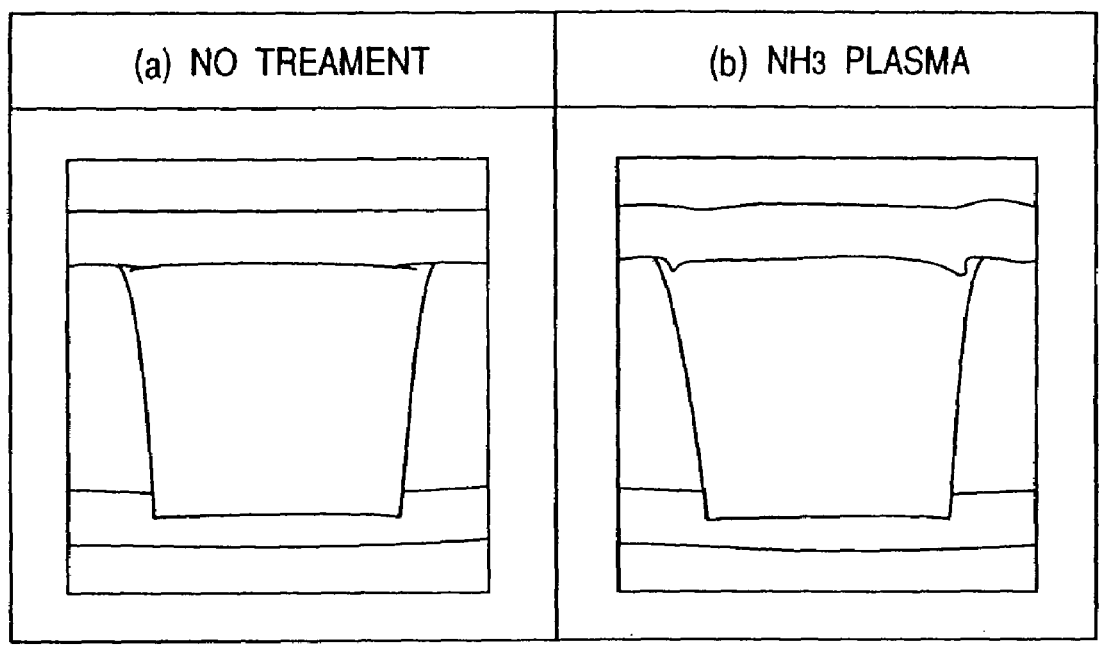
FIG. 29 is a chart showing sectional diagram which trace in part (a) a TEM photograph showing an interconnection part in the case of no treatment, and which trace in part (b) a TEM photograph showing the interconnection part of Embodiment 1.

Further, according to this embodiment, the resistance of the Cu interconnection can be decreased. FIG. 28 shows the measurement results of interconnection resistance when various types of treatment were performed. In the case of no treatment (no plasma treatment) or when ammonia plasma treatment was performed, a significantly lower value was found compared to other cases (hydrogen plasma treatment, hydrogen annealing, nitrogen plasma treatment). FIG. 29 and FIG. 30 show trace outlines of TEM photographs of the interface between the Cu interconnection and the cap film (silicon nitride film) when these treatments were carried out.

When no treatment is performed or in the case of ammonia plasma treatment (FIG. 29), no special features are observed in the interface, but in the case of hydrogen annealing and nitrogen plasma treatment (FIG. 30), a copper silicide (CuSi) layer is formed at the interface. It is probable that this silicide layer leads to an increase of the resistance. This silicide layer is formed by reaction with silane gas when the silicon nitride film is formed, but when ammonia plasma treatment is carried out, a very thin nitride film is formed over the Cu surface, and this nitride film probably acts as a blocking layer which prevents silicide formation. On the other hand, when the upper surface is merely reduced as in the case of hydrogen annealing, an active Cu surface is exposed which promotes reaction with silicon, and this would easily lead to the formation of a silicide layer. In the case of hydrogen plasma treatment (FIG. 30 at part (c)), no product at all is observed at the interface. However, in many cases such products would not be formed, and in the case of hydrogen plasma treatment, the amount of silicide formation is probably small.

From the above analysis results, the Inventors arrived for the first time at the following model which appears to represent the mechanism behind the deterioration of TDDB life. FIG. 31(a) shows a schematic view of the mechanism of TDDB deterioration, and FIG. 31(b) shows the energy band involved. Specifically, when the ammonia plasma treatment of this embodiment is not performed, copper oxide (CuO) is formed on the surface of the Cu interconnection which influences subsequent surface processes, and copper silicide (a copper compound) is formed when the cap film (silicon nitride film 47) is formed. This copper oxide or copper silicide is more easily ionized than pure copper, and the ionized copper drifts due to the field between interconnections so as to diffuse into the insulating film between interconnections.

Further, when the ammonia plasma treatment of this embodiment is not performed, a large amount of CMP damage, organic substances or dangling bonds occur at the interface between the insulating film (silicon oxide film 39) formed by the embedding of the copper interconnections, and the cap film (silicon nitride film 47), so the interface is discontinuous and has poor adhesion properties. These dangling bonds also assist the diffusion of copper ions, so copper ions drift and diffuse along the interface. In other words, a leakage path is formed in the interface between interconnections. The leakage current flowing in the leak path, together with the long-term leakage effect and thermal stress due to the current, lead to a rapid increase in the magnitude of the current and causes insulation breakdown (reduction of TDDB life).

FIGS. 32(*a*), 32(*b*) show a schematic view of the mechanism for improving TDDB life and the energy bands involved when the aforesaid ammonia plasma treatment is performed. In this embodiment, as ammonia plasma treatment is applied to the surface of the Cu interconnections 46*a* to 46*e*, the oxide layer on the surface of the Cu interconnections 46*a* to 46*e* is reduced and removed, and a thin nitride film is formed over the surface of the Cu interconnections 46*a* to 46*e*. Hence, copper silicide is not formed when the silicon nitride film 47 is formed. As a result, the substances which mainly supply the copper ions leading to leakage and insulation breakdown are eliminated. In this embodiment, as the ammonia plasma treatment is applied to the surface of the silicon oxide film 39, the connection with the silicon nitride film 47 becomes continuous, the density of dangling bonds is reduced and leakage path formation is suppressed. The surface of the silicon oxide film 39 can also be kept clean. Therefore, in this embodiment, the generation of copper ions which lead to a reduction of TDDB life is suppressed, and a joining interface is formed between the silicon oxide film 39 and silicon nitride film 47 which can suppress diffusion of copper. In this way, TDDB life can be enhanced.

From the aforesaid analysis, it would appear that TDDB life can probably be improved even by hydrogen plasma treatment. Specifically, due to hydrogen plasma treatment, the Cu surface is reduced, and dangling bonds, such as Si—O or Si—OH, which are their precursors, are terminated by Si—H. Thus, when the silicon nitride film is formed, Si—H, which is a weak bond on the surface, breaks up and is replaced by Si—N. In this way, a continuous interface is formed between the silicon oxide film and silicon nitride film, although the interconnection resistance increases as noted above.

Figure 33:
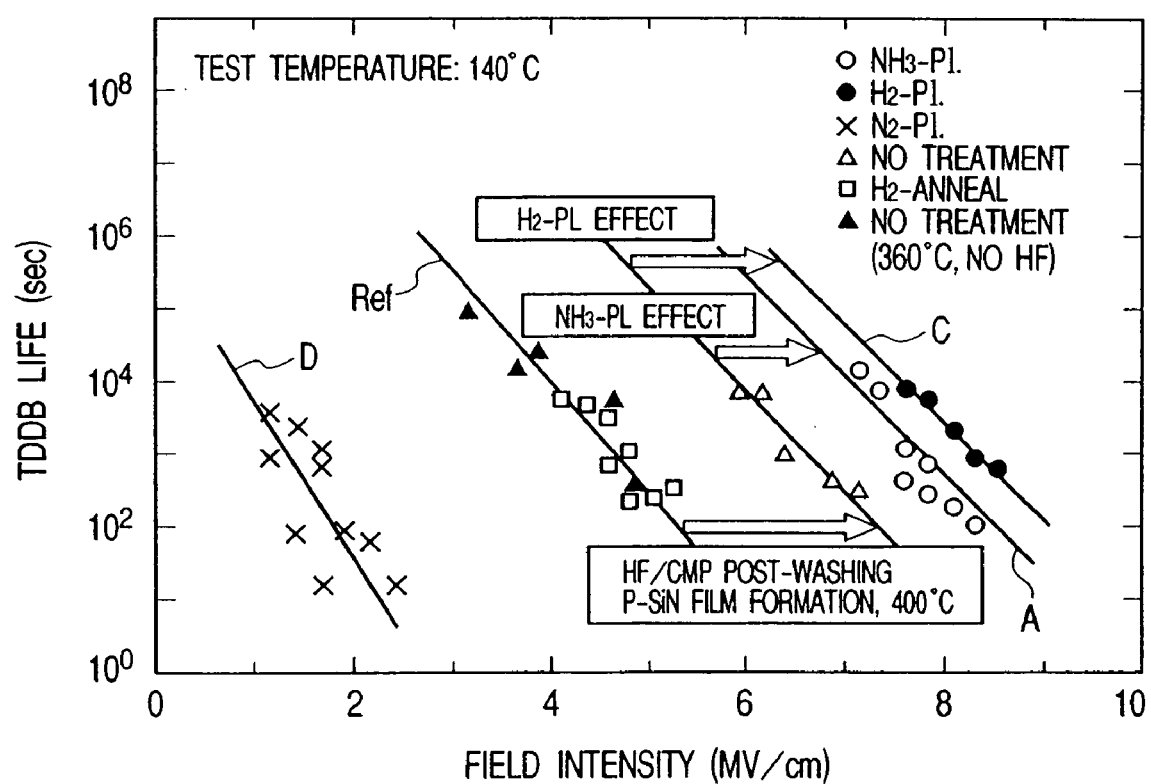
FIG. 33 is a graph showing TDDB life.

FIG. 33 is a graph showing TDDB life data when hydrogen plasma treatment is performed. For reference purposes, the line Ref (no treatment) and the line A (ammonia plasma treatment) are also shown. It is seen that in hydrogen plasma treatment (line C), TDDB life is vastly improved. In the case of hydrogen plasma treatment, it might be expected that there would be less plasma damage, and this might be expected to be extremely useful when another material can be used as the cap film instead of the silicon nitride film which does not give reaction products with Cu. In nitrogen plasma treatment (line D), TDDB life declines on the other hand. As can be seen also from FIGS. 26(*a*) to 26(*d*) and FIGS. 27(*a*) to 27(*d*), this is probably due to increased adhesion of organic substances caused by the nitrogen plasma treatment.

In this embodiment, adhesion properties between the Cu interconnections 46*a*–46, silicon oxide film 39 and cap film 47 are improved, so the peeling strength at the interface increases, and the margin becomes larger.

The invention is not limited to single gases, such as ammonia and hydrogen, and treatment may be performed using mixed gas plasmas with inert gases, such as nitrogen, argon and helium. More specifically, gas mixtures of ammonia with hydrogen, nitrogen, argon or helium, or gas mixtures of hydrogen with ammonia, nitrogen, argon or helium may be used. Further, gas mixtures of multi-element systems may also be used comprising three or four elements selected from these gases. In this case, the amount of hydrogen or ammonia, or the sum of hydrogen and ammonia, must be at least 5% relative to the total flow rate (mass flow rate).

[Embodiment 2]

A method of fabricating a CMOS-LSI according to a second embodiment of this invention will now be described with reference to a process sequence shown FIG. 34 to FIG. 43.

The initial steps of the method of fabrication according to this second embodiment are identical to the steps shown in FIG. 1 to FIG. 8 of Embodiment 1. In other words, the steps of the method are the same up to the Cu film deposition step. For this reason, only the processes following the CMP step will be described in detail.

Figure 34:
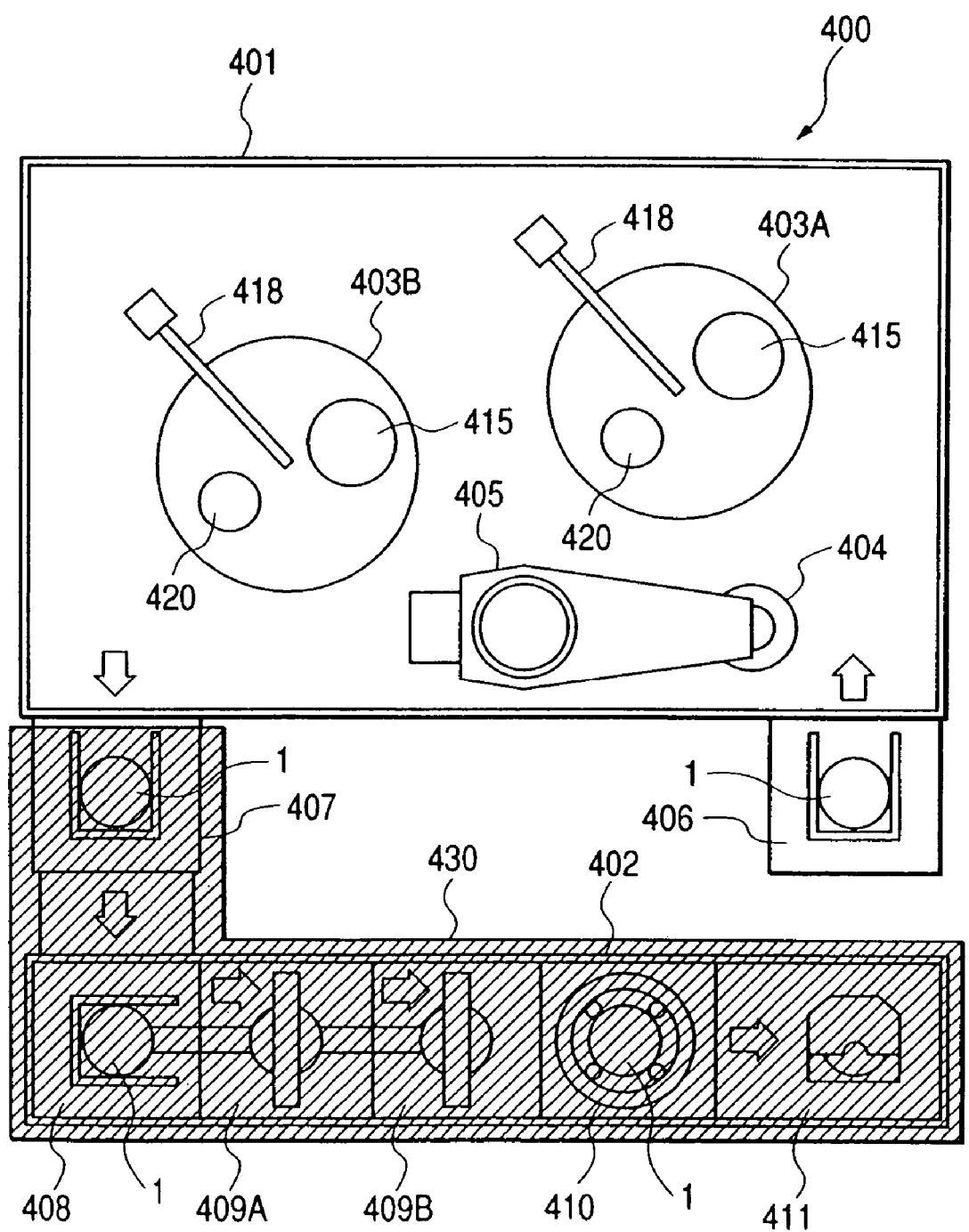
FIG. 34 is a schematic diagram showing an example of the overall construction of a CMP apparatus used in a method of fabricating a semiconductor integrated circuit device according to Embodiment 2 of this invention.

FIG. 34 is a schematic view showing the overall construction of a CMP apparatus using an embedded Cu interconnection. As shown in the figure, the CMP apparatus 400 comprises a polishing treatment part 401 and a post-washing part 402 provided in a later stage. Two platens (first platen 403A, second platen 403B) which perform polishing treatment of the wafer (substrate) 1, a clean station 404 which performs preliminary washing of the substrate 1 when the polishing step is completed and gives anticorrosion treatment to the surface, and a rotating arm 405 which displaces the substrate 1 between the loader 406, first platen 403A, second platen 403B, clean station 404 and unloader 407, are provided in the polishing treatment part 401.

In the later stage of the polishing treatment part 401, the post-washing part 402 is provided which scrub-washes the surface of the substrate 1 for which preliminary washing has been completed. In the post-washing part 402, a loader 408, first washing part 409A, second washing part 409B, spin drier 410 and unloader 411 are provided. Further, to prevent the surface of the substrate 1 from being irradiated by light while it is being washed, the whole of the post-washing part 402 is enclosed by a shielding wall 430 so that the interior is maintained in the dark at 180 Lux, or preferably 100 Lux or less. This is because, when light irradiates a surface of the substrate 1 on which a polishing solution has adhered in the wet state, a short-circuit current flows in the pn junction due to the photo-induced current in the silicon, and Cu ions dissociate from the surface of the Cu interconnection connected to the p side (+side) of the pn junction, which causes interconnection corrosion.

Figure 35:
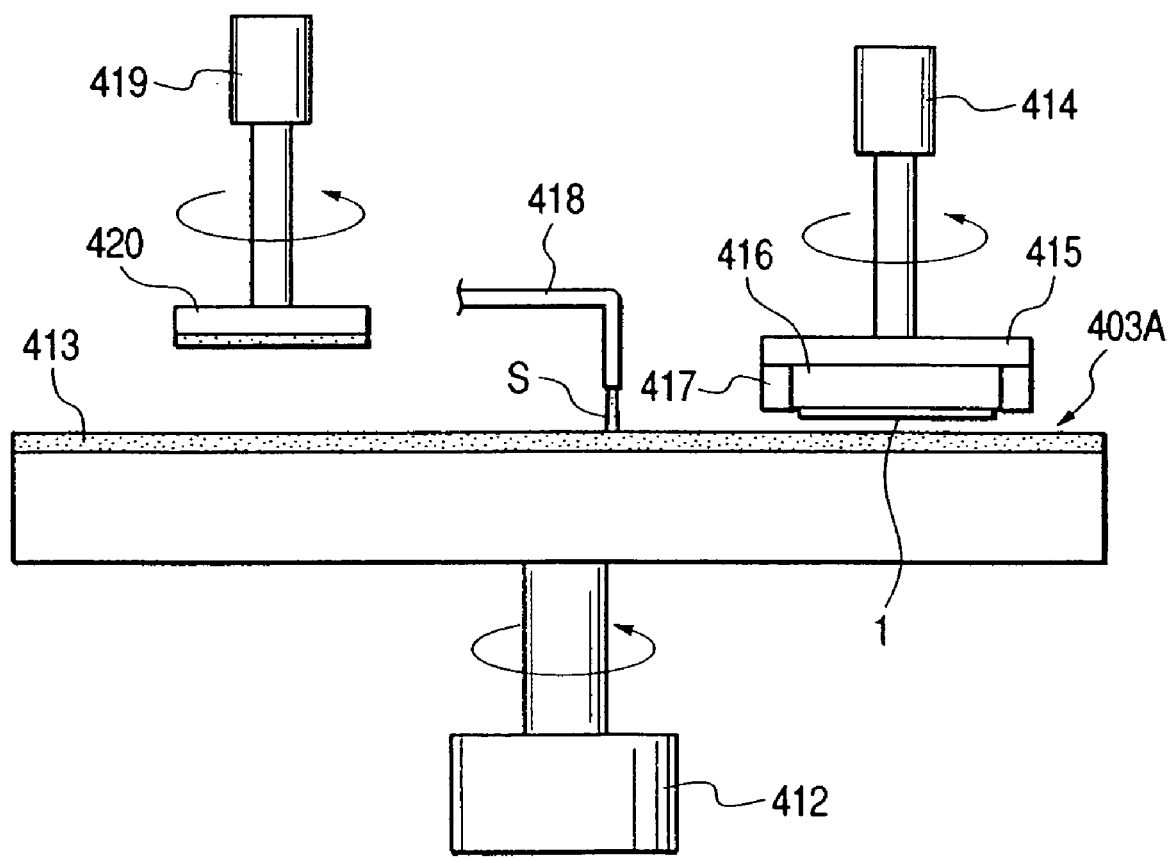
FIG. 35 is a side view showing part of a CMP apparatus used for forming an embedded Cu interconnection.

As shown in FIG. 35, the first platen 403A is rotated in a horizontal plane by a drive mechanism 412 provided underneath it. A polishing pad 413 formed by attaching a synthetic resin, such as polyurethane, having plural air holes is evenly attached to the upper surface of the first platen 403A. A wafer carrier 415, which performs an up/down motion and is rotated in a horizontal plane by a drive mechanism 414, is disposed above the first platen 403A. The substrate 1 is held, so that its main face (surface to be polished) is facing downwards, by a wafer chuck 416 and retainer ring 417 provided at the lower end of the wafer carrier 415, and it is pushed against the polishing pad 413 under a predetermined load. A slurry (polishing fluid) S is supplied via a feed pipe 418 between the surface of the polishing pad 413 and the surface to be polished of the substrate 1, and the surface to be polished of the substrate 1 is chemically and mechanically polished therewith. A dresser 420, which performs an up/down motion and is rotated in a horizontal plane by a drive mechanism 419, is disposed above the first platen 403A. A base material on which diamond particles are deposited is attached at the lower end of the dresser 420, the surface of the polishing pad 413 being periodically machined by this base material to prevent blocking due to abrasive polishing particles. The second platen 403B has an effectively identical construction to the first platen 403A except that two slurry feed pipes 0.418A, 418B are provided.

Figure 36:
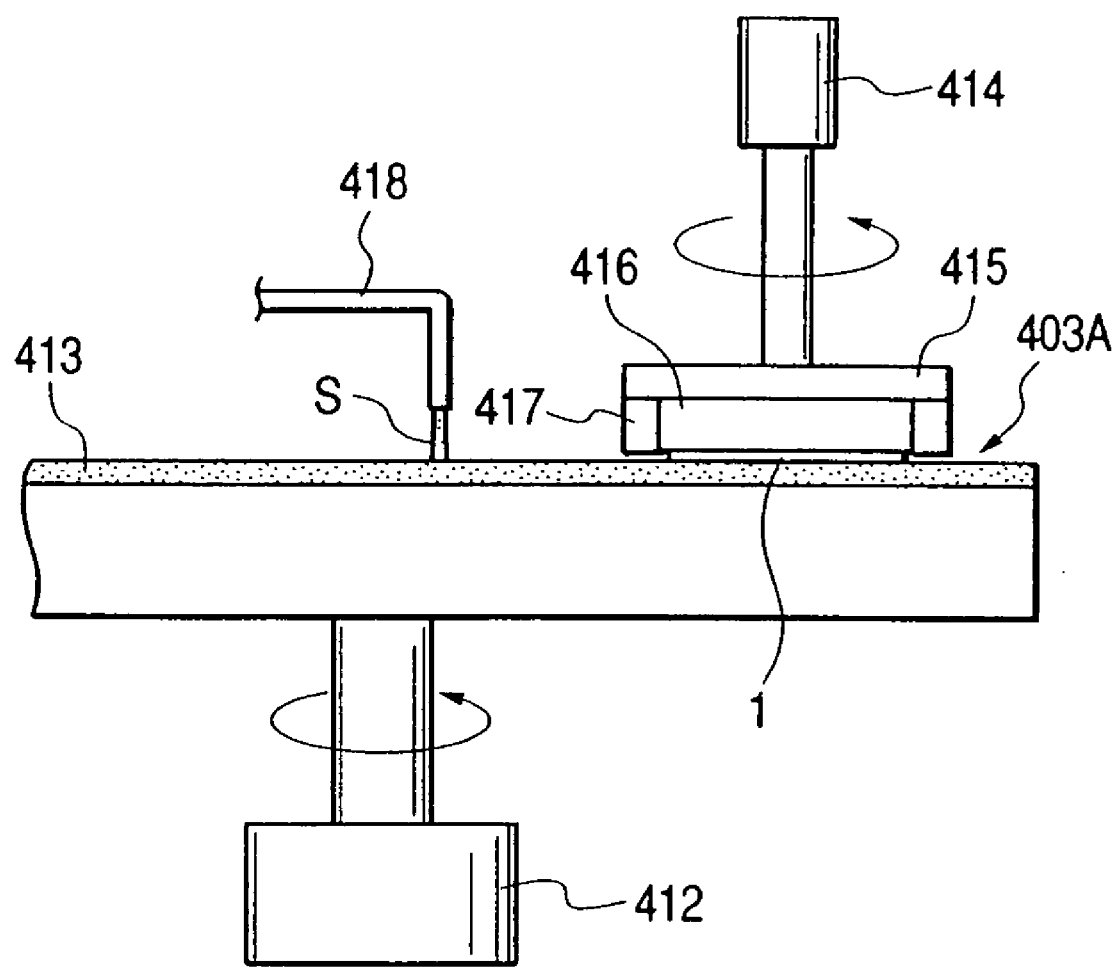
FIG. 36 is a side view of a CMP apparatus showing the polishing state of a Cu film.
Figure 37:
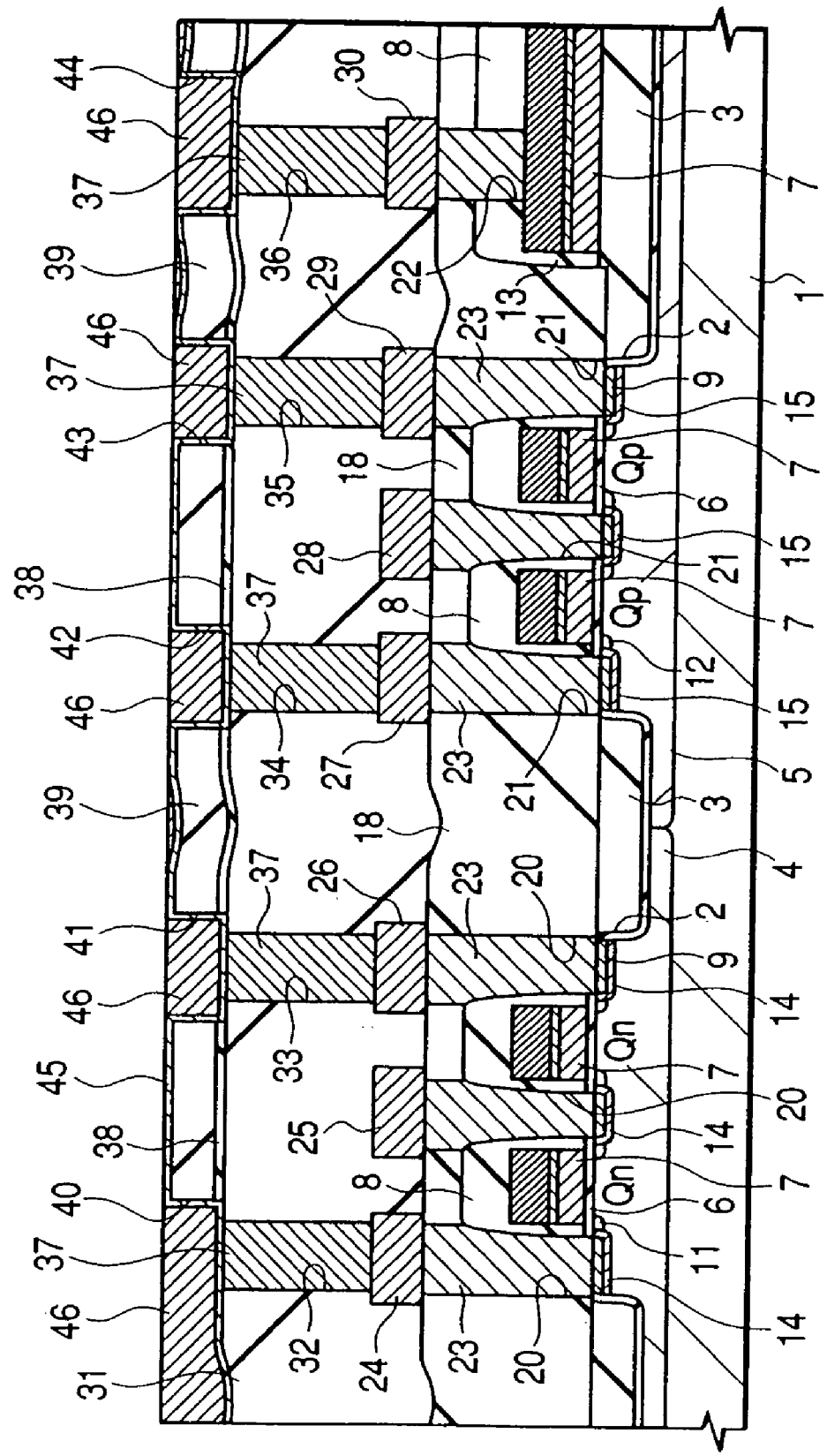
FIG. 37 is a sectional view of the essential parts of a semiconductor substrate showing a step in the method of fabricating the semiconductor integrated circuit device of Embodiment 2.

To form the Cu interconnection using the CMP apparatus 400, the substrate 1 housed in the loader 406 is transported to the polishing treatment part 401 by the rotating arm 405; and, as shown in FIG. 36, above the first platen 403A, chemical mechanical polishing (abrasive particle-free chemical mechanical polishing) (first step CMP) is performed using a slurry not containing abrasive particles to remove the Cu film 46 outside the interconnection slots 40 to 44 (FIG. 37).

Here, abrasive particle-free chemical mechanical polishing refers to chemical mechanical polishing using a polishing fluid (slurry) wherein the content of abrasive particles including alumina and silica does not exceed 0.5 wt %. In the polishing fluid, it is preferred that the content of abrasive particles does not exceed 0.1 wt %, and more preferable that it does not exceed 0.05 wt % or 0.01 wt %.

A polishing fluid is used having a pH which is adjusted so as to be within the Cu corrosion region, and the composition is adjusted so that the polishing selectivity ratio of the Cu film 46 relative to the TiN film 45 (barrier layer) is not less than 5. An example of such a polishing fluid is a slurry containing an oxidizing agent and an organic acid. The oxidizing agent may be hydrogen peroxide, aluminum hydroxide, ammonium nitrate or ammonium chloride, and the organic acid may be citric acid, malonic acid, fumaric acid, malic acid, adipic acid, benzoic acid, phthalic acid, tartaric acid, lactic acid or succinic acid. Of these, hydrogen peroxide does not contain any metal component and is not a strong acid, so it is suitable as an oxidizing agent for use in the polishing fluid. Citric acid is generally used as a food additive, has a low toxicity, does not give rise to much environmental pollution, has no odor and has high solubility in water, so it is suitable as an organic acid for use in the polishing fluid. In this embodiment, a polishing fluid is used wherein, for example, 5 vol % of hydrogen peroxide and 0.03 wt % of citric acid are added to pure water, and the abrasive particle content is arranged to be less than 0.01 wt %.

When chemical mechanical polishing is performed with fluid, the Cu surface is first the aforesaid polishing oxidized by the oxidizing agent, and a thin oxide layer is formed on the surface. Next, a substance is supplied which renders the oxidizing agent water-soluble, the oxide layer becomes water-soluble and dissolves, and the thickness of the oxide layer decreases. The part where the oxide layer became thin is again exposed to the oxidizing substance so that the thickness of the oxide layer increases, and this reaction is repeated as chemical mechanical polishing proceeds. This type of chemical mechanical polishing using an abrasive particle-free polishing fluid is described in detail in Japanese Unexamined Patent Publication No. Hei 9(1997)-299937 and Japanese Unexamined Patent Publication No. Hei 10(1998)-317233 submitted by the Applicant et al.

The polishing conditions are, for example, load=250 g/cm$^2$, wafer carrier rotation speed=30 rpm, platen rotation speed=25 rpm, slurry flow rate=150 cc/min, and the polishing pad is a hard pad (IC1400) from Rodel Co. in the U.S. The endpoint of polishing is taken as the point when the Cu film 46 is removed and the underlying TiN film 45 is exposed. This endpoint is detected by detecting a rotation torque signal intensity of the platen or wafer carrier which varies when the polishing target changes from the Cu film 46 to the TiN film 45. Alternatively, the endpoint may be detected by opening a hole in part of the polishing pad and detecting the spectral variation of reflected light from the wafer surface, or by detecting the optical spectral variation of the slurry.

Figure 38A:
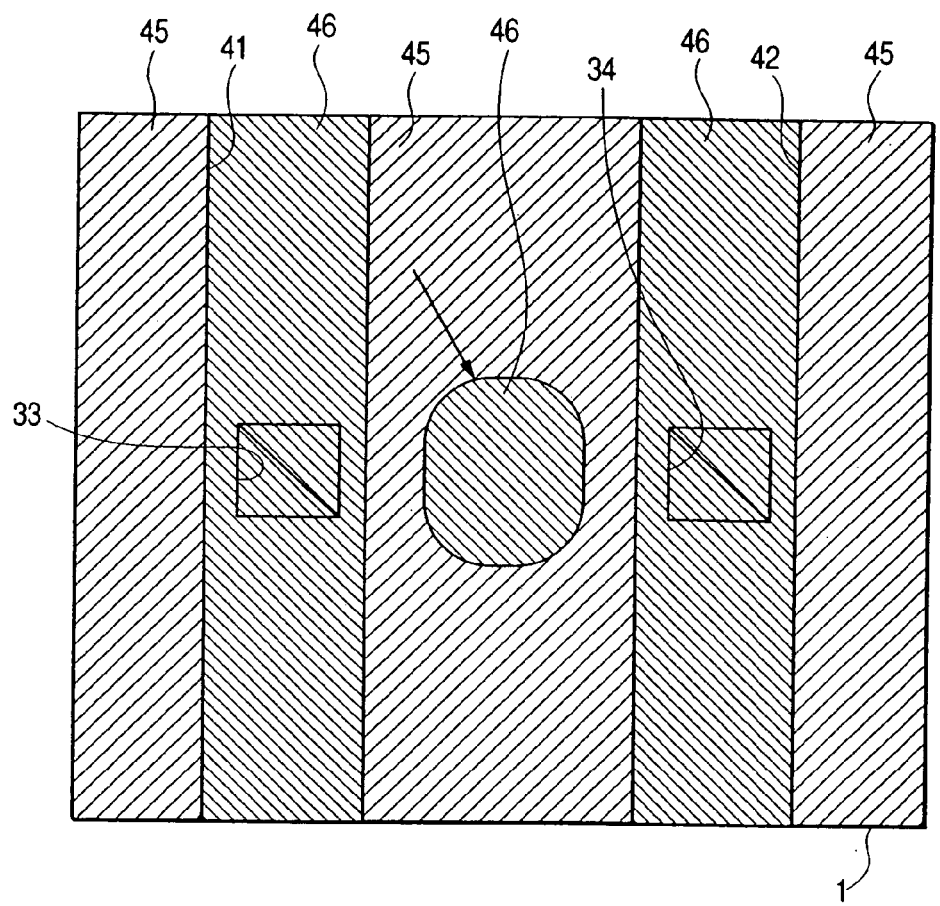
FIG. 38(a) is a plan view of the essential parts of a semiconductor substrate showing a step in the method of fabricating the semiconductor integrated circuit device of Embodiment 2.
Figure 38B:
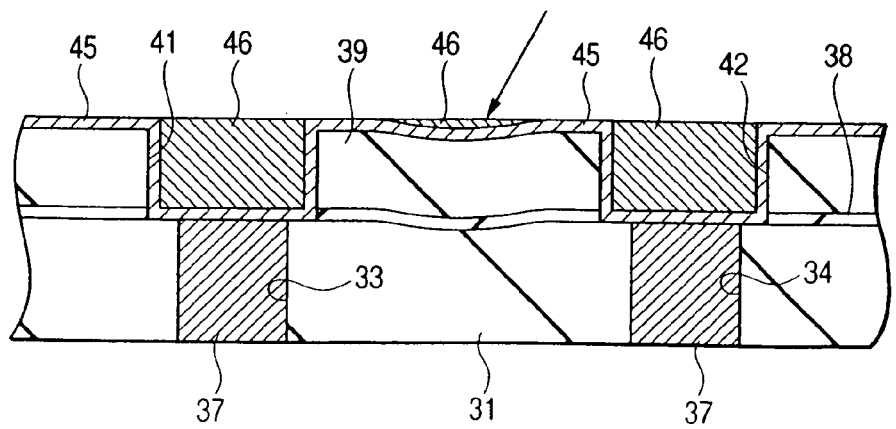
FIG. 38(b) is a sectional view of the essential parts thereof.

As shown in FIG. 37, by performing the above abrasive particle-free chemical mechanical polishing, the Cu film 46 outside the interconnection slots 40 to 44 is almost entirely removed to expose the underlying layer of the TiN film 45, but as shown in the enlargements of FIGS. 38(a), 38(b), some of the Cu film 46 which could not be removed by this polishing may remain in depressions (shown by the arrow) in the TiN film 45 due to steps in the underlying layer.

Next, to remove the TiN film 45 outside the interconnection slots 40 to 44 and the Cu film 46 remaining in some places on its upper surface, the substrate 1 is moved from the first platen 403A to the second platen 403B shown in FIG. 34 to FIG. 36, and chemical mechanical polishing (abrasive particle chemical mechanical polishing) using a polishing fluid (slurry) containing abrasive particles (CMP of second step) is performed. Here, the abrasive particle chemical mechanical polishing refers to chemical mechanical polishing using a polishing fluid wherein the content of abrasive particles including alumina or silica exceeds 0.5 wt %. In this embodiment, the polishing fluid is a mixture of 5 vol % of hydrogen peroxide, 0.03 wt % of citric acid and 0.5 wt % of abrasive particles with pure water, but this is not exhaustive. The polishing fluid is supplied to the polishing pad 413 of the second platen 403B via the slurry feed pipe 418A.

In this abrasive particle chemical mechanical polishing, after the Cu film 46 which remains in some places on the upper surface of the TiN film 45 is removed, the TiN film 45 outside the interconnection slots 40 to 44 is removed. In this process, polishing is performed under conditions wherein the polishing selectivity ratio of the Cu film 46 relative to the TiN film 45 (barrier layer) is lower than that of the abrasive particle-free chemical mechanical polishing, e.g., under conditions where the selectivity ratio does not exceed 3, so as to suppress polishing of the surface of the Cu film 46 inside the interconnection slots 40 to 44.

The polishing conditions are, for example, load=120 g/cm$^2$ wafer carrier rotation speed=30 rpm, platen rotation speed=25 rpm, slurry flow rate=150 cc/min, and the polishing pad is IC1400 from Rodel Co. The polishing amount is equivalent to the film layer thickness of the TiN film 45, and the endpoint of polishing is controlled by the time computed from the film thickness and polishing speed of the TiN film 45.

Figure 39:
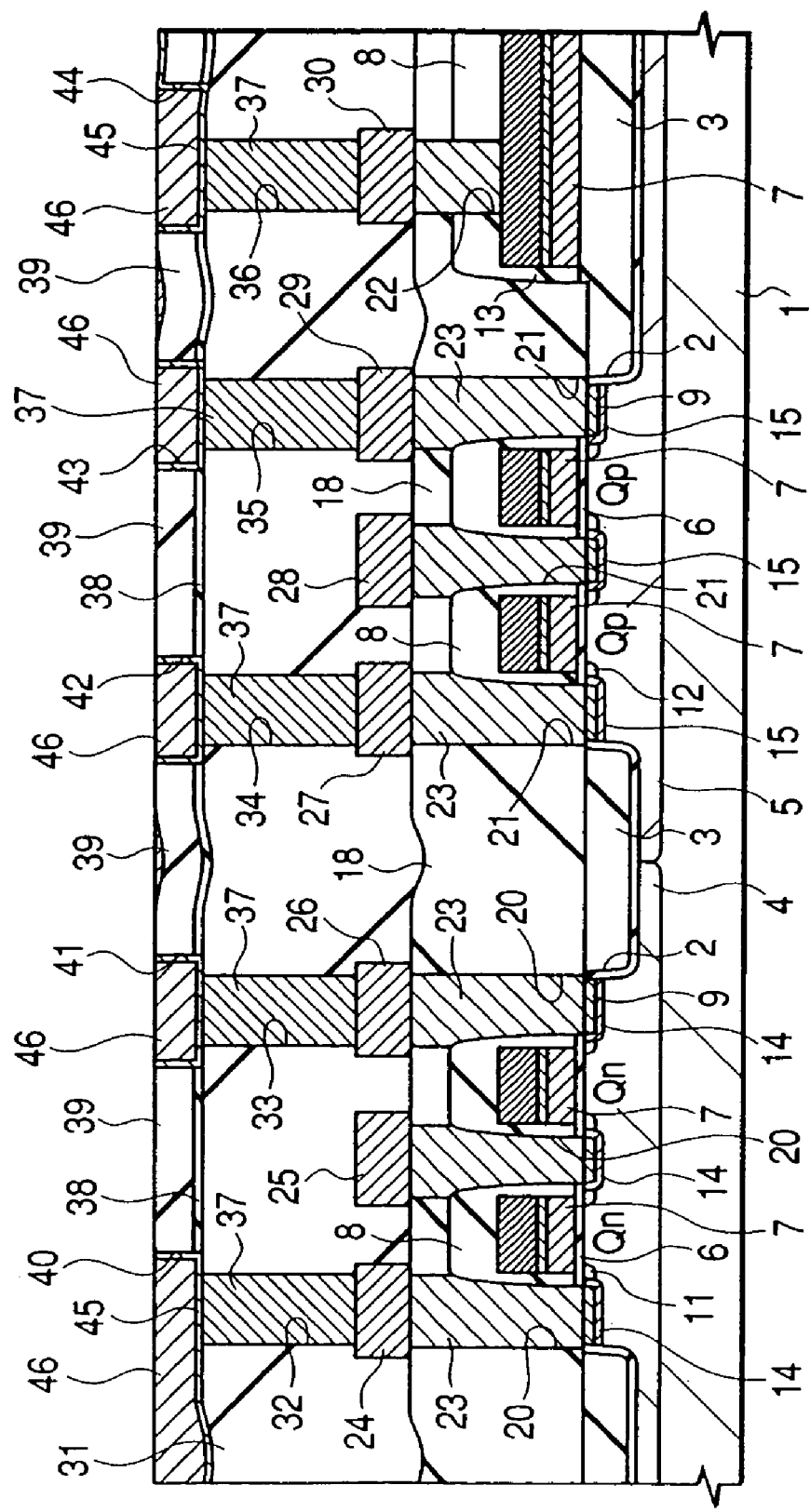
FIG. 39 is a sectional view of the essential parts of a semiconductor substrate showing a step in the method of fabricating the semiconductor integrated circuit device of Embodiment 2.
Figure 40A:
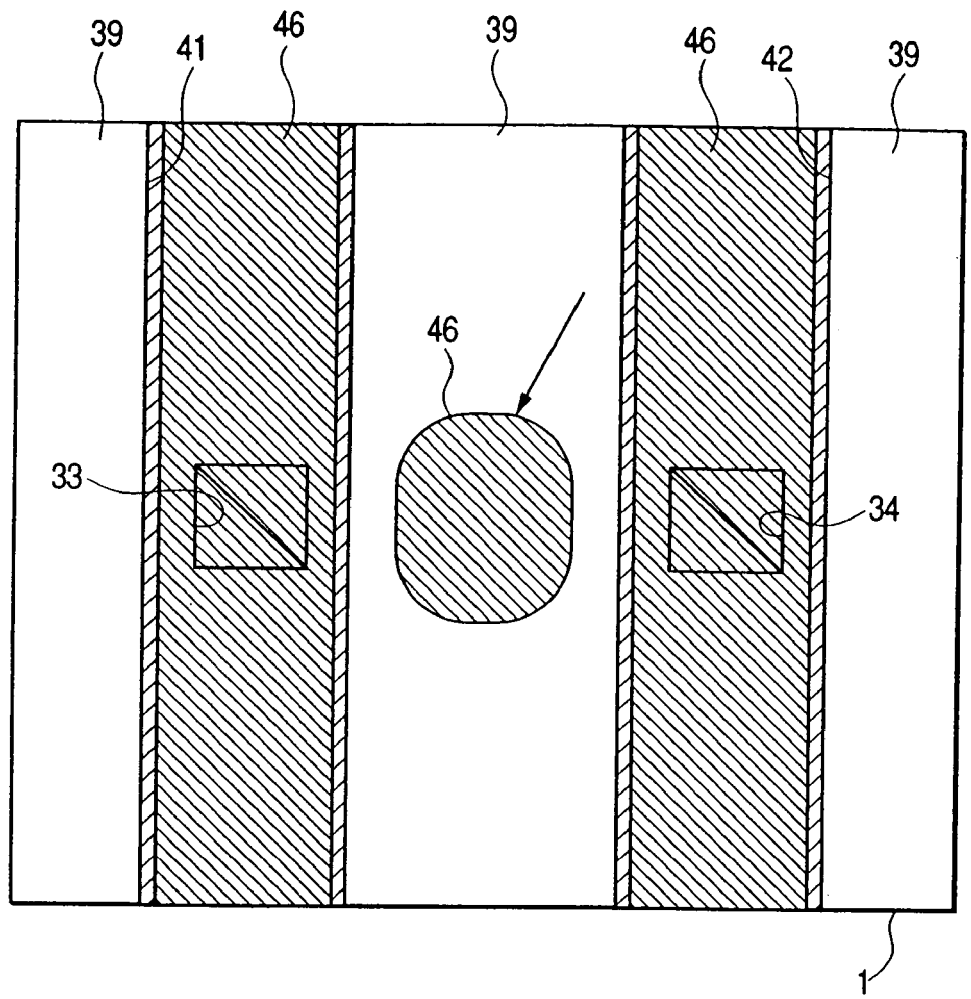
FIG. 40(a) is a plan view of the essential parts of a semiconductor substrate showing a step in the method of fabricating the semiconductor integrated circuit device of Embodiment 2.
Figure 40B:
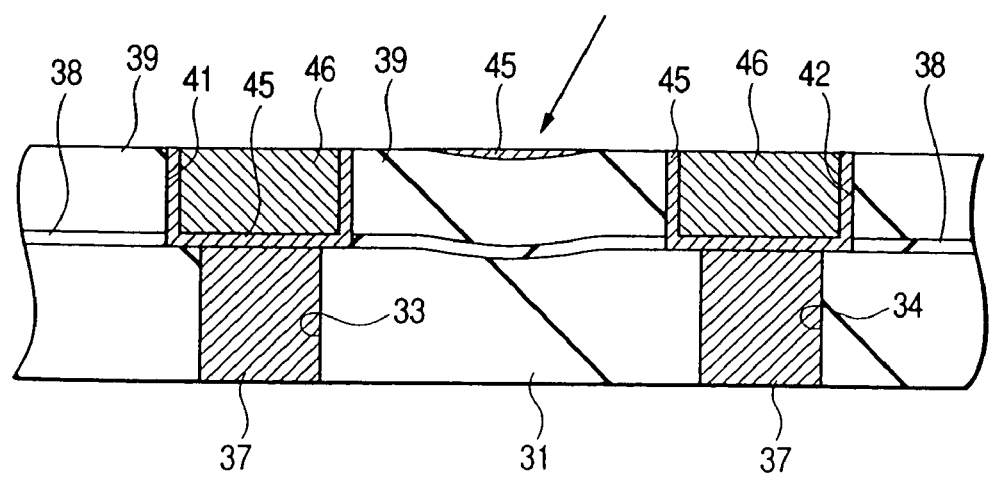
FIG. 40(b) is a sectional view of the essential parts thereof.

As shown in FIG. 39, almost all of the TiN film 45 outside the interconnection slots 40 to 44 is removed by performing the above abrasive particle chemical mechanical polishing to expose the underlying layer of silicon oxide film 39, but as shown in the enlargements of FIGS. 40(a), 40(b), some of the TiN film 45 which could not be removed by the above polishing remains in depressions (shown by the arrow) of the silicon oxide film 39 due to steps in the layer underneath.

Next, while suppressing the polishing of the Cu film 46 inside the interconnection slots 40 to 44 as much as possible, selective chemical mechanical polishing (CMP of third step) is performed to remove the TiN film 45 (barrier layer)

remaining in some parts on the silicon oxide film 39 outside the interconnection slots 40 to 44. This selective chemical mechanical polishing is performed under conditions where the polishing selectivity ratio of the TiN film 45 relative to the Cu film 46 is at least 5 or more. Further, this chemical mechanical polishing is performed under conditions wherein the ratio of the polishing speed of the silicon oxide film 39 relative to the polishing speed of the Cu film 46 is larger than 1.

To perform the above selective chemical mechanical polishing, an anticorrosion agent is added to the polishing fluid comprising an abrasive particle content higher than 0.5 wt % such as is generally used in the aforesaid abrasive particle chemical mechanical polishing. The anticorrosion agent is a chemical which prevents or suppresses the progress of polishing by forming an anticorrosive protection film on the surface of the Cu film 46. Benzotriazole (BTA), benzotriazole derivatives, such as BTA carboxylic acid, dodecyl mercaptan, triazole or tolyl triazole, are used, and a particularly stable protection film is formed when BTA is used.

When BTA is used as the anticorrosion agent, its concentration depends on the type of slurry, but generally, a sufficient effect is obtained by adding 0.001–1 wt %, preferably 0.01–1 wt %, and more preferably 0.1–1 wt % (three stages). In this embodiment, 0.1 wt % of BTA as the anticorrosion agent was mixed with the polishing fluid used in the abrasive particle chemical mechanical polishing of the second step, but this is not exhaustive. Also, to avoid a decrease on the polishing speed due to addition of the anticorrosion agent, polyacrylic acid, polymethacrylic acid, their ammonium salts or ethylenediamine tetraacetic acid (EDTA) can be added if necessary. Chemical mechanical polishing using a slurry containing such an anticorrosion agent is described in detail in Japanese Unexamined Patent Publication No. Hei 10(1998)-209857, Japanese Unexamined Patent Publication No. Hei 9(1997)-299937 and Japanese Unexamined Patent Publication No. Hei 10(1998)-317233 submitted by the Applicant et al.

After the abrasive particle chemical mechanical polishing (CMP of the second step) is completed, this selective chemical mechanical polishing (CMP of the third step) is then performed on the second platen 403B of the CMP apparatus shown in FIG. 34–FIG. 36. The polishing fluid to which the anticorrosion agent is added, is supplied to the surface of the polishing pad 413 via the aforesaid slurry feed pipe 418b. The polishing conditions are, for example, load=120 g/cm$^2$, wafer carrier rotation speed=30 rpm, platen rotation speed=25 rpm, and slurry flow rate 190 cc/min.

Figure 41:
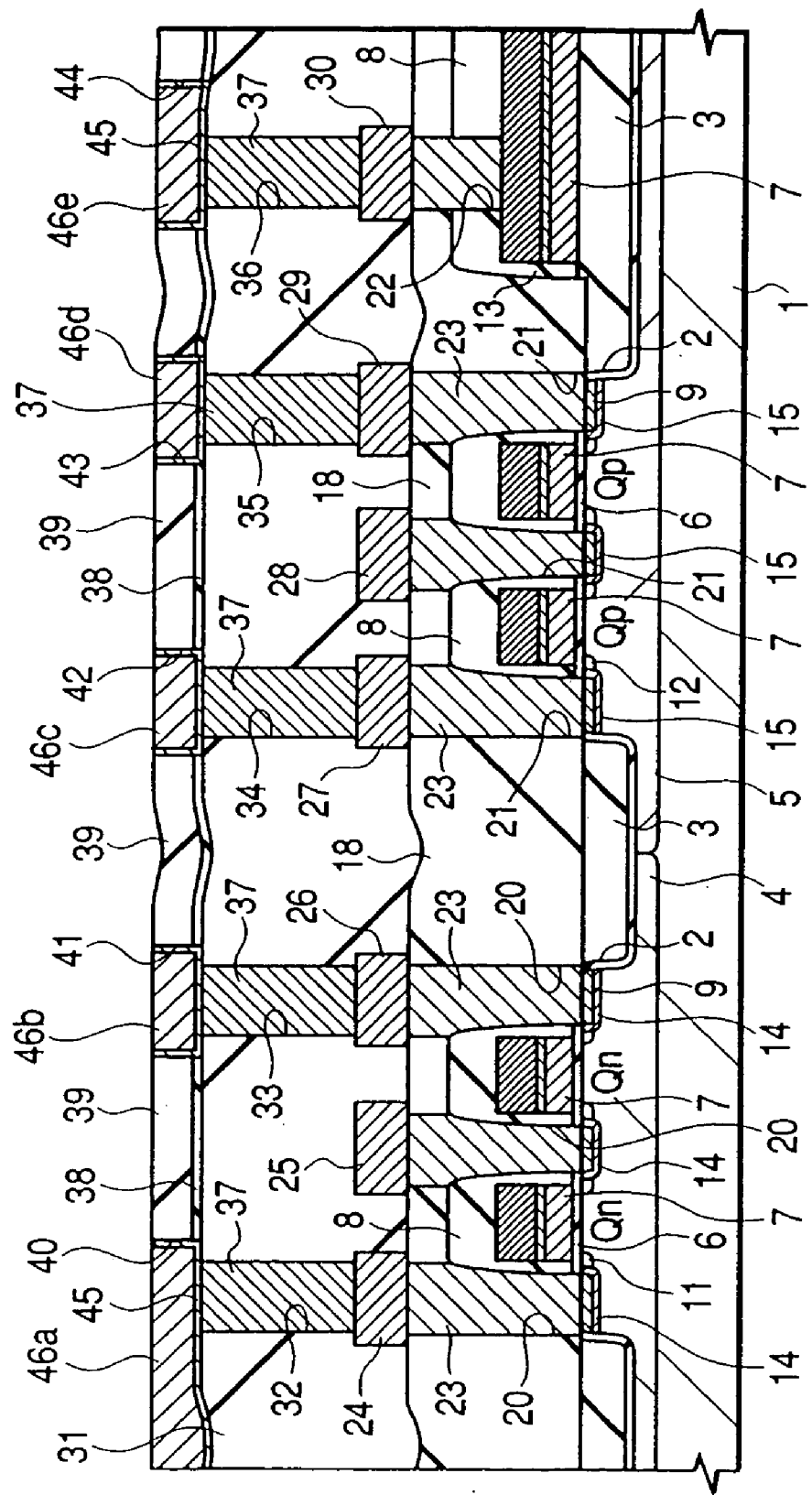
FIG. 41 is a sectional view of the essential parts of a semiconductor substrate showing a step in the method of fabricating the semiconductor integrated circuit device of Embodiment 2.
Figure 42A:
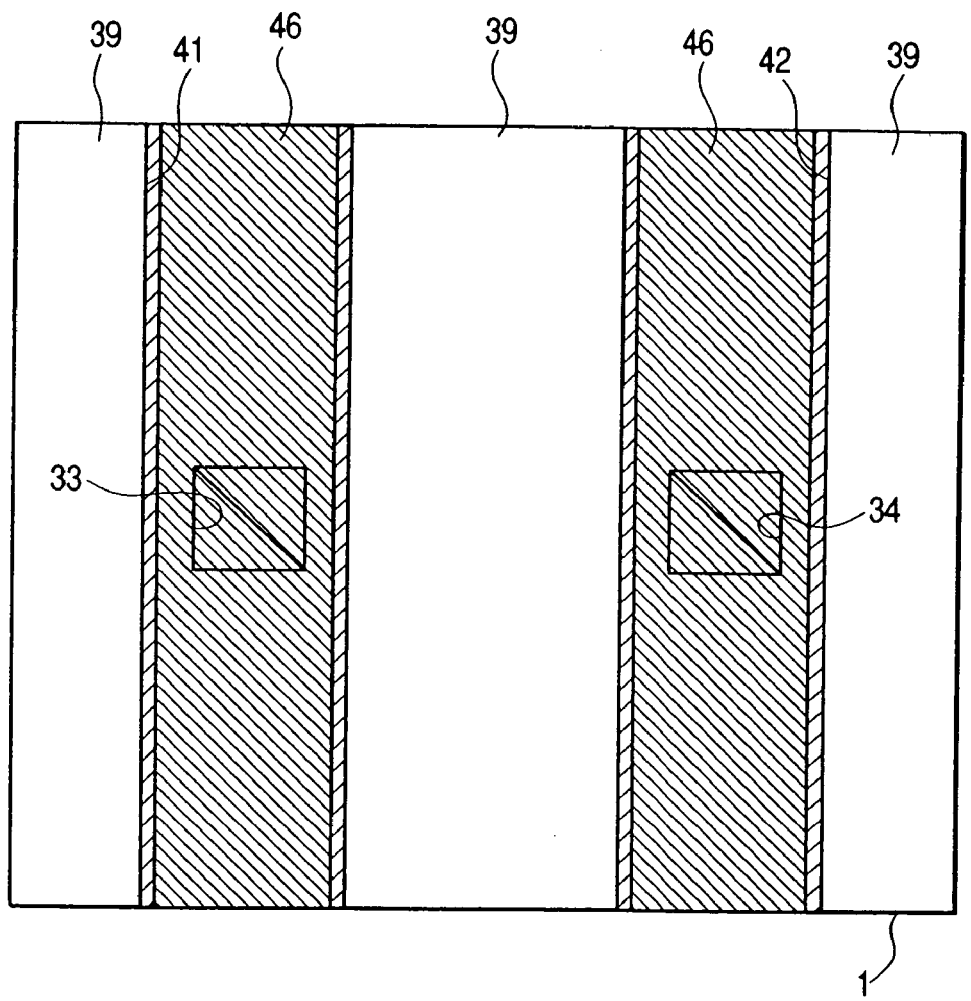
FIG. 42(a) is a plan view of the essential parts of a semiconductor substrate showing a step in the method of fabricating the semiconductor integrated circuit device of Embodiment 2.
Figure 42B:
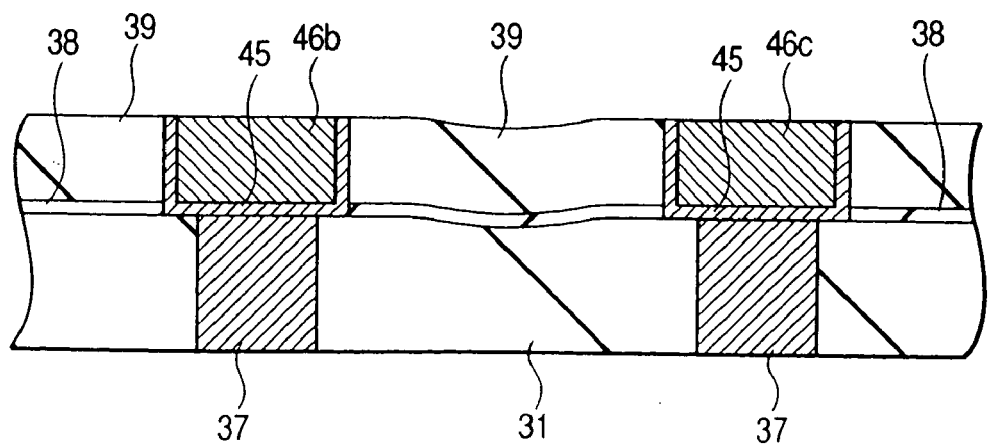
FIG. 42(b) is a sectional view of the essential parts thereof.

As shown in FIG. 41 and FIGS. 42(a), 42(b), by performing the above selective chemical mechanical polishing, all of the TiN film 45 outside the interconnection slots 40 to 44 is removed, and the embedded Cu interconnections 46a to 46e are formed inside the interconnection slots 40 to 44.

A slurry residue containing particulates such as abrasive particles or metal particles such as copper oxides adhere to the surface of the substrate 1 in which formation of the embedded Cu interconnections 46a to 46e is complete. To remove this slurry residue, in the clean station 404 shown in FIG. 34, the substrate 1 is washed with pure water containing BTA. At this time, mechanical washing may be performed concurrently by applying a high frequency vibration of 800 kHz or more to the washing liquid to dislodge the slurry residue from the surface of the substrate 1. Next, to prevent drying of the surface, the substrate 1 is transported while it is maintained in the wet state from the polishing treatment part 401 to the post-washing part 402. In a first washing part 409A, scrub washing is performed using a washing liquid including 1 wt % of NH40H, and in a second washing part 409B, scrub washing is performed using pure water. As described above, to prevent corrosion in the Cu interconnections 46a to 46e due to irradiation of light on the surface of the substrate during washing, the whole section is covered by a shield wall 430.

Figure 43:
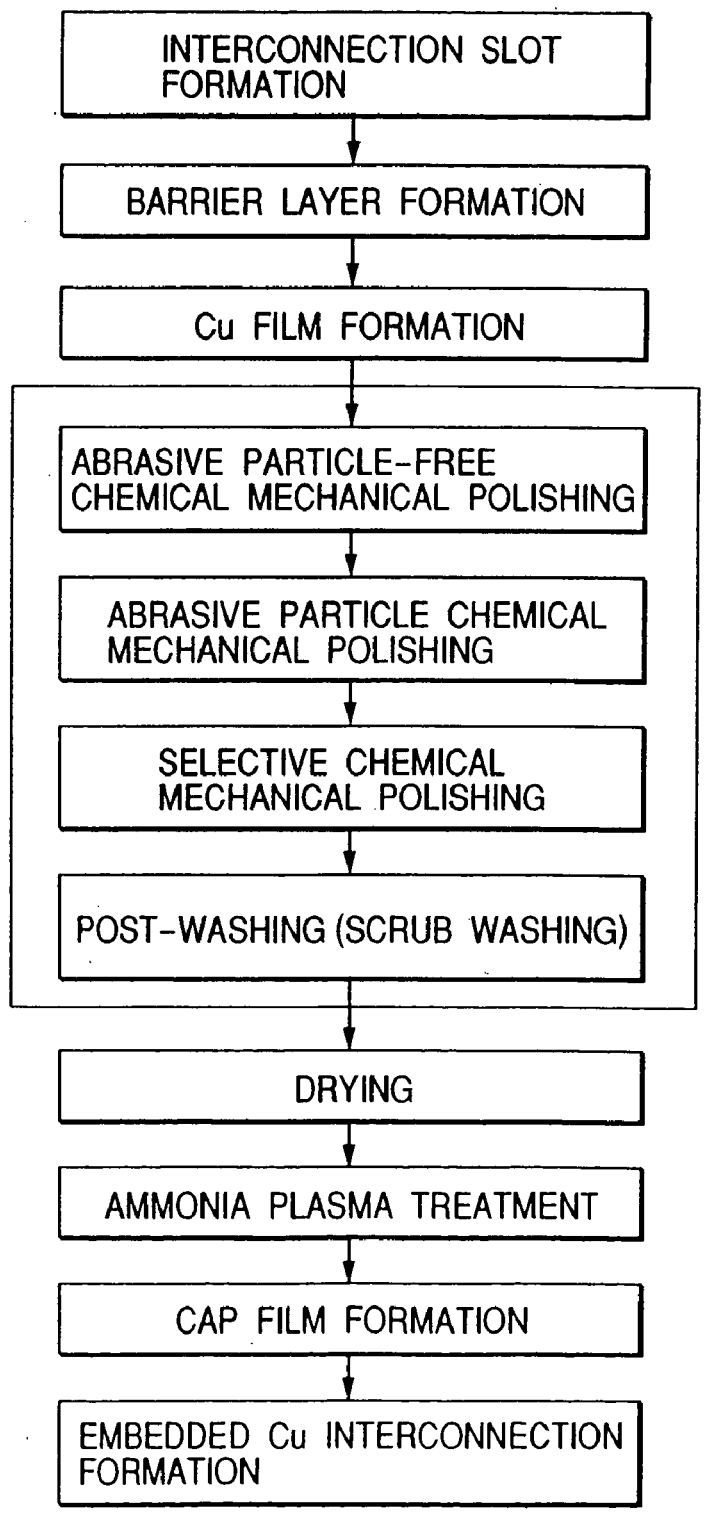
FIG. 43 is a flowchart showing the method of fabricating the semiconductor integrated circuit device of Embodiment 2.

The substrate 1 which has completed scrub washing (post-washing) is dried in the spin drier 410, and transported to the next step. The subsequent steps are identical to those of the first embodiment. FIG. 43 is an overall flowchart of the processes used for forming the aforesaid Cu interconnections 46a to 46e.

Figure 44:
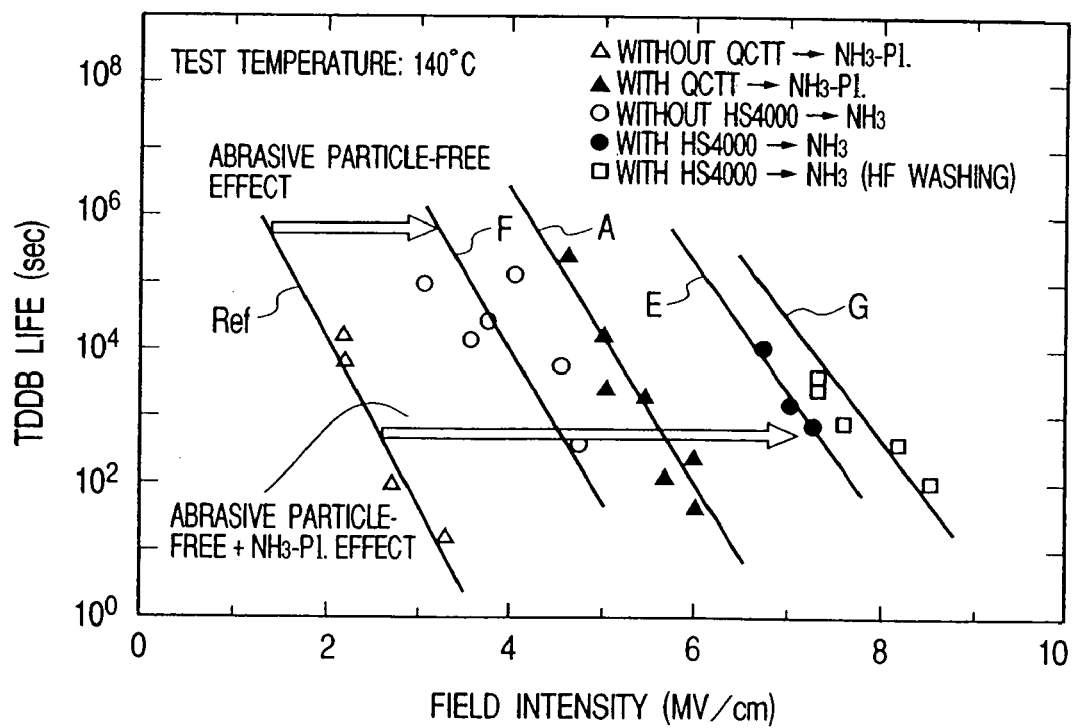
FIG. 44 is a graph showing TDDB life.

According to this embodiment, TDDB life can be improved more than in the first embodiment. FIG. 44 is a graph showing TDDB life in the case of this embodiment. The data for this embodiment is shown by the line E. For reference, data for no treatment (line Ref) and data for the abrasive particle chemical mechanical polishing (Embodiment 1) (line A) are shown simultaneously. TDDB characteristics are improved, as shown by the line F, even if abrasive particle-free chemical mechanical polishing is performed without ammonia plasma treatment. This may be due to the fact that, in the case of abrasive particle-free chemical mechanical polishing, improvement of TDDB life results from less damage to the silicon oxide film. In the case of abrasive particles, the slurry contains abrasive particles (alumina, etc.) of 2–3 μm size (secondary particle diameters). Due to these abrasive particles, micro-scratches occur, and damage is done to the surface of the silicon oxide film 39. However, in the case of abrasive particle-free polishing, the slurry does not contain abrasive particles or only a very small amount of them even if they are present, so that the damage can be largely reduced. As a result, the TDDB characteristics are improved.

When the acid treatment (HF treatment) described in the next embodiment is performed in addition, the TDDB characteristics are further improved (line G). In this acid treatment, after CMP post-washing, the substrate 1 is treated with an aqueous acid solution (e.g., aqueous HF solution), and ammonia plasma treatment is then performed. Due to the acid treatment, the damaged layer on the surface is removed, interface adhesion characteristics are improved and TDDB life is improved.

(Embodiment 3)

Figure 45:
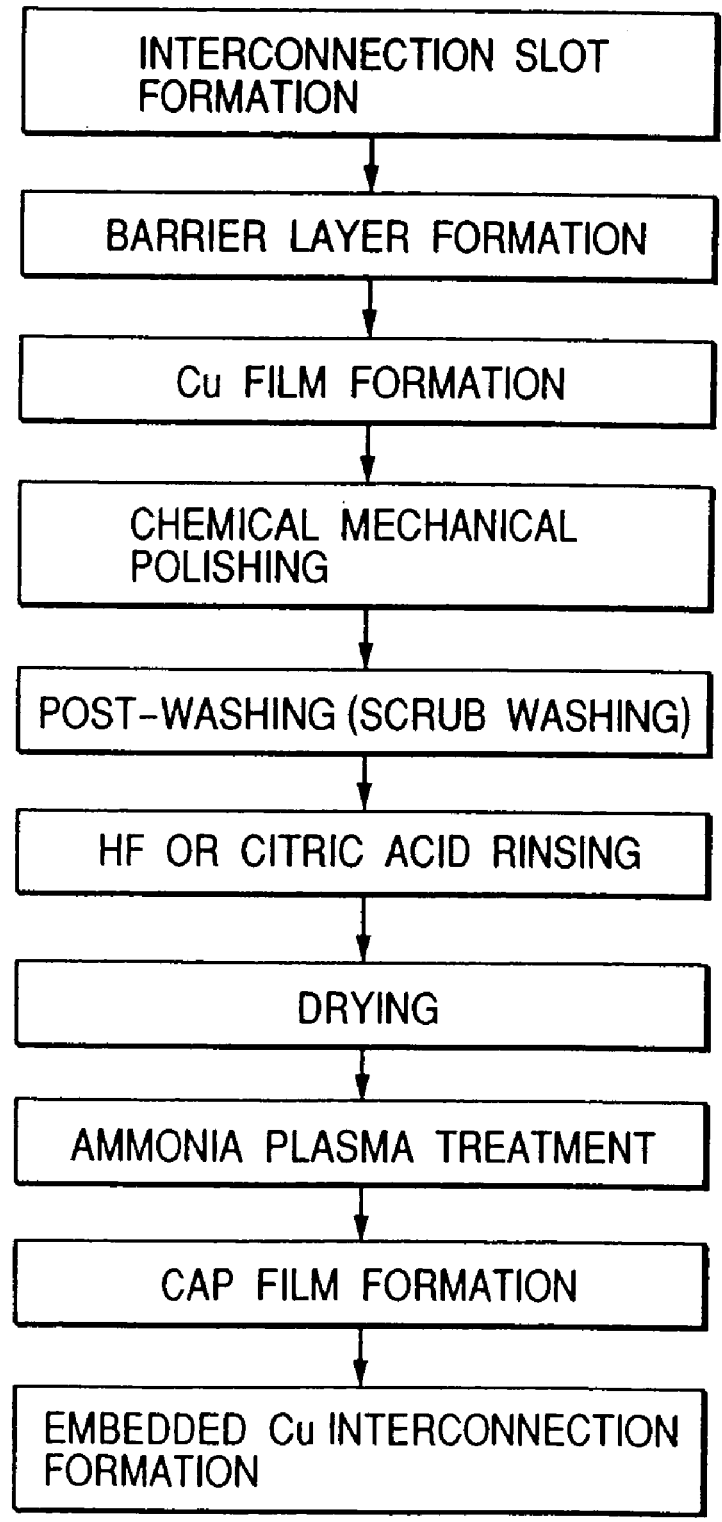
FIG. 45 is a flowchart showing the method of fabricating the semiconductor integrated circuit device of Embodiment 3.

FIG. 45 is an overall flowchart of the process for forming the Cu interconnections 46a to 46e of the third embodiment. As shown in the figure, the process is identical to Embodiment 1 except that a HF or citric acid washing step is inserted.

In HF washing, using brush scrub washing, for example, the HF concentration may be 0.5% and the washing time may be 20 seconds.

Alternatively, instead of HF washing, citric acid washing may be used. In citric acid washing, using brush scrub washing, for example, the citric acid concentration may be 5% and the washing time may be 45 seconds.

Figure 46:
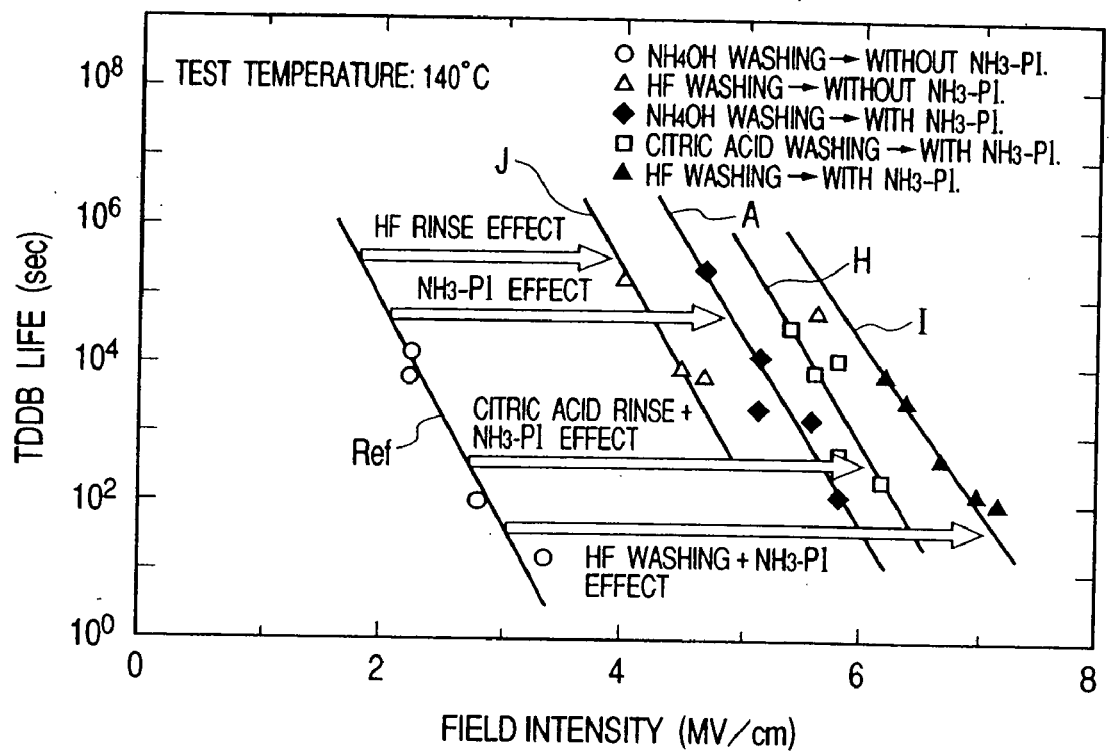
FIG. 46 is a graph showing TDDB life.

By using HF or citric acid washing in this way, the damaged layer on the surface due to CMP may be removed. Hence, the TDDB life can be improved. FIG. 46 is a graph showing TDDB life in the case of this embodiment. The data when citric acid is used in the case of this embodiment is shown by the line H, and the data when HF washing is used is the line 1. For reference, no treatment (line Ref) and the data of Embodiment 1 (line A) are shown simultaneously. The TDDB characteristics are improved, as shown by the line J, even if HF washing is performed alone without ammonia plasma treatment. This is probably because the interface characteristics are improved due to removal of the damaged layer.

(Embodiment 4)

Figure 47:
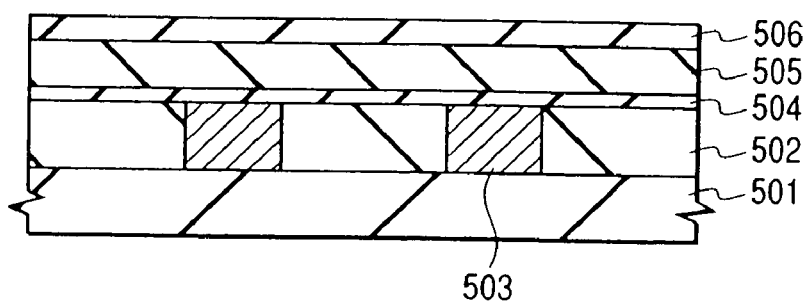
FIG. 47 is a sectional view of the essential parts of a semiconductor substrate showing a step in the method of fabricating the semiconductor integrated circuit device of Embodiment 4.
Figure 48A:
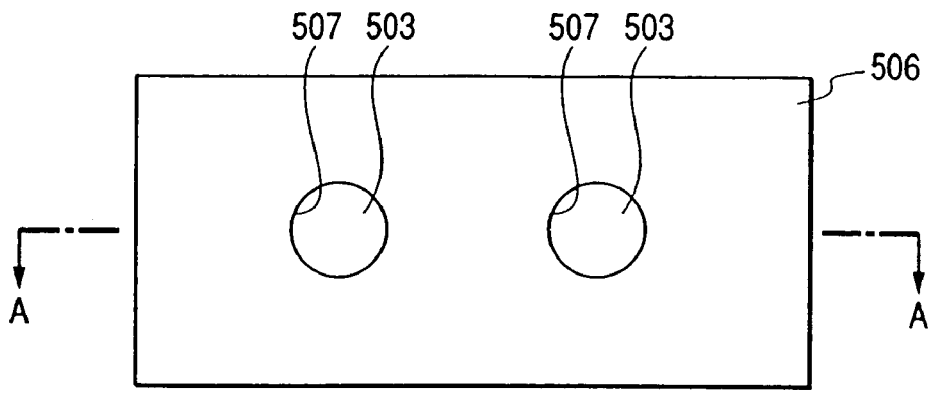
FIG. 48(a) is a plan view of the essential parts of a semiconductor substrate showing a step in the method of fabricating the semiconductor integrated circuit device of Embodiment 4.
Figure 48B:
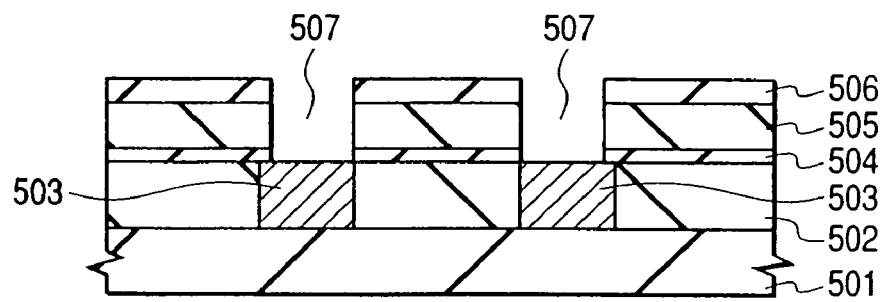
FIG. 48(b) is a sectional view of the essential parts thereof.
Figure 49:
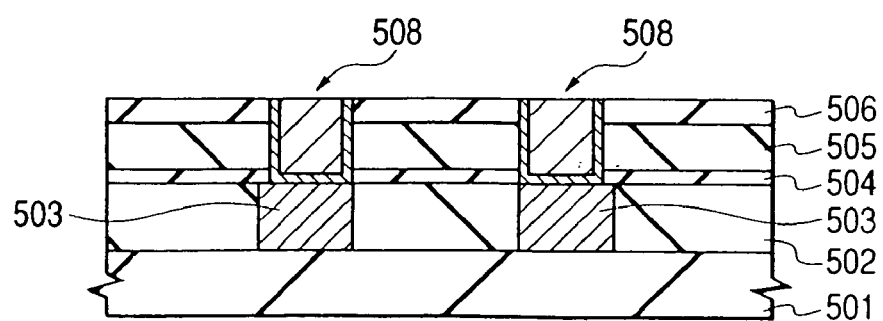
FIG. 49 is a sectional view of the essential parts of a semiconductor substrate showing a step in the method of fabricating the semiconductor integrated circuit device of Embodiment 4.

FIG. 47–FIG. 49 are plan views and sectional views showing a method of fabricating the semiconductor integrated device according to a fourth embodiment of this invention. In FIG. 47 to FIG. 49, only the interconnection part is shown.

As shown in FIG. 47, an insulating film 502 for forming interconnections is formed over an insulating film 501, and this insulating film 502 is embedded to form a copper interconnection 503. The method of forming the copper interconnection 503 is identical to that of Embodiments 1–3.

Further, a silicon oxide film (TEOS oxide film) 506 is formed by plasma CVD using a silicon nitride film 504, a low dielectric constant silicon oxide film 505 and TEOS as the raw material gas.

The low dielectric constant silicon oxide film 505 comprises a silicon oxide insulating film having a specific dielectric constant (6) not exceeding 3.0, such as for example by a coating insulating film comprising an inorganic SOG film having hydrogen silsesquioxane as a raw material or an organic is SOG film having tetraalkoxysilane+alkyl alkoxysilane as a raw material, or a fluorocarbon polymer film formed by plasma CVD. By using this low dielectric constant silicon oxide film, the parasitic capacitance between interconnections is reduced and problems of interconnection delay are avoided.

Next, in the pattern shown in FIG. 48(a), and as shown in FIG. 48(b), connecting holes 507 are formed. Photolithography and etching are used to form the connecting holes 507. However, the dielectric constant silicon oxide film 505 has a film structure with an uneven surface, and has many Si—OH bonds. It has been found by experience that due to this, the film quality of the film formed as the upper layer and the state of the interface are poor. It has also been found from experience that if the barrier film (titanium nitride) described in the next step is formed as it is without treatment, the TDDB characteristics are poor. Therefore, the ammonia plasma treatment described in Embodiment 1 is applied to the exposed part of the silicon oxide film 505 in the connecting holes 507. As a result, the Si—OH bonds on the surface are improved and are transformed into Si—O—N bonds as described in Embodiment 1.

Next, as shown in FIG. 49, a plug 508 including titanium nitride and tungsten is formed in the connecting holes 507. When this titanium nitride is deposited, the Si—O—N bonds break away as in Embodiment 1, the interface between titanium nitride and the low dielectric constant silicon-oxide film 505 is improved, and the connectivity is improved.

The plasma treatment in the connecting holes may of course be applied also to the interconnection slots.

Instead of ammonia plasma treatment, a plasma treatment may be performed with a mixture of nitrogen, argon and helium.

It may be that in an ashing step to remove the photoresist film after forming the connecting holes 507, the surfaces of the interconnections 503 in the bases of the connecting holes 507 are oxidized. To remove this oxide layer, a technique has been disclosed in Japanese Unexamined Patent Publication No. Hei 11(1999)-16912.

The low dielectric constant silicon oxide film 505 is defined as a silicon oxide film having a lower dielectric constant than the silicon oxide film (for example, TEOS oxide film) contained in the protection layer formed as a passivation film.

(Embodiment 5)

Figure 50:
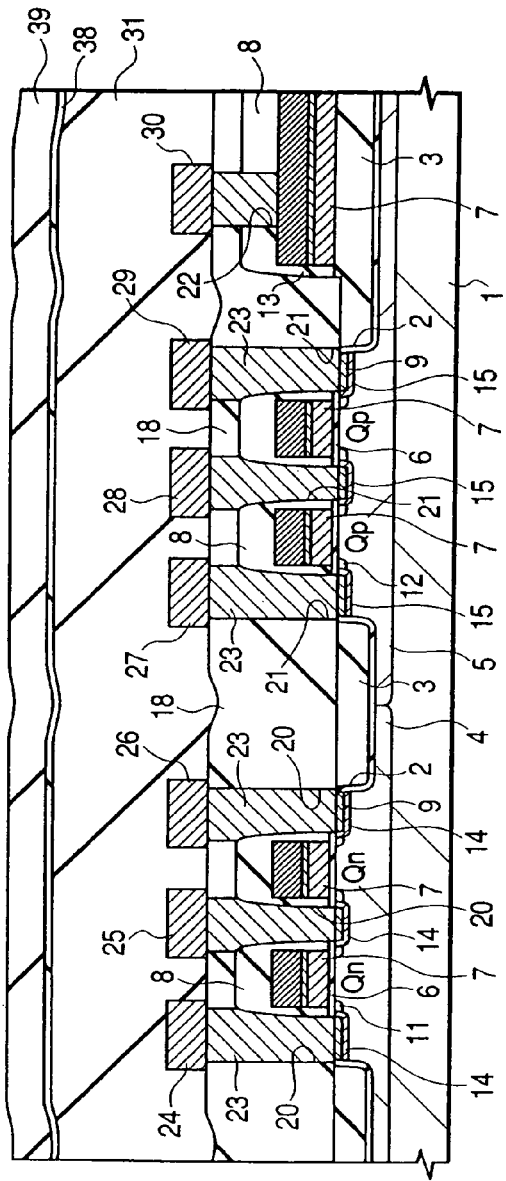
FIG. 50 is a sectional view of the essential parts of a semiconductor substrate showing a step in the method of fabricating the semiconductor integrated circuit device according to another embodiment of this invention.

The method of forming the embedded Cu interconnections 46a to 46e may be applied also to the formation of embedded Cu interconnections using the Dual Damascene method. In this case, after forming the first layer of W interconnections 24 to 30, as shown in FIG. 50, the silicon oxide film 31 having a film thickness of approximately 1200 nm, the thin silicon nitride film 38 having a film thickness of approximately 50 nm and the silicon oxide film 39 having a film thickness of approximately 350 nm, are first formed by plasma CVD over the first layer of the W interconnections 24 to 30.

Figure 51:
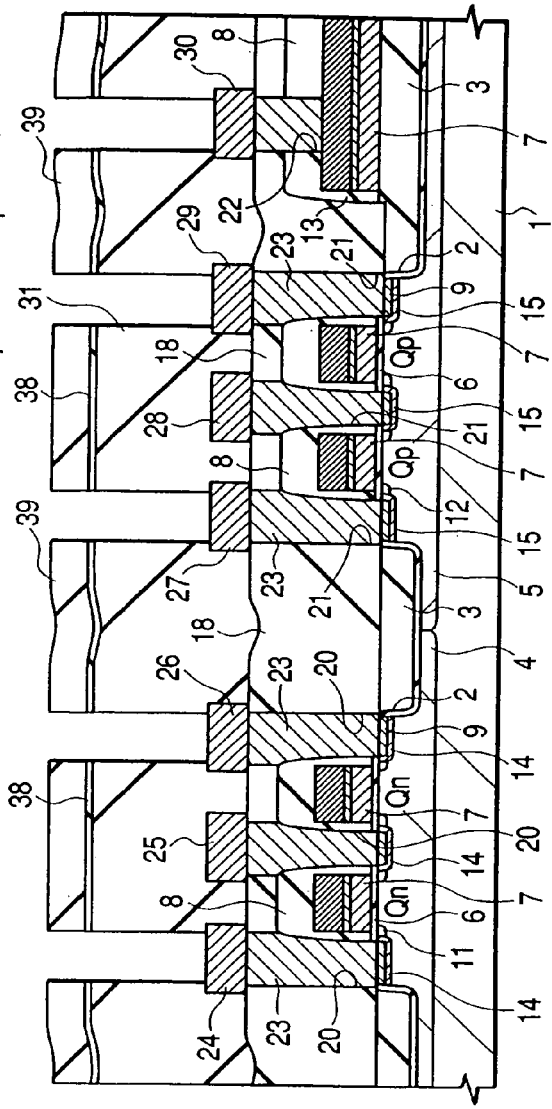
FIG. 51 is a sectional view of the essential parts of a semiconductor substrate showing a step in the method of fabricating the semiconductor integrated circuit device according to another embodiment of this invention.
Figure 52A:
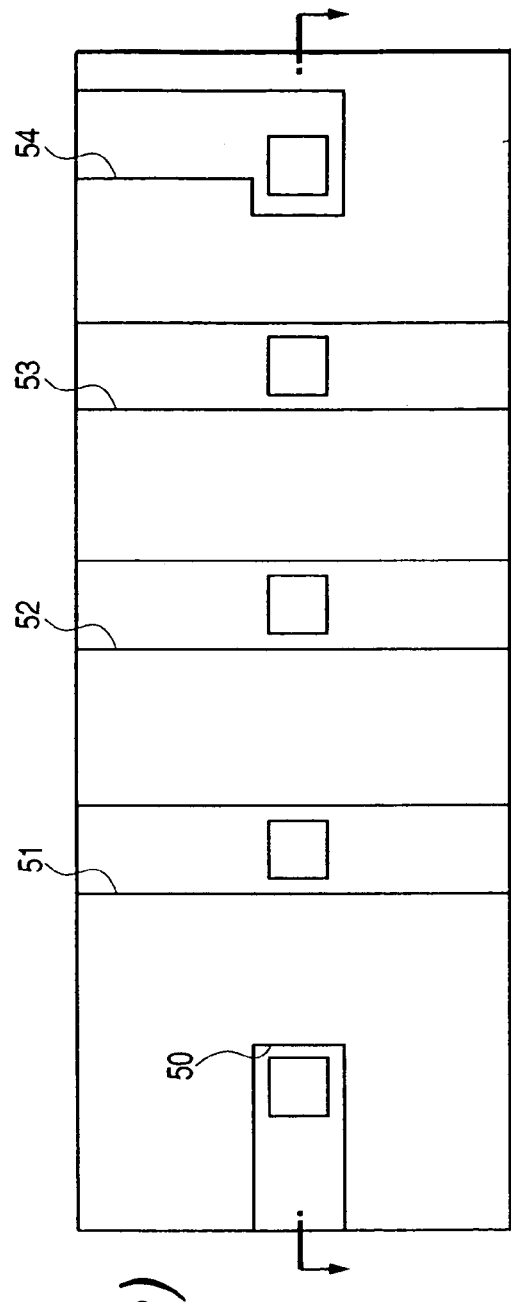
FIG. 52(a) is a plan view of the essential parts of a semiconductor substrate showing a step in the method of fabricating the semiconductor integrated circuit device according to another embodiment.
Figure 52B:
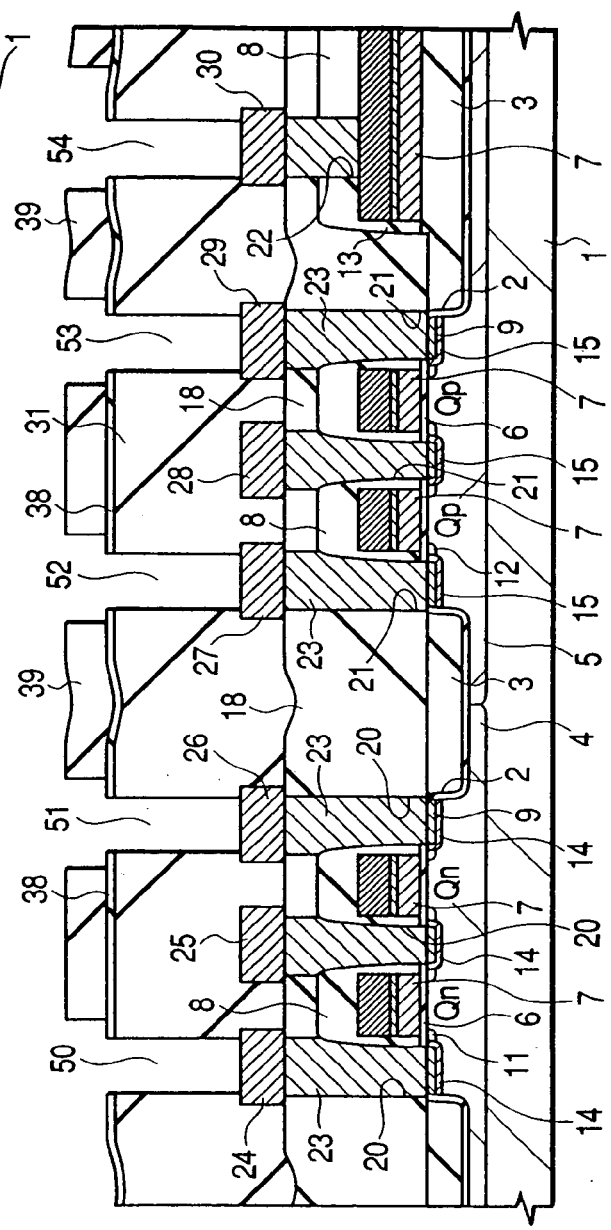
FIG. 52(b) is a sectional view of the essential parts thereof.

Next, as shown in FIG. 51, after progressively removing the silicon oxide film 39, silicon nitride film 38 and silicon oxide film 31 overlying the first layer of the W interconnections 24, 26, 27, 29, 30 by dry etching using a photoresist film as a mask, as shown also in FIGS. 52(a), 52(b), interconnection slots 50 to 54 with through holes are formed by removing the silicon oxide film 39 by dry etching using the silicon nitride film 38 as an etching stopper using another photoresist film as a mask.

Figure 53:
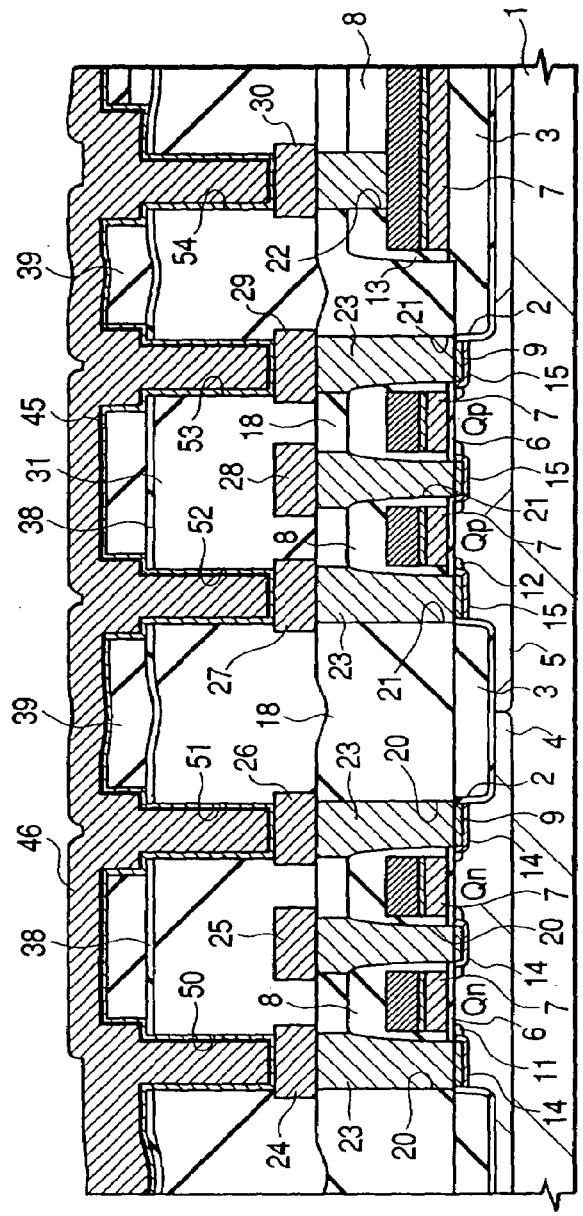
FIG. 53 is a sectional view of the essential parts of a semiconductor substrate showing a step in the method of fabricating the semiconductor integrated circuit device according to another embodiment of this invention.

Next, as shown in FIG. 53, after depositing the thin TiN film 45 having a film thickness of approximately 50 nm over the silicon oxide film 39, including the interior of the interconnection slots 50 to 54, the Cu film 46 having a film thickness sufficiently larger than the depth of the interconnection slots 50 to 54 is deposited over the TiN film 45. Since the interconnection slots 50 to 54 with through holes have a larger aspect ratio than the interconnection slots 40 to 44, the TiN film 45 is deposited by CVD. Also, the Cu film 46 is deposited by repeating sputtering two or more times. It may be formed by CVD, electrolysis plating or non-electrolysis plating. If the Cu film 46 is formed by plating, a step is required for forming a Cu seed layer underneath the interconnection slots 50 to 54 by sputtering or the like.

Figure 54:
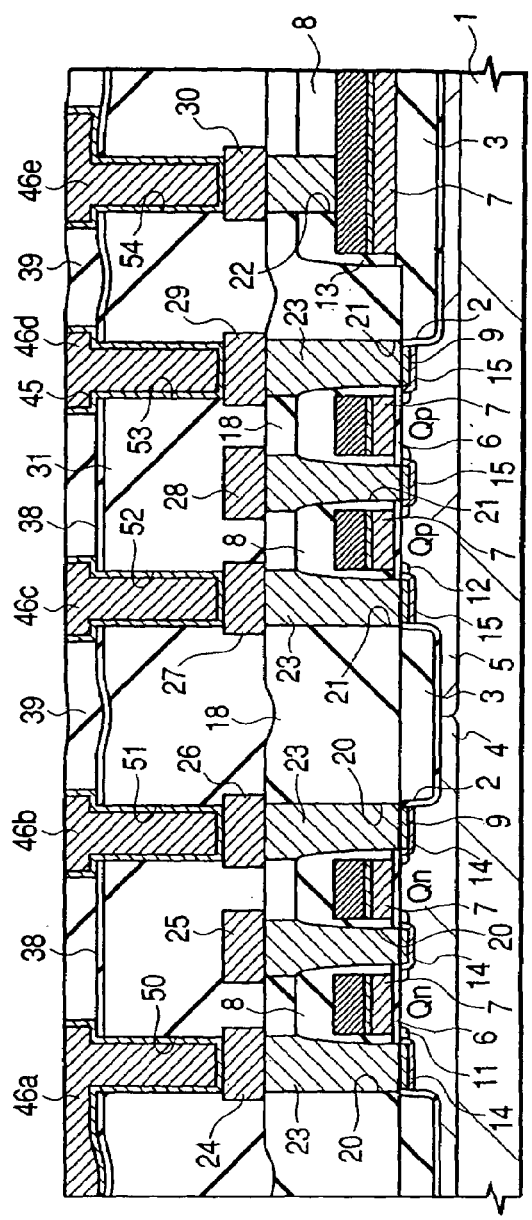
FIG. 54 is a sectional view of the essential parts of a semiconductor substrate showing a step in the method of fabricating the semiconductor integrated circuit device according to another embodiment of this invention.

Next, as shown in FIG. 54, the Cu film 46 and TiN film 45 outside the interconnection slots 50 to 54 are removed by the aforesaid abrasive particle-free chemical mechanical polishing, abrasive particle chemical mechanical polishing and selective chemical mechanical polishing, and the embedded Cu interconnections 46a to 46e are formed inside the interconnection slots 50 to 54. The remaining steps are identical to the method of forming the embedded Cu interconnections 46a to 46e using the aforesaid Single Damascene method.

(Embodiment 6)

Figure 55:
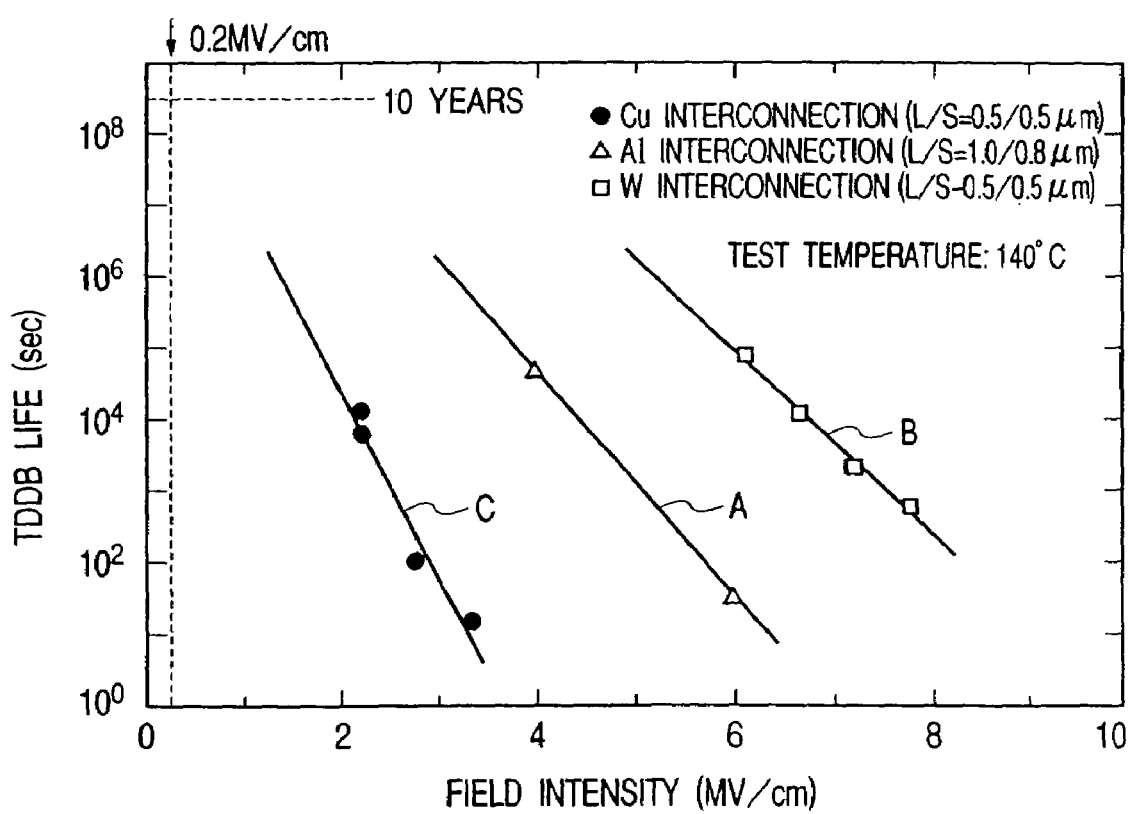
FIG. 55 is a graph showing data which illustrates measure of the TDDB characteristics of a copper interconnection, an aluminum interconnection and a tungsten interconnection.

As described above, it is commonly known that when Cu is used as an interconnection material, the TDDB life is remarkably shorter than when other metal materials (e.g., aluminum and tungsten) are used. FIG. 55 is a graph showing measured TDDB characteristic data for Cu interconnections, aluminum interconnections and tungsten interconnections. The vertical axis is TDDB life, and the horizontal axis is field strength.

Extrapolating the properties of aluminum interconnections (data A) and tungsten interconnections (data B), the TDDB life at a field strength of 0.2 MV/cm (as in normal use) far exceeds $3 \times 10^8$ sec (10 years) which is the development target of the Inventors. On the other hand, extrapolating the properties of Cu interconnections (data C), it is seen that there is practically no margin regarding the development target of 10 years.

In this experiment, the aluminium interconnections were formed by patterning using film deposition and photolithography, while the tungsten interconnections were formed by an identical Damascene method to that of the Cu interconnections. Specifically, the only difference between the Cu interconnections and tungsten interconnections is the material, there being no difference in structure. The remarkable difference in TDDB characteristics despite this must therefore be due to the difference in interconnection material. The TDDB characteristics show data obtained at a temperature of 140° C.

It is generally considered that the reason for the deterioration of the TDDB life is that Cu used as the interconnection material diffuses into the surrounding area, and this lowers the installation breakdown voltage between interconnections. Therefore, concerning the use of Cu interconnections, a barrier film would appear necessary to prevent diffusion of Cu. However, as interconnections become finer, the proportion of cross-sectional area of the high resistance barrier film in the cross-sectional area of the interconnections increases, the interconnection resistance increases, and the advantage of applying copper as an interconnection material becomes less.

Therefore, the Inventors performed fresh experiments and studies on the copper diffusion phenomenon. As a result, the Inventors discovered, for the first time, the actual mechanism behind the copper diffusion phenomenon as described above. Specifically, concerning the copper in the interconnections, drifting and diffusion of ionized copper from copper oxide or copper silicide at the electric potential between the interconnections is a far more important a factor than atomic copper. Also, the diffusion occurs predominantly between the insulating film formed by the copper interconnections and the cap film. Specifically, copper oxide or copper silicide is formed on the surface of the copper interconnections, copper ions are formed from these copper compounds, the ionized copper drifts and diffuses due to the field between interconnections along the interface between the insulating film forming the interconnections and the cap film, and the diffused copper atoms increase the leakage current. This increase in the leakage current increases the thermal stress, finally causing insulation breakdown on the leakage path and affecting the TDDB life.

Figure 56:
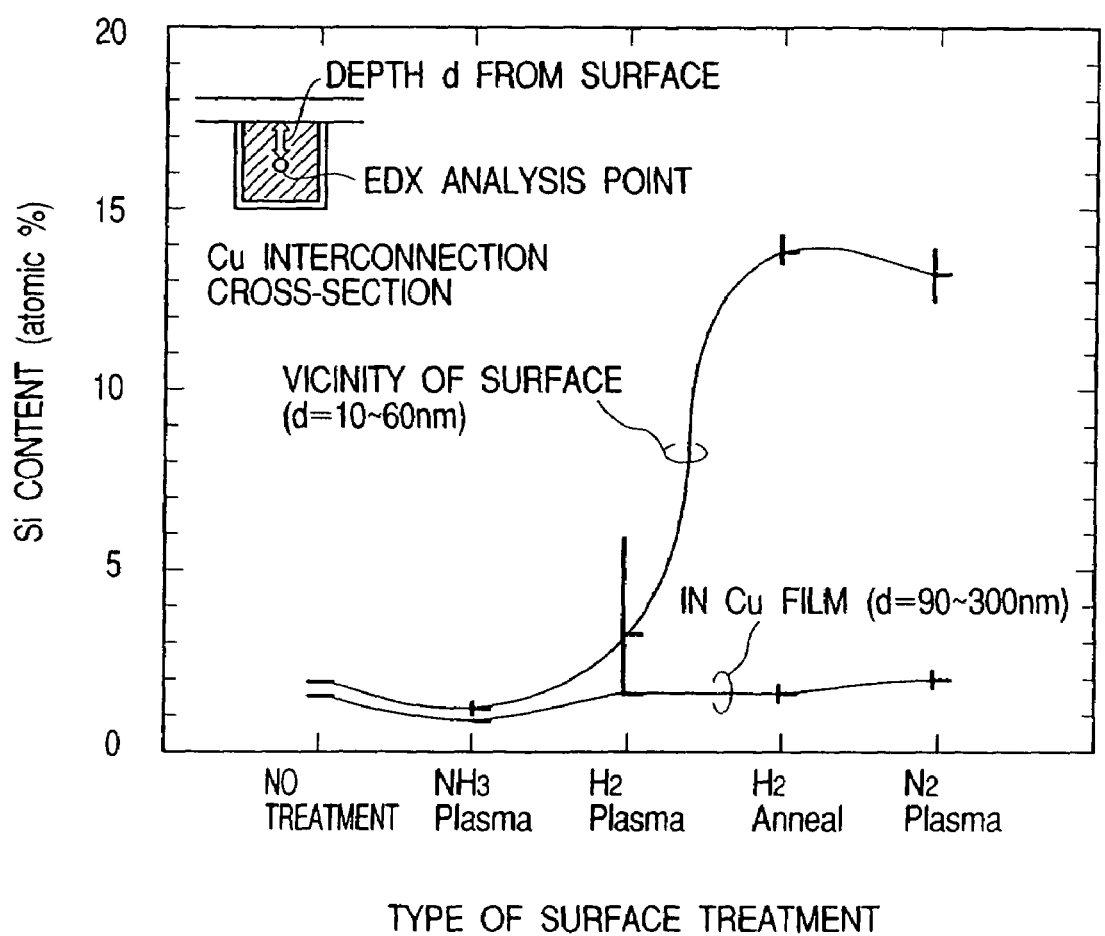
FIG. 56 is a graph showing the amount of silicon contained in the copper interconnection when each process is performed.

FIG. 56 is a graph showing the Si content in the copper interconnections when various surface treatments are performed (ammonia plasma treatment, hydrogen plasma treatment, hydrogen annealing, nitrogen plasma treatment), and when no treatment is performed. These test results were obtained from a test performed after a step for forming the aforesaid copper interconnections (including the TiN film (barrier film)), the aforesaid washing step, the aforesaid surface treatment steps, the step for forming the aforesaid cap film and a step for forming the interlayer insulating film. It is thought that the same effect as that of Si would be obtained from other impurities, such as oxygen or sulfur.

The copper silicide in the surface treatments mainly arises from set flow when the cap film (silicon nitride) is formed, as described above. In the hydrogen annealing treatment and nitrogen plasma treatment when this test is performed, the Si content in the vicinity of the surface (d approx. 10–60 nm) and inside (d=approx. 90–300 nm) of the Cu interconnections is larger than in the case of ammonia plasma treatment or hydrogen plasma treatment. In particular, it is seen to be extremely high in the vicinity of the surface. In this processing, the TDDB characteristics were poor as shown in FIG. 33.

On the other hand, the Si content in the vicinity of the surface of and inside the Cu interconnections is low in ammonia plasma treatment or hydrogen plasma treatment when this test is performed, compared with hydrogen annealing treatment and nitrogen plasma treatment. In particular, it is extremely low in the vicinity of the surface. Specifically, in this processing, the impurity content in the Cu interconnections is low, the degree of cleanliness of the surface of the insulating film in which the interconnection slots are formed is high, and there are few dangling bonds on the surface of the insulating film in which the interconnection slots are formed. Therefore, as shown in FIG. 33, the TDDB characteristics were good. Thus, when there is a TiN film (conducting barrier film), the TDDB characteristics are determined only by the effect of the interface.

From this fresh viewpoint, the Inventors discovered for the first time that it was possible to form a film of neutral Cu which is not ionized in the side walls and bottom of the interconnection slots (increasing the purity of the copper), to perform ammonia plasma treatment or hydrogen plasma treatment, or, by combining this with CMP or the aforesaid washing treatment, to improve the TDDB life of the semiconductor integrated circuit device comprising Cu interconnections even if the film thickness of the barrier film was less than 10 nm, or when there was no barrier film at all.

Figure 57:
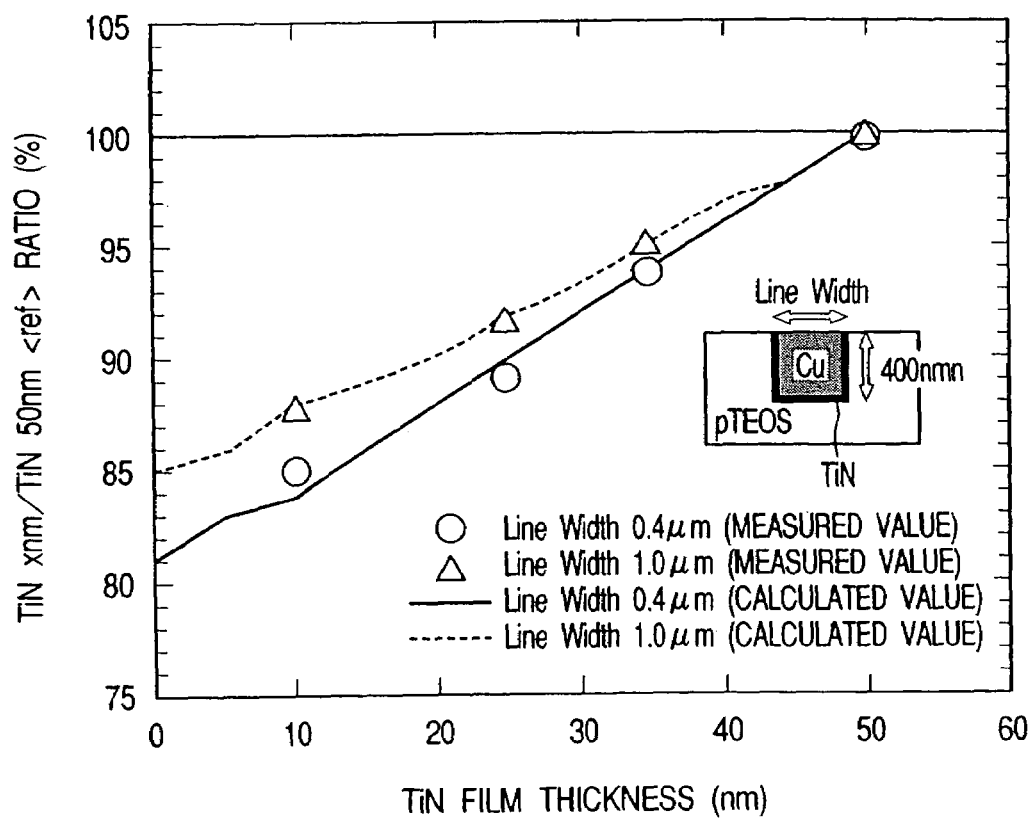
FIG. 57 is a graph showing conductive barrier film thickness dependence in the resistance of an embedded copper interconnection.

Herein, FIG. 57 shows the dependence of the interconnection resistance, i.e., (TiN.x (film thickness) nm/TiN 50 nm ratio), on the thickness of the TiN film, i.e., (barrier film). The figure shows measured values and theoretical values (calculated values) of the interconnection resistance for a slot shape wherein the line width is, for example, of the order of 0.4 µm and 1.0 µm, and the depth of the interconnection slots is, for example, of the order of 0.4 µm. The film thickness of the TiN film is the film thickness of the bottom of the interconnection slot.

From FIG. 57, it can be seen that the interconnection resistance decreases as the thickness of the TiN film (barrier film) decreases, and that the calculated values essentially coincide with the measured values. Therefore, as compared with the interconnection resistance when the TiN film thickness is 50 nm, when there is no TiN film, the interconnection resistance largely decreases by about 19% when the line width is of the order of 0.4 µm, and by about 15% when the line width is of the order of 1.0 µm. It is also seen that even when the film width of the TiN film is of the order of 10 nm, the interconnection resistance can be decreased by about 16% when the line width is of the order of 0.4 µm and by about 12% when the line width is of the order of 1.0 µm.

Figure 58:
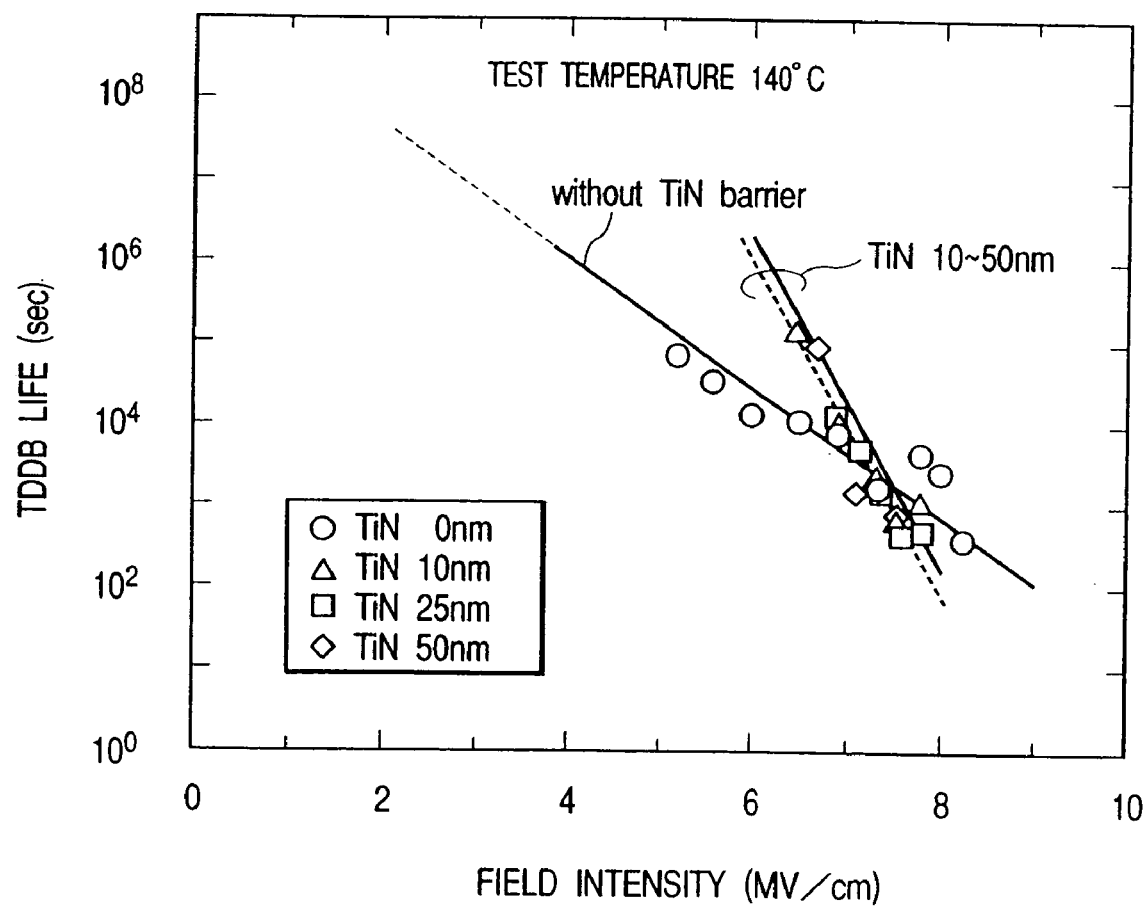
FIG. 58 is a graph showing the conductive barrier film thickness dependence of TDDB characteristics.

FIG. 58 shows the TiN film dependence of the TDDB characteristics in the case where the Cu interconnection is formed by long throw sputtering. From this figure, it is seen that when the film thickness of the TiN film is 10–50 nm, the TDDB characteristics are of the same order as those described above. On the other hand, it is seen that compared to the TDDB characteristics when the TiN film is of the order of 10–50 nm, the TDDB characteristics of samples where there is no TiN film considerably exceed the new system targets (e.g., 0.2 MV/cm, 110° C., 10 years=$3 \times 10^8$ sec) although the slope becomes gentler.

Figure 59:
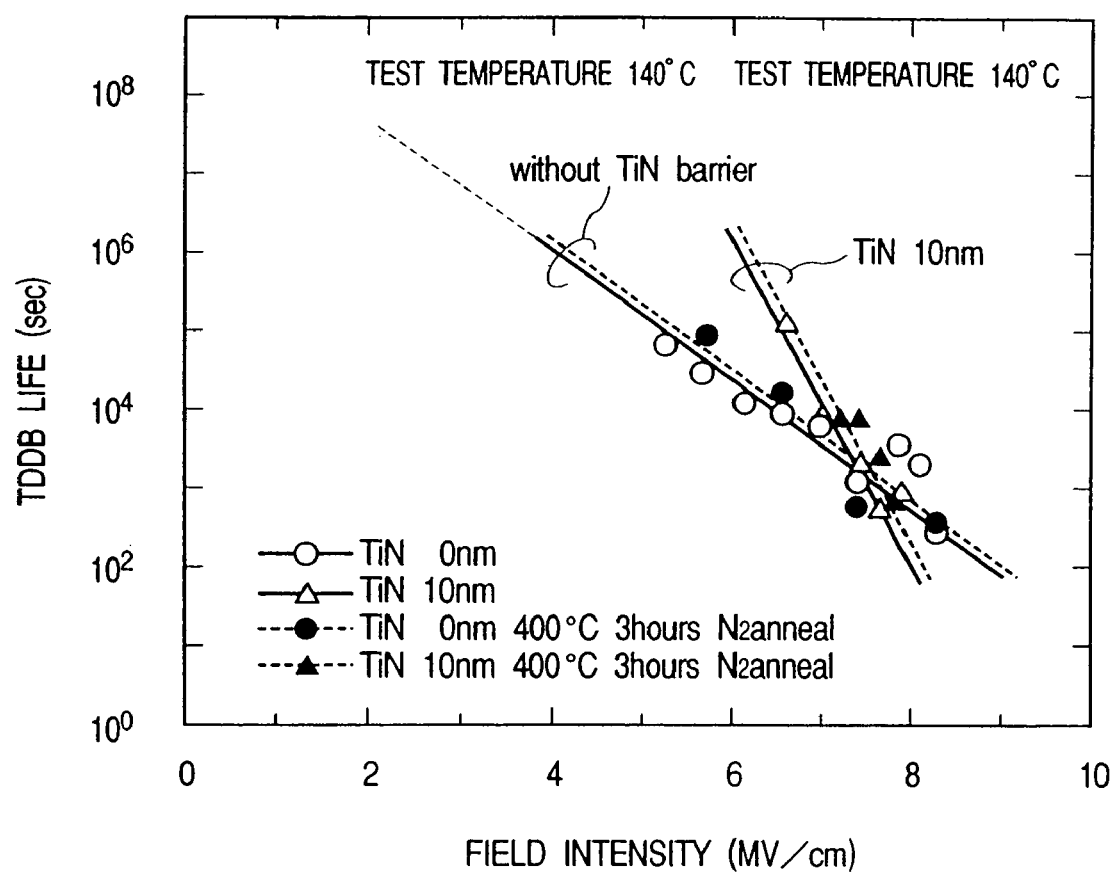
FIG. 59 is a graph showing TDDB characteristics after annealing in the case when there is no conductive barrier film, and the case of less than 10 nm thickness.

FIG. 59 shows TDDB characteristics in the presence and absence of heat treatment in Cu interconnections when there is no TiN film, and when the thickness of the TiN film is of the order of 10 nm. From this figure, it is seen that even for samples where there is no TiN film, the TDDB characteristics do not deteriorate, for example, with heat treatment at 400° C. for 3 hours.

From the test results shown in FIG. 58 and FIG. 59, it was discovered for the first time, by experiments carried but by the Inventors, that even when there is no TiN film, i.e., even when interconnections are formed only of Cu, sufficient reliability can still be attained and practical Cu interconnections can still be formed.

Figure 60A:
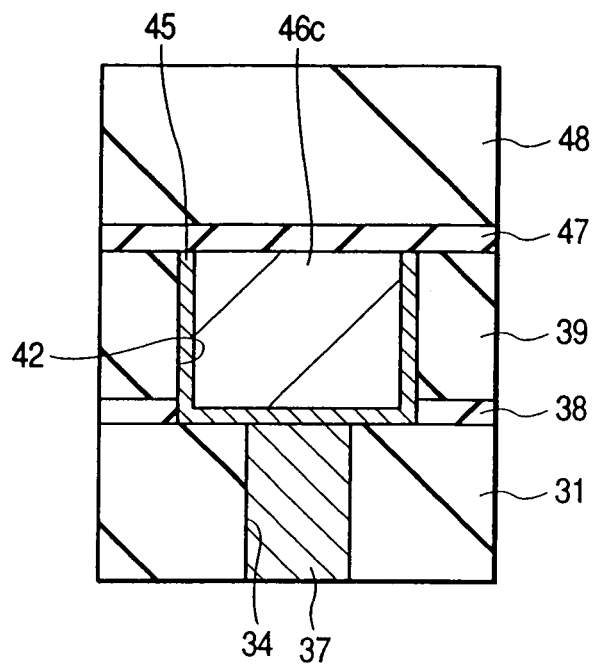
FIGS. 60(a) and 60(b) are sectional views of the essential parts of a copper embedded interconnection layer of a semiconductor integrated circuit device according to another embodiment of this invention.
Figure 60B:
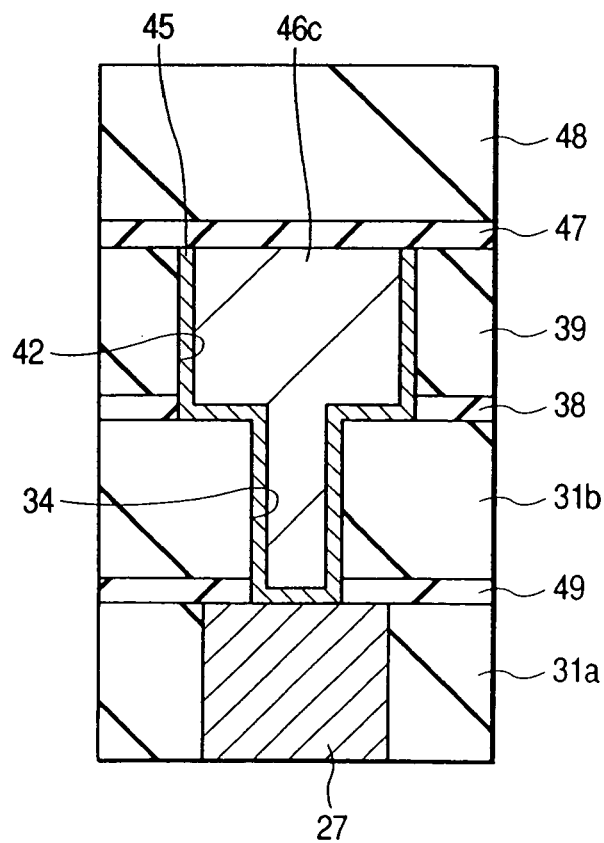

A specific example of the interconnection structure of the semiconductor integrated circuit device of the sixth embodiment is shown in FIGS. 60(a) and 60(b), which are sectional views in which part of the semiconductor integrated circuit device (first interconnection layer and second interconnection layer) which has been removed. FIG. 60(a) shows a point formed by the Single Damascene method, and FIG. 60(b) shows a point formed by the Dual Damascene method. A silicon oxide film 48 is deposited over a silicon nitride film 47. In FIG. 60(b), the silicon oxide film 31b is deposited over a silicon oxide film 31a and the tungsten interconnection 27 via a silicon nitride film 49. The case is shown where the through hole 34, through which part of the tipper surface of the W interconnection 27 is exposed, is formed in the silicon oxide film 31b and silicon nitride film 49. In the following description, only the first interconnection layer and second interconnection layer will be described for convenience, but it shall be understood that this invention applies not only to these parts and can be applied also to other interconnection layer parts.

The line width (width of interconnection slot 42) and adjacent line interval (distance between opposite lateral surfaces of adjacent lines) is, for example, 0.4 µm or less. This is a semiconductor integrated circuit device having an interconnection structure wherein the line width and adjacent line interval studied by the Inventors is 0.25 µm or less, or 0.2 µm, for example. The aspect ratio of the interconnection slot 42 is 1, for example.

The thickness of the conducting barrier film represented by the TiN film 45 is less than 10 nm, and preferably of the order of 6–7 nm, for example. In the sixth embodiment, the TDDB characteristics can be improved even when the film thickness of this TiN film 45 does not exceed 5 nm or does not exceed 3 nm, or even when it is of the order of only 2 nm. Here, the thickness of the TiN film 45 means the surface part where the film is deposited most thinly. Herein, in the film thickness of the TiN film 45 in the interconnection slots (e.g., interconnection slot 42) or connecting holes (e.g., through hole 34), the side walls are deposited most thinly, and the thickness therefore means the thickness of the TiN film 45 in the side walls. Further, in this case, the following two structures may occur, for example. In one of these structures, in the side walls of the interconnection slots or connecting holes (including the bottom angle part of the slot or hole), the thickness of the part where the TiN film 45 is thinnest is the above thickness (e.g., less than 10 nm, and preferably about 6–7 nm, 5 nm or less, 3 nm or less or about 2 nm). In the other case, in the side walls of the interconnection slot or connecting holes, the thickness of the part where the TiN film 45 is thickest is the above thickness (e.g., less than 10 nm, and preferably about 6–7 nm, 5 nm or less, 3 nm or less or about 2 nm).

By forming the TiN film 45 to have a thickness of less than 10 nm, as described above, the adhesion of the TiN film 45 to the silicon oxide film 39 is better than that of the Cu film, so peeling of the Cu film 46 can be prevented when CMP is performed. Compared to the case where the TiN film 45 is not provided (as described in Embodiment 8 hereafter), the interconnection resistance increases, but a highly reliable Cu interconnection structure can be fabricated. Also, compared to the case where the TiN film 45 is not provided, the TDDB characteristics are improved. This is probably because, when there is no TiN film 45, Cu impacts the side wall of the interconnection slot 42 when the Cu film 46 is formed and reacts with $SiO_2$, so a small amount of Cu ions is produced. Even after heat treatment, the TDDB characteristics do not deteriorate, so this minute Cu ion layer at the $CU/SiO_2$ interface has some effect. Therefore, according to this embodiment, even the thin TiN film 45 of less than 10 nm acts as a barrier to the ionized Cu, and the TDDB characteristics are improved.

The concentration of components other than Cu in the Cu interconnections represented by the Cu interconnection 46c, does not exceed 0.8 At %, or 0.2 At %. According to measurement results obtained by the Inventors, it is possible to arrange it so that the concentration of components other than Cu does not exceed, for example, 0.08 At %, 0.05 At % or 0.02 At %. This value of the concentration of components other than Cu is a value when the semiconductor chip is completed, i.e., when a semiconductor chip is cut out of the semiconductor wafer after a wafer process, and is a value computed assuming diffusion in the Cu interconnection due to the heat when the insulating film or metal film is formed (e.g., in the case of tungsten, heat of about 450° C. when the film is formed), after forming the Cu interconnection.

In an actual Cu interconnection, regarding components other than Cu, their concentration in the upper layer of the Cu interconnection (part where the cap film is in contact) is high, and these components are probably distributed so that they gradually become sparser towards the center of the Cu interconnection. The components other than Cu are, for example, silicon, oxygen or sulfur (sulfur may be present when Cu interconnection is formed by plating), or any combination of these.

Instead of the silicon oxide films 31a, 31b, 31, 39, 48, the material of the interlayer insulating film may be SiOF, organic SOG (Spin On Glass) or PSG (Phospho Silicate Glass), for example. In the case of an insulating material having a low dielectric constant, such as a SiOF or SOG film, the interconnection capacitance can be decreased, so the performance of the semiconductor integrated circuit device can be improved. Further, a PSG film has the function of preventing the diffusion of Cu, so the TDDB life can be further improved. Therefore, the reliability of the semiconductor integrated circuit device can be still further improved.

Next, one example of forming the Cu interconnection structure according to the Single Damascene method will be described with reference to FIG. 61(a)–FIG. 65(b). FIGS. 61(a), 62(a), 63(a), 64(a) and FIG. 65(a) show plan views of the essential parts during the process of manufacturing the semiconductor integrated circuit device, and FIGS. 61(b), 62(b), 63(b), 64(b) and FIG. 65(b) show sections taken along a line A—A in FIGS. 61(a), 62(a), 63(a), 64(a) and FIG. 65(a), respectively. FIGS. 61(a), 62(a), 63(a), and 64(a) are plan views, the metal film being shaded for ease of understanding the diagram.

Figure 61A:
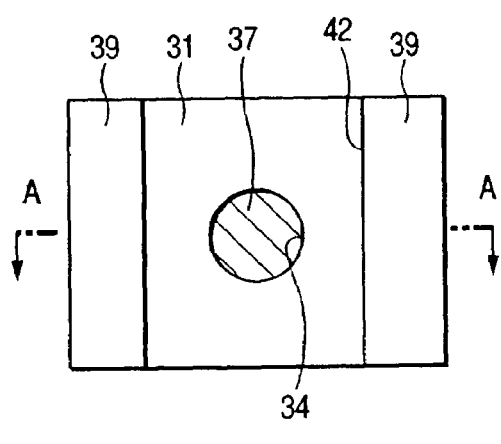
FIG. 61(a) is a plan view of the essential parts in a process for manufacturing a semiconductor integrated circuit device according to an embodiment of this invention.
Figure 61B:
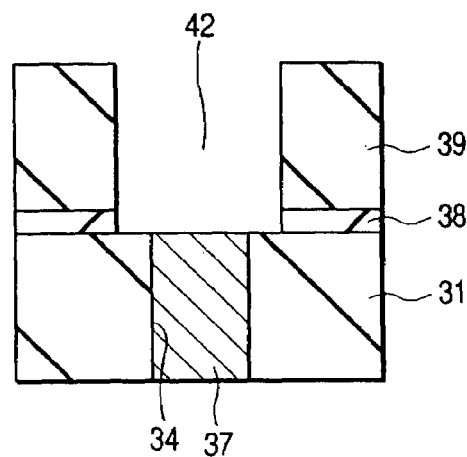
FIG. 61(b) is a sectional view taken along a line A—A in FIG. 61(a).
Figure 62A:
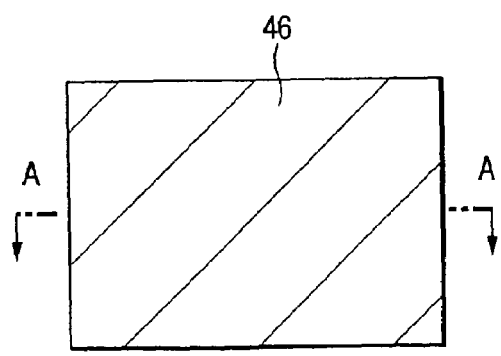
FIG. 62(a) is a plan view of the essential parts in a process for manufacturing a semiconductor integrated circuit device following FIG. 61.
Figure 62B:
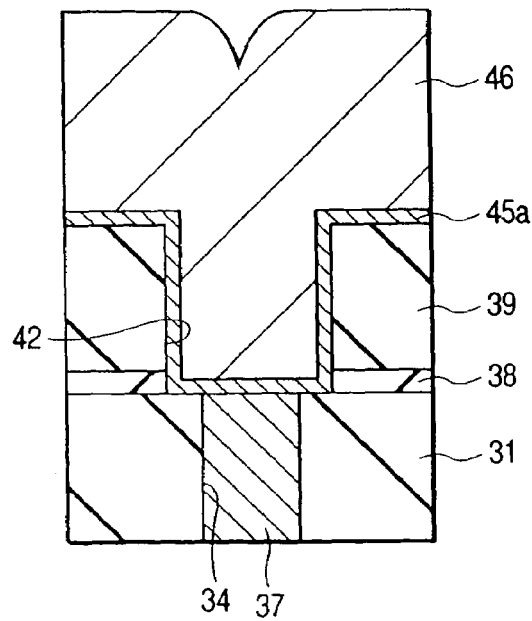
FIG. 62(b) is a sectional view taken along a line A—A in FIG. 62(a).

First, after the steps of FIG. 1–FIG. 6 described in Embodiment 1, the interconnection slot 42 is formed as shown in FIGS. 61(a), 61(b) in the same way as was described with reference to FIG. 7. The upper surface of the plug 37 is exposed on the bottom surface of the interconnection slot 42. Next, as shown in FIG. 62(b), a Ta film 45a (conducting barrier film), for example, is deposited to a thickness of about 30 nm as-deposited film thickness, for example, by an identical sputtering method to that of Embodiment 1. In this step, the Ta film 45a is deposited at the thickest point or the thinnest point of the side walls of the interconnection slot 40, for example, to less than 10 nm, or about 6–7 nm. Herein, the conducting barrier film was Ta, but as described above, TiN or another film may be used.

Subsequently, the Cu film 46 is deposited over the Ta film 45a to a thickness of, for example, about 300 nm as-deposited film thickness, by an identical sputtering method to that of Embodiment 1. The conditions in this step may be as follows. The pressure may be 0.02 Pa, the DC power may be 10 kW, the distance between the target and the substrate 1 may be 300–400 nm, and the temperature may be room temperature.

In this embodiment, therefore, by depositing the Cu film 46 by sputtering, the production of compounds can be maintained at a very low level compared to the CVD or plating methods. Also, the target used in this step was oxygen-free Cu of high purity, for example, 99.999% (5N) or higher, or preferably 99.9999% (6N) or higher. Hence, the concentration of Cu in the Cu film 46 when the film is formed is 99.999% or higher, or preferably 99.9999% or higher. Therefore, Cu of even higher purity can be deposited.

When the Ta film 45a and Cu film 46 are deposited, the ordinary sputtering method may be used, but a sputtering method with high directivity, such as long throw sputtering or collimate sputtering, may also be used. In this case, the coverage of the interconnection slot 42 by the metal film can be improved.

Next, hydrogen annealing treatment is performed. Due to this, the Cu film 46 is well embedded in the interconnection slot 42. The conditions in this step may be of the order of 475° C., 3 minutes, 26.6644×10$^2$ Pa and 500 sccm, for example.

Figure 63A:
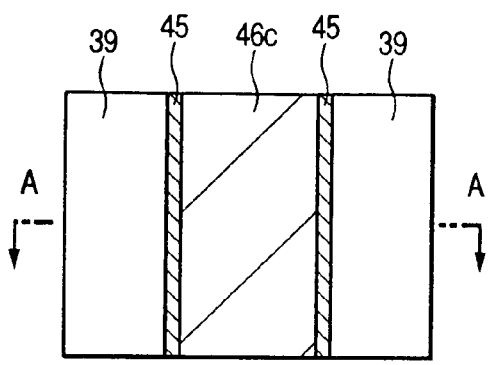
FIG. 63(a) is a plan view of the essential parts in a process for manufacturing a semiconductor integrated circuit device following FIG. 62.
Figure 63B:
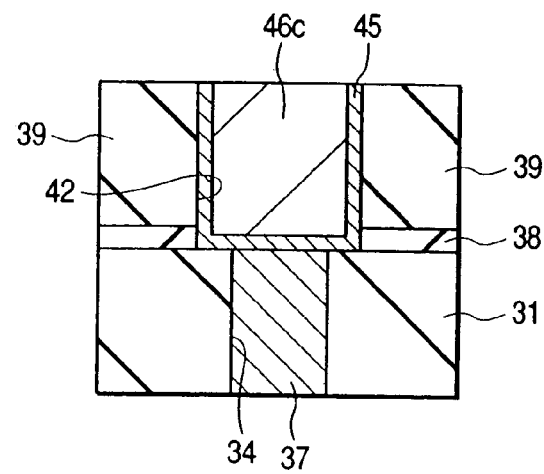
FIG. 63(b) is a sectional view taken along a line A—A in FIG. 63(a).
Figure 64A:
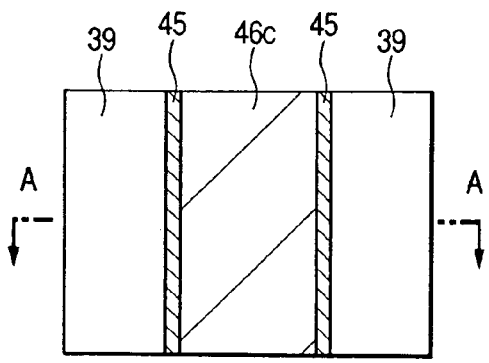
FIG. 64(a) is a plan view of the essential parts in a process for manufacturing a semiconductor integrated circuit device following FIG. 63.
Figure 64B:
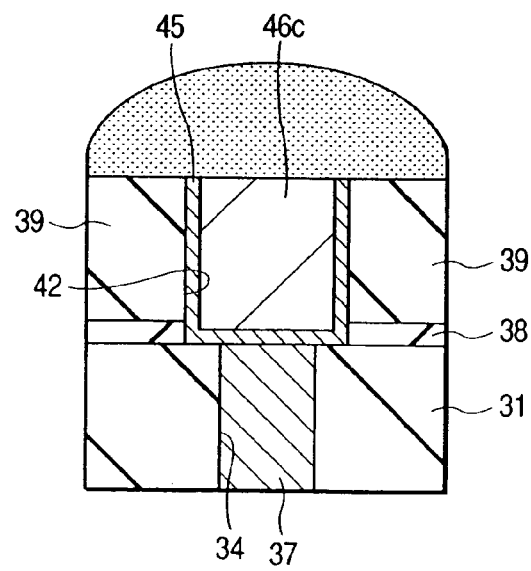
FIG. 64(b) is a sectional view taken along a line A—A in FIG. 64(a).

Next, as shown in FIGS. 63(a), 63(b), the Cu film 46 and Ta film 45a are polished by a CMP method identical to that of the aforesaid Embodiments 1 and 2, and the Cu film 46c is formed by removing surplus parts. Next, an anticorrosion process identical to that of the aforesaid Embodiments 1 and 2, and a cleaning treatment identical to that of the aforesaid Embodiments 1 and 3, are performed. Subsequently, the ammonia plasma treatment or hydrogen plasma treatment described in Embodiment 1 is performed on the surface of the insulating film 39 and Cu interconnection 46c, as shown by the dotted shading of FIG. 64(b).

When ammonia plasma treatment is performed, SiH bonds and SiN bonds are formed on the surface part of the silicon oxide film 39, so the quality, degree of cleanliness and electrical stability of the surface part of the silicon oxide film 39 can be improved, and the Cu diffusion preventing ability can be improved. As described in the aforesaid Embodiment 1, adhesion to the cap film can also be improved. Further, in the surface part of the Cu film 46c, CuN is formed. This CuN acts to stop bonding between silicon and oxygen in later steps, preventing formation of copper silicide and copper oxide and improving the purity of the copper. Therefore, Cu diffusion is prevented, and the TDDB life is enhanced. Moreover, the purity of the Cu is high, so the resistance of the Cu interconnections can be decreased as intended when the semiconductor chip is in the finished state. As a result, the performance of the semiconductor integrated circuit device can be improved.

On the other hand, when hydrogen plasma treatment is performed, SiH bonds are formed in the surface part of the silicon oxide film 39, so a substantially identical effect is obtained to the case of ammonia plasma treatment. According to experimental results obtained by the Inventors, in hydrogen plasma treatment, Cu reacts with silicon to the extent of several % in the subsequent cap film forming step, but the leakage current is largely reduced compared to the case of hydrogen annealing, nitrogen plasma treatment or no treatment, and the TDDB life can be enhanced. Further, the resistance of the Cu interconnections is poorer as compared to ammonia plasma treatment, but it is less than in the case of hydrogen annealing or nitrogen plasma treatment.

Figure 65A:
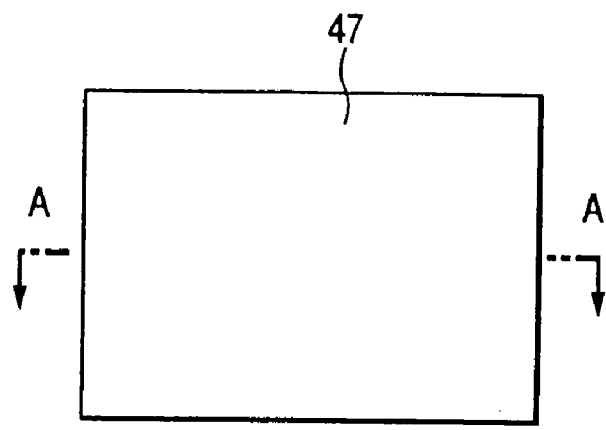
FIG. 65(a) is a plan view of the essential parts in a process for manufacturing a semiconductor integrated circuit device following FIG. 64.
Figure 65B:
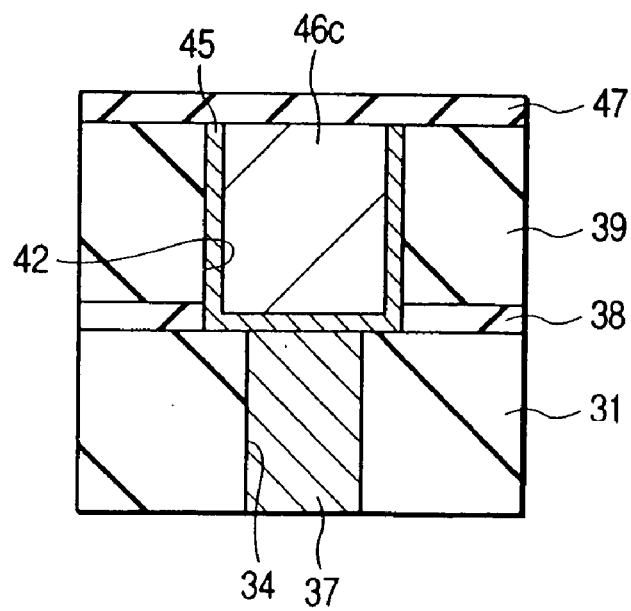
FIG. 65(b) is a sectional view taken along a line A—A in FIG. 65(a).

Subsequently, as shown in FIGS. 65(a), 65(b), the silicon nitride film (cap film) 47 is deposited in the same way as in Embodiment 1. Following this, as shown in FIG. 60(a), the silicon nitride film 48 is deposited by plasma CVD using, for example, TEOS (tetraethoxysilane).

Next, an example of forming the Cu interconnection structure by the Dual Damascene method will be described with reference to FIG. 66(a)–FIG. 77(b). FIGS. 66(a), 67(a), 68(a), 69(a), 70(a), 71(a), 72(a), 73(a), 74(a), 75(a), 76(a) and 77(a) show plan views of the essential parts during the fabrication of the semiconductor integrated circuit device, and FIGS. 66(b), 67(b), 68(b), 69(b), 70(b), 71(b), 72(b), 73(b), 74(b), 75(b), 76(b) and 77(b) show sectional views taken along line A—A in FIGS. 66(a), 67(a), 68(a), 69(a), 70(a), 71(a), 72(a), 73(a), 74(a), 75(a), 76(a) and 77(a), respectively. FIGS. 73(a), 74(a), 75(a) and FIG. 76(a) are plan views wherein the metal films have been shaded to make the drawings easier to understand.

Figure 66A:
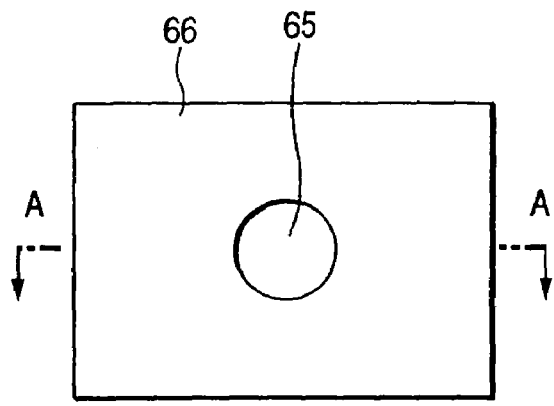
FIG. 66(a) is a plan view of the essential parts in a process for manufacturing a semiconductor integrated circuit device according to an embodiment of this invention.
Figure 66B:
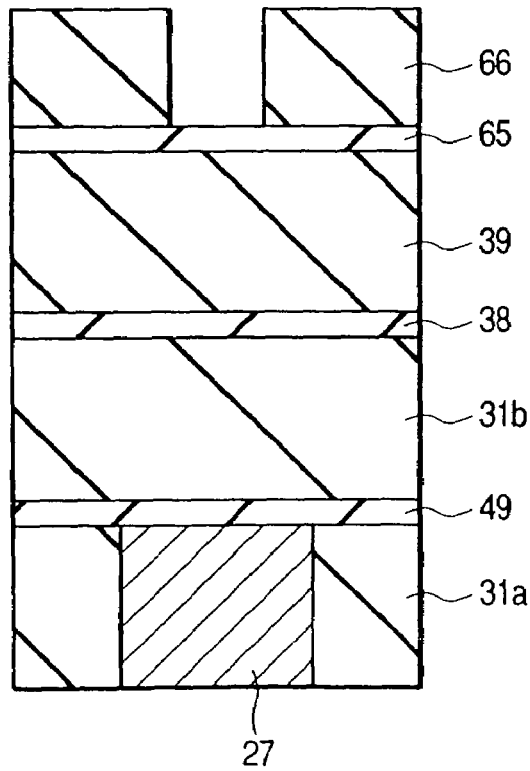
FIG. 66(b) is a sectional view taken along a line A—A in FIG. 66(a).
Figure 67A:
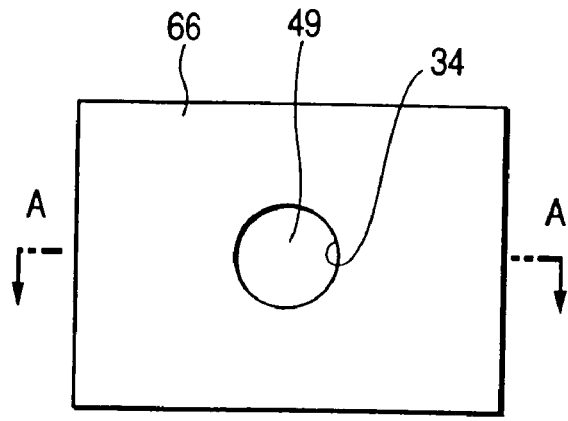
FIG. 67(a) is a plan view of the essential parts in a process for manufacturing a semiconductor integrated circuit device following the step in FIG. 66.
Figure 67B:
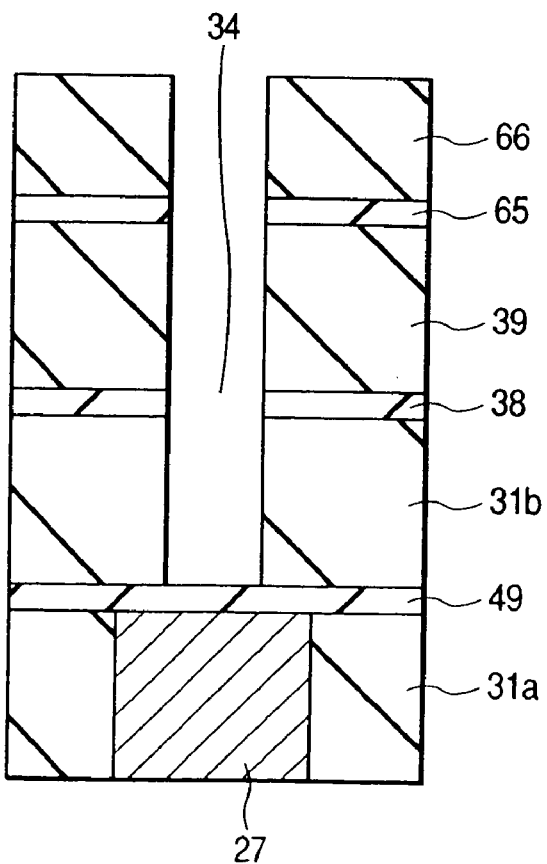
FIG. 67(b) is a sectional view taken along a line A—A in FIG. 6(a).

First, after the steps of FIG. 1–FIG. 5 described in Embodiment 1, and after the step of FIG. 50 of Embodiment 5, a reflection prevention film 65 is coated over the silicon oxide film 39 and a photoresist pattern 66 is formed thereupon, as shown in FIG. 66(b). The photoresist pattern 66 is a mask pattern for forming, for example, flat circular holes, and is formed by ordinary photolithography. Next, as shown in FIG. 67(b), the reflection prevention film 65 which remains exposed is removed by dry etching using the photoresist pattern 66a mask, and the through hole 34 is formed by removing the silicon oxide film 39, silicon nitride film 38 and silicon oxide film 31b by dry etching. The etching of the silicon oxide film 39, silicon nitride film 38 and silicon oxide film 31b is first performed non-selectively, then the etching selection ratio of the silicon oxide film and silicon nitride film is increased, and etching is performed under conditions such that the silicon oxide film is removed more easily than the silicon nitride film. As a result, the through hole 34 is opened using the silicon nitride film 49 as an etching stopper. Therefore, at this stage, the silicon nitride film 49 is exposed at the bottom surface of the through hole 34.

Figure 68A:
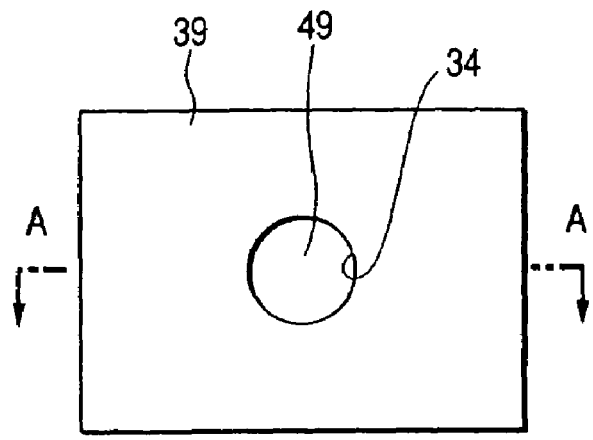
FIG. 68(a) is a plan view of the essential parts in a process for manufacturing a semiconductor integrated circuit device following the step in FIG. 67.
Figure 68B:
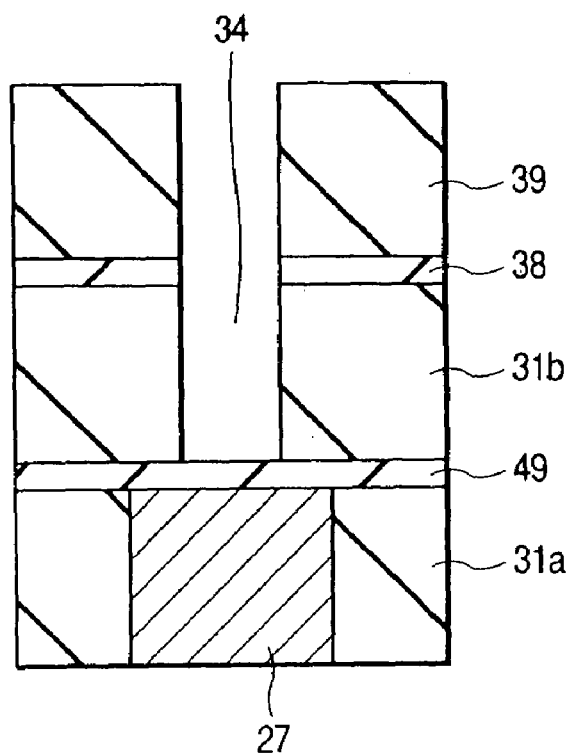
FIG. 68(b) is a sectional view along line a line A—A in FIG. 68(a).
Figure 69A:
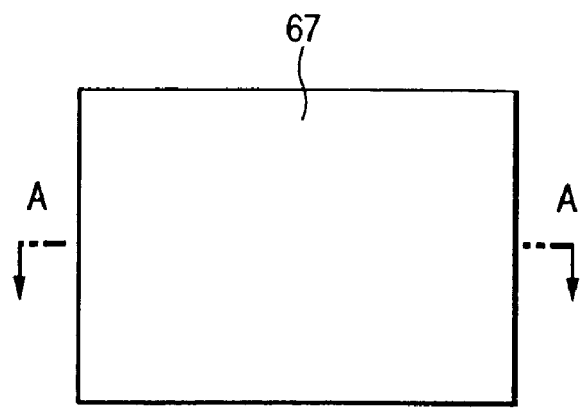
FIG. 69(a) is a plan view of the essential parts in a process for manufacturing a semiconductor integrated circuit device following the step in FIG. 68.
Figure 69B:
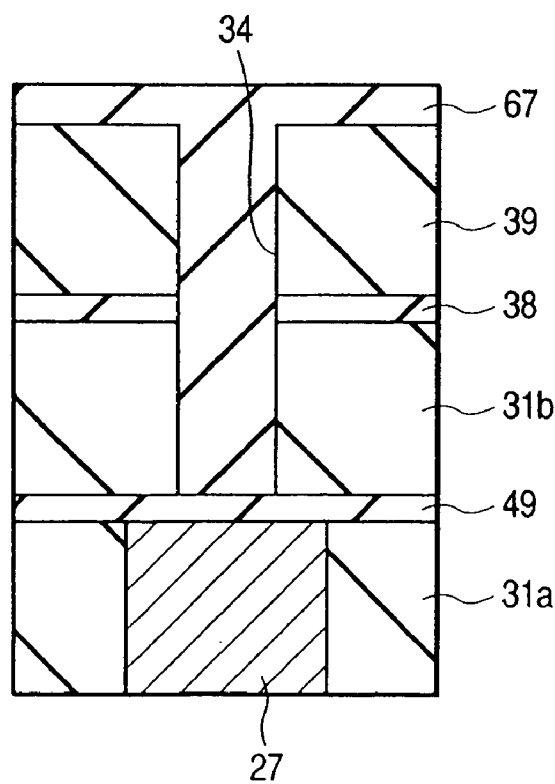
FIG. 69(b) is a sectional view taken along line A—A in FIG. 69(a).
Figure 70A:
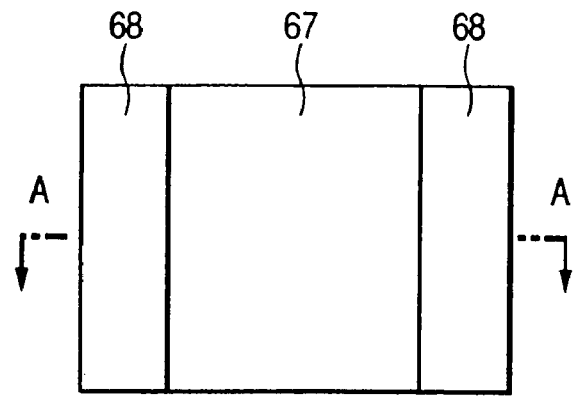
FIG. 70(a) is a plan view of the essential parts in a process for manufacturing a semiconductor integrated circuit device following the step in FIG. 69.
Figure 70B:
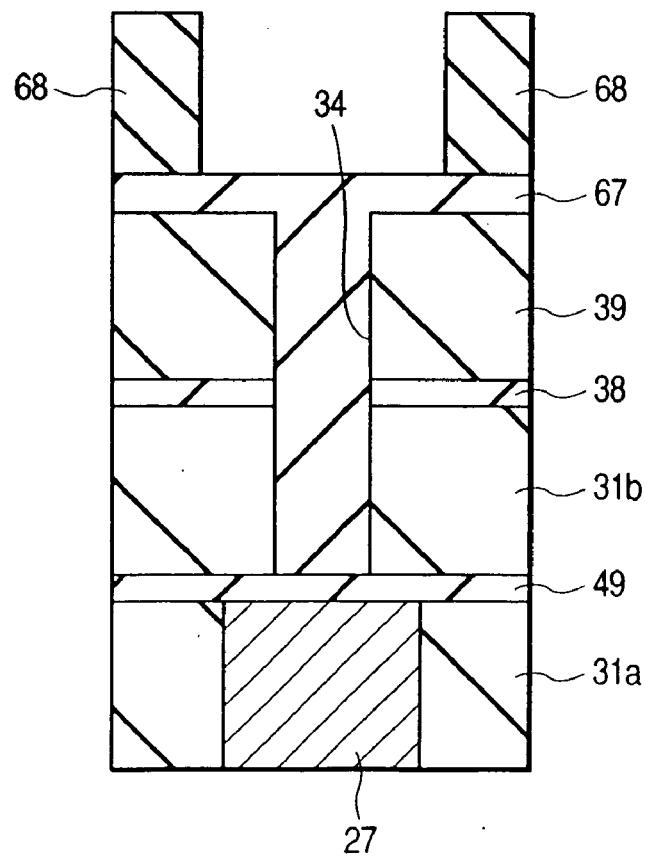
FIG. 70(b) is a sectional view taken along line A—A in FIG. 70(a).
Figure 71A:
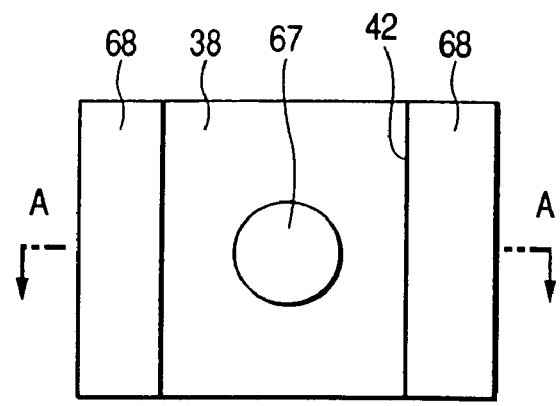
FIG. 71(a) is a plan view of the essential parts in a process for manufacturing a semiconductor integrated circuit device following the step in FIG. 70.
Figure 71B:
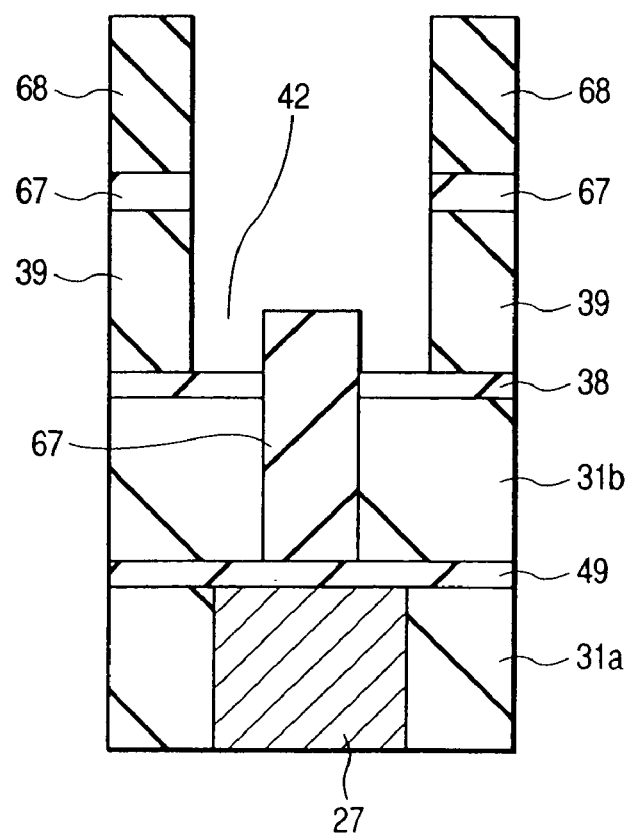
FIG. 71(b) is a sectional view taken along line A—A in FIG. 71(a).

Next, as shown in FIG. 68(b), the photoresist pattern 66 and reflection prevention film 65 are removed by ashing, etc., and as shown in FIG. 69(b), a reflection prevention film 67 is coated over the whole surface of the silicon oxide film 39 so that it is embedded in the through hole 34. Next, as shown in FIG. 70(b), a photoresist pattern 68 is formed over the reflection prevention film 67. The photoresist pattern 68 is a mask pattern for forming, for example, a flat band-shaped interconnection slot, and is formed by ordinary photolithography. Subsequently, as shown in FIG. 71(b), the reflection prevention film 67 which remains exposed is removed by dry etching using the photoresist pattern 68 as a mask, and the interconnection slot 42 is formed by removing the silicon oxide film 39 by dry etching. In the etching of this silicon oxide film 39, the etching selectivity ratio of the silicon oxide film and silicon nitride film is increased, and etching is performed under conditions such that the silicon oxide film is removed more easily than the silicon nitride film. In this way, the interconnection slot 42 is formed using the silicon nitride film 38 as an etching stopper. Therefore, at this stage, the silicon nitride film 38 is exposed on the bottom surface of the interconnection slot 42.

Figure 72A:
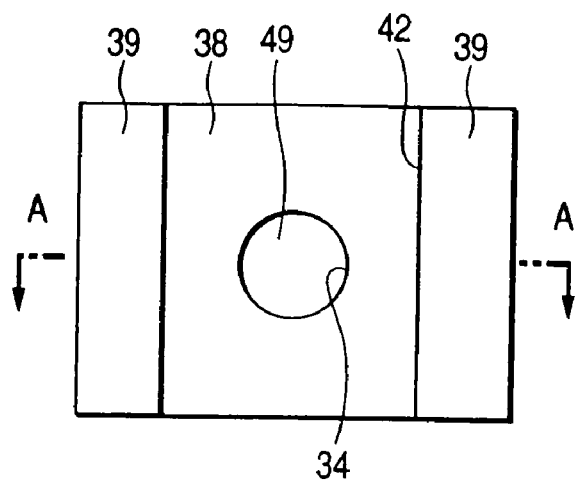
FIG. 72(a) is a plan view of the essential parts in a process for manufacturing a semiconductor integrated circuit device following the step in FIG. 71.
Figure 72B:
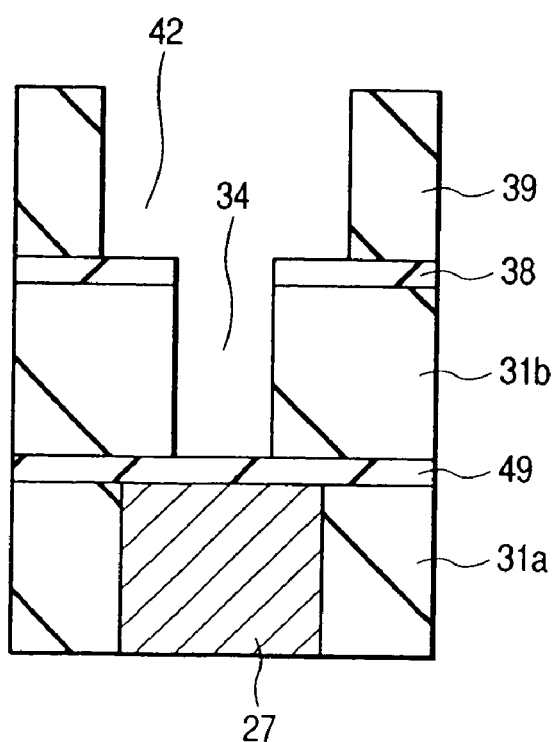
FIG. 72(b) is a sectional view taken along line A—A in FIG. 72(a).
Figure 73A:
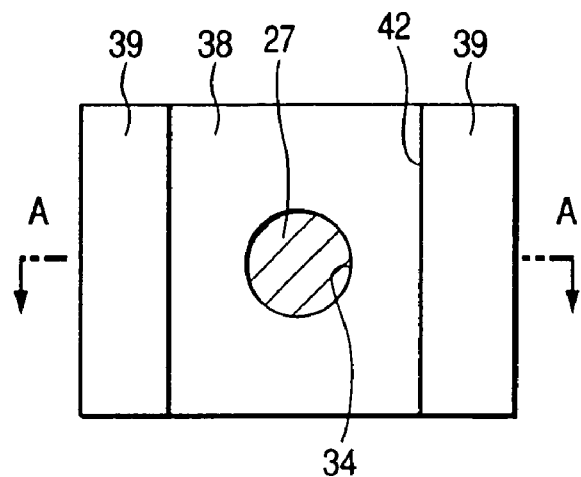
FIG. 73(a) is a plan view of the essential parts in a process for manufacturing a semiconductor integrated circuit device following the step in FIG. 72.
Figure 73B:
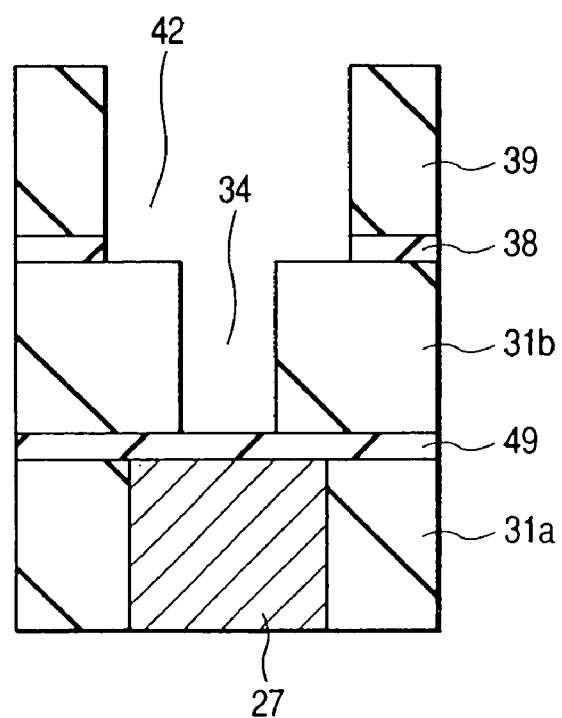
FIG. 73(b) is a sectional view taken along line A—A in FIG. 73(a).

Next, as shown in FIG. 72(b), after removing the photoresist pattern 68 and reflection prevention film 67 by ashing, etc., the silicon nitride films 38, 49 exposed at the base of the interconnection slot 42 and through hole 34 are selectively removed. In this etching step, the etching selectivity ratio of the silicon oxide film and silicon nitride film is increased, and etching is performed so that the silicon nitride film is removed more easily than the silicon oxide film. In this way, as shown in FIG. 73(b), part of the silicon oxide film 39 and W interconnection 27 is exposed from the bottom surface of the interconnection slot 42 and through hole 34. This is in order to make an electrical connection between the W interconnection 27 and the upper layer embedded interconnection. Also, by reducing the silicon nitride films 38, 49 which have a higher dielectric constant than the silicon oxide film as much as possible, it also serves to decrease the interconnection capacitance. In this way, the interconnection slot 42 and through hole 34 are formed.

Figure 74A:
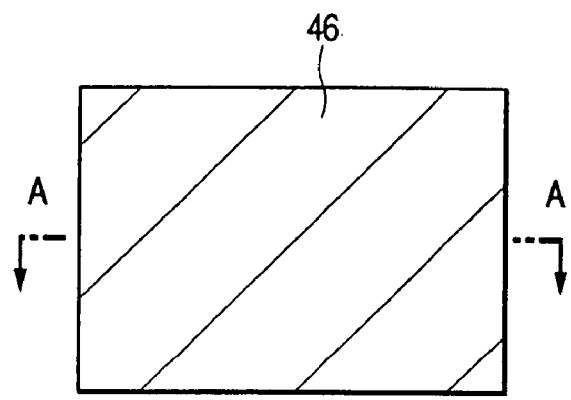
FIG. 74(a) is a plan view of the essential parts in a process for manufacturing a semiconductor integrated circuit device following the step in FIG. 73.
Figure 74B:
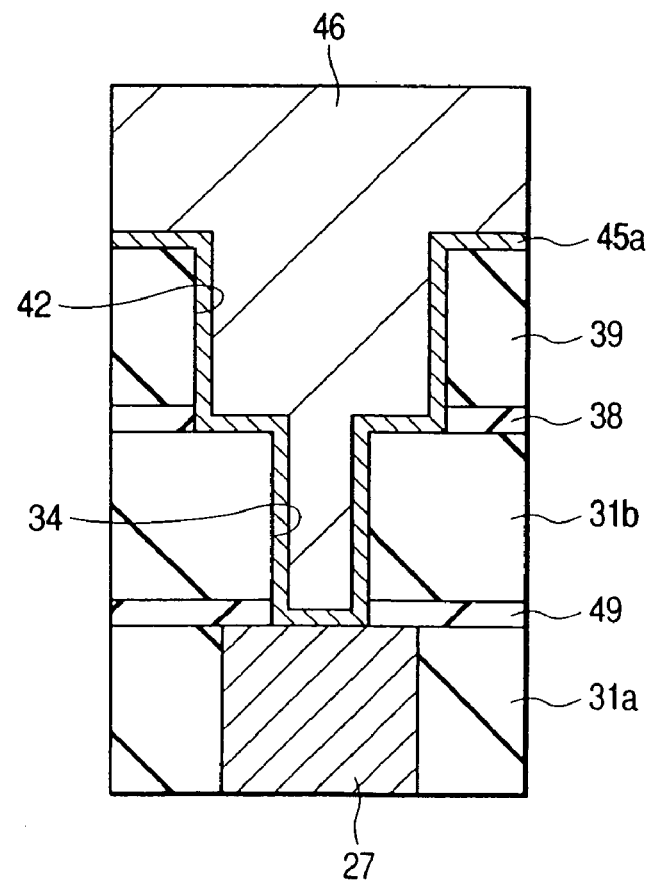
FIG. 74(b) is a sectional view taken along line A—A in FIG. 74(a).

Next, as shown in FIG. 74(b), the Ta film 45a (conducting barrier film) is deposited by sputtering under identical conditions to the Single Damascene method described in Embodiment 6. In this step, the Ta film 45a is deposited at the thickest point or the thinnest point of the side walls of the interconnection slot 40, for example, to less than 10 nm, or about 6–7 nm. Herein, the conducting barrier film was Ta, but as described above, TiN or another film may be used.

Next, the Cu film 46 is deposited over the Ta film 45a to the thickness of, for example, about 150 nm as-deposited film thickness, by an identical sputtering method to that of Embodiment 6. The target used in this step was, for example, oxygen-free Cu of a high purity, for example, 99.999% (5N) or higher, or preferably 99.9999% (6N) or higher. Hence, the concentration of Cu in the Cu film 46 when the film is formed is 99.999% or higher, or preferably 99.9999% or higher. Therefore, Cu of high purity can be deposited over the bottom surface and side walls of the Cu interconnection.

Subsequently, the Cu film 46 is formed by electrolysis plating or the like. The conditions when the Cu film 46 is embedded in the through hole 34 by electrolysis plating are, for example, current density 0.5–1.0 A/dm$^2$, approx. 40 seconds. The conditions when the Cu film 46 is embedded in the interconnection slot 42 are, for example, current density 1.0–2.0 A/dm$^2$, approx. 140 seconds.

Next, hydrogen annealing is performed in the same way as in the Single Damascene method described in Embodiment 6. This treatment may sometimes be omitted.

Figure 75A:
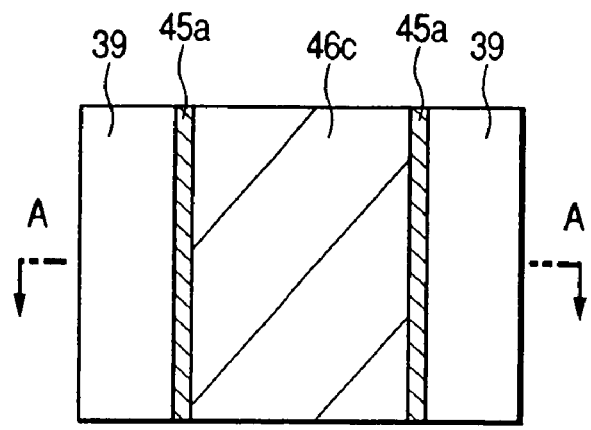
FIG. 75(a) is a plan view of the essential parts in a process for manufacturing a semiconductor integrated circuit device following the step in FIG. 74.
Figure 75B:
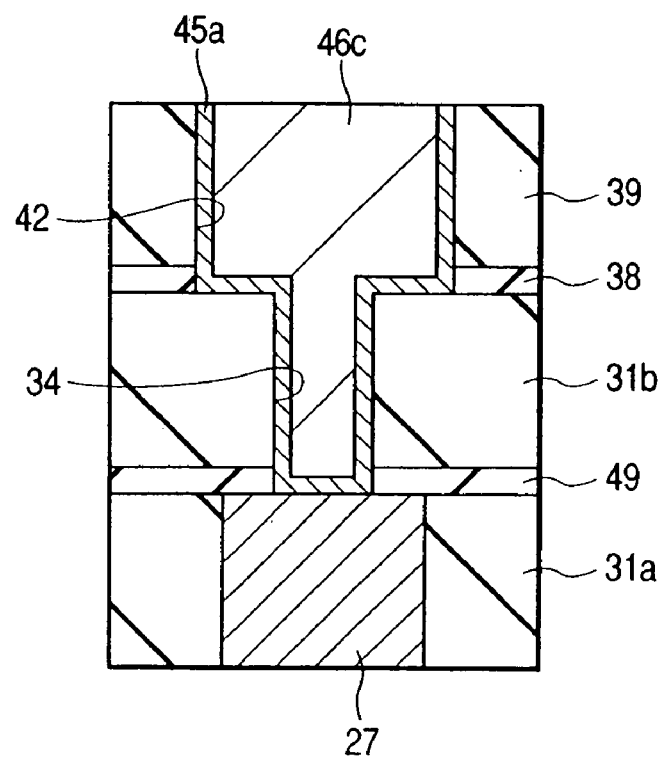
FIG. 75(b) is a sectional view taken along line A—A in FIG. 75(a).
Figure 76A:
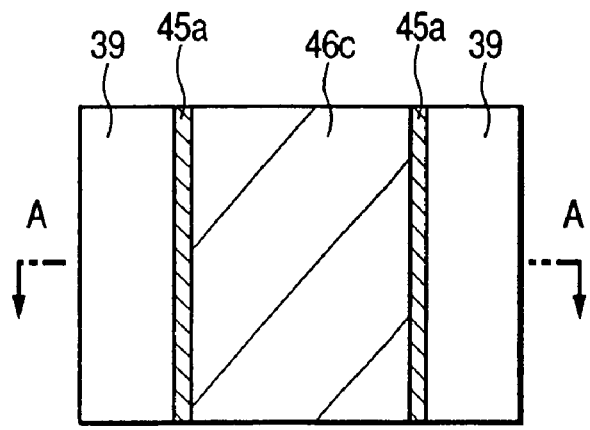
FIG. 76(a) is a plan view of the essential parts in a process for manufacturing a semiconductor integrated circuit device following the step in FIG. 75.
Figure 76B:
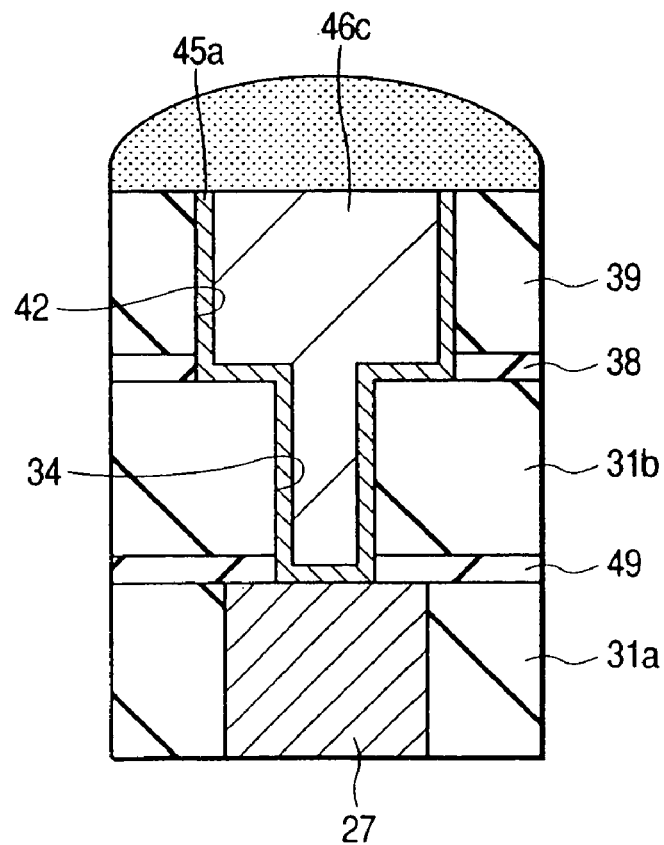
FIG. 76(b) is a sectional view taken along line A—A in FIG. 76(a).

Next, as shown in FIG. 75(b), the Cu film 46c is formed by polishing the Cu film 46 and Ta film 45a by a CMP technique identical to that described in Embodiments 1 and 2 to remove excess material, and an anticorrosion treatment identical to that of Embodiments 1, 2 and washing treatment identical to that of Embodiments 1–3 are performed. Subsequently, the ammonia plasma treatment or hydrogen plasma treatment described in Embodiment 1 are performed on the surface of the insulating film 39 and Cu film 46c, as shown by the dotted shading of FIG. 76(b). In this way, the same effect as that of the Single Damascene method described in Embodiment 6 can be obtained.

Figure 77A:
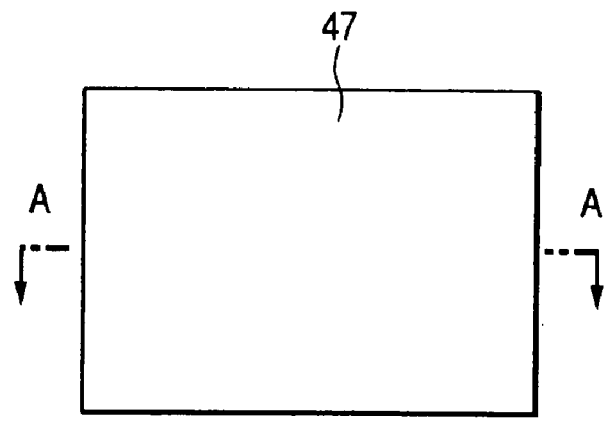
FIG. 77(a) is a plan view of the essential parts in a process for manufacturing a semiconductor integrated circuit device following the step in FIG. 76.
Figure 77B:
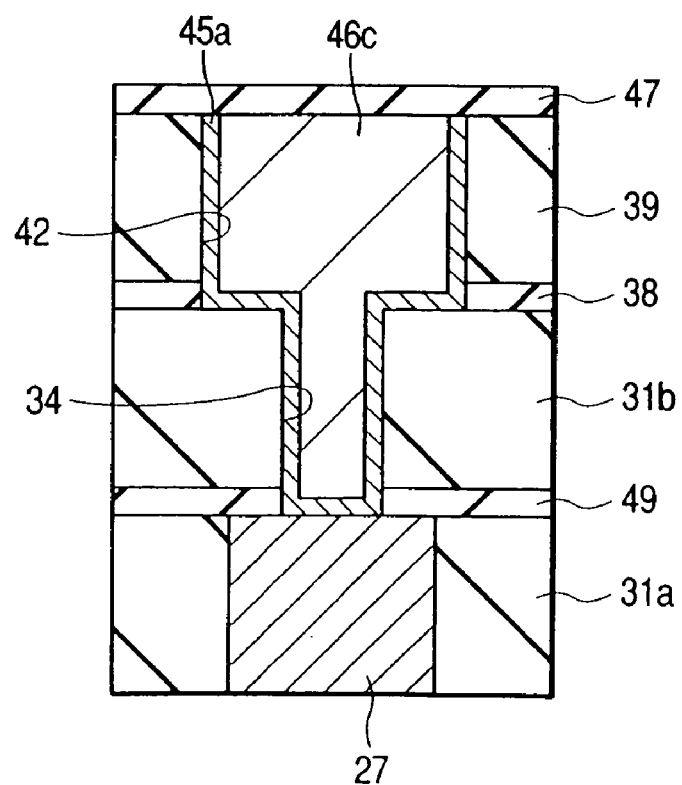
FIG. 77(b) is a sectional view taken along line A—A in FIG. 77(a).

Subsequently, as shown in FIG. 77(b), the silicon nitride film (cap film) 47 is deposited in the same way as in Embodiment 1, and as shown in FIG. 60(b), the silicon oxide film 48 is formed by plasma CVD or the like using for example TEOS gas on the silicon nitride film 47.

In this Embodiment 6, in addition to the effect obtained by the construction of Embodiment 6, concerning structural parts which are identical to those of the aforesaid Embodiments 1–5, identical effects to those described in Embodiments 1–5 can be obtained.

(Embodiment 7)

Figure 78A:
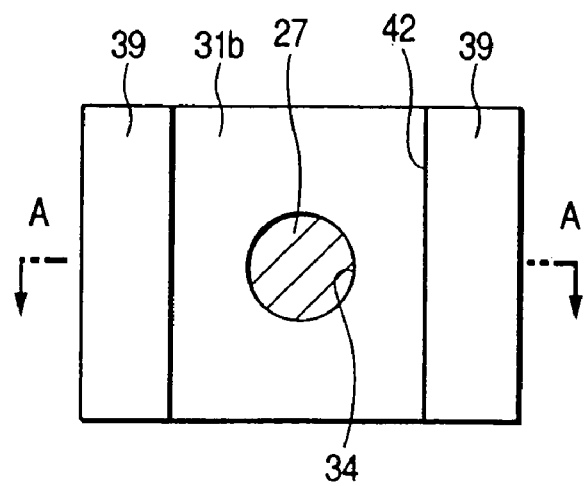
FIG. 78(a) is a plan view of the essential parts in a process for manufacturing a semiconductor integrated circuit device according to an embodiment of this invention.
Figure 78B:
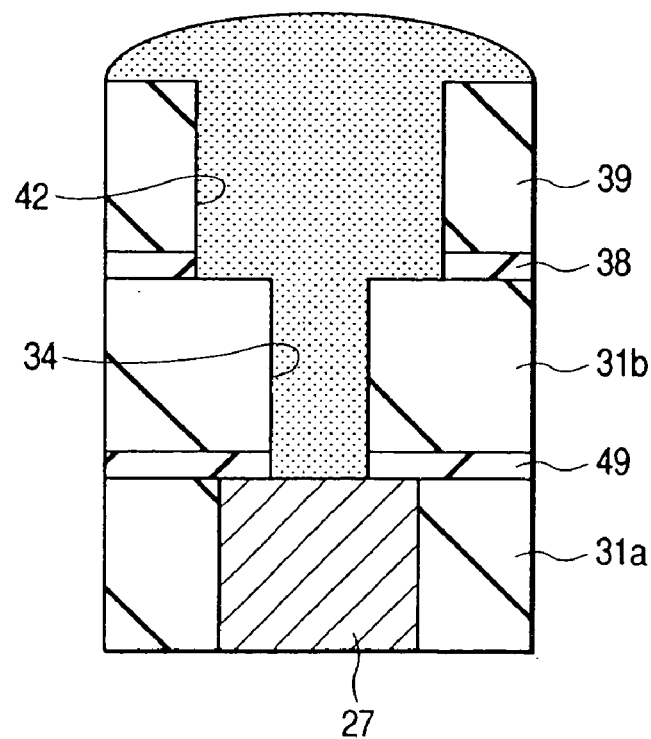
FIG. 78(b) is a sectional view taken along line A—A in FIG. 78(a).
Figure 79A:
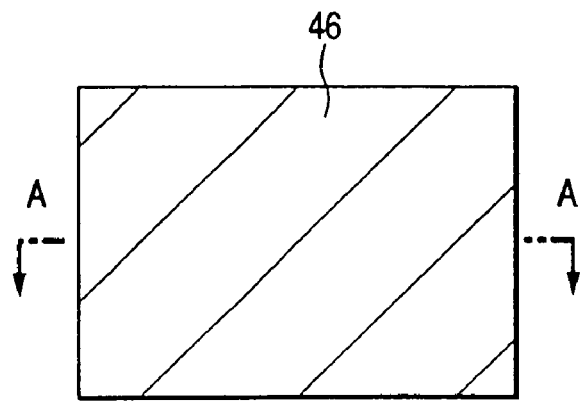
FIG. 79(a) is a plan view of the essential parts in a process for manufacturing a semiconductor integrated circuit device following the step in FIG. 78.
Figure 79B:
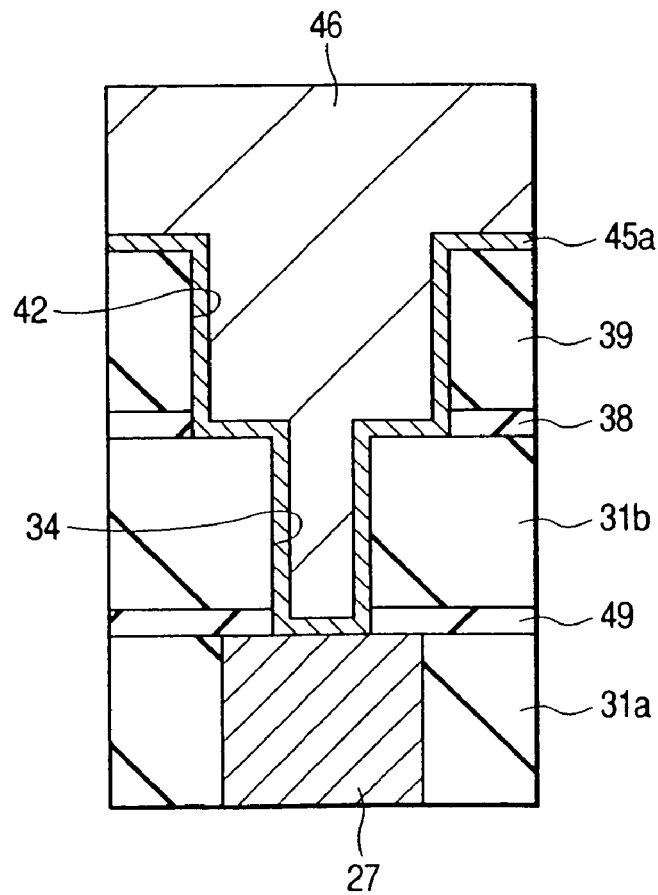
FIG. 79(b) is a sectional view taken along line A—A in FIG. 79(a).

In Embodiment 7, after forming interconnection slots and connecting holes, the aforesaid ammonia plasma treatment or hydrogen plasma treatment is performed. The Single Damascene method and Dual Damascene method are identical, so Embodiment 7 will be described with reference to FIGS. 78(a), 78(b) and FIGS. 79(a), 79(b) taking the Dual Damascene method as an example. FIG. 78(a), FIG. 79(a) show plan views of the essential parts during the fabrication of the semiconductor integrated circuit device, and FIG. 78(b), FIG. 79(b) show sectional views taken on line A—A in FIG. 78(a), FIG. 79(a), respectively. FIG. 78(a), FIG. 79(a) are plan views wherein the metal films have been shaded to make the drawings easier to understand.

In Embodiment 7, after performing the fabrication steps described with reference to FIG. 66(a)–FIG. 73(b) of the aforesaid Embodiment 6, ammonia plasma treatment or hydrogen plasma treatment is performed as shown by the dotted shading of FIG. 78(b).

When ammonia plasma treatment is performed, SiH bonds and SiN and bonds are formed on the surface of the silicon oxide film 39 in the side walls of the interconnection slot 42, the upper surface of the silicon oxide film 31b in the base part of the interconnection slot 42 and the surface of the silicon oxide film 31b in the side walls of the through hole 34 (e.g., a thin silicon nitride film of less than 10 nm is formed). As a result, the quality, degree of cleanliness and electrical stability of the upper surface of the silicon oxide film 39, the surface of the silicon oxide film 39 in the side walls of the interconnection slot 42, the upper surface of the silicon oxide film 31b in the base part of the interconnection slot 42 and the surface of the silicon oxide film 31b in the side walls of the through hole 34, can be improved, and the Cu diffusion preventing ability can be improved. As described in the aforesaid Embodiment 1, adhesion between the silicon oxide film 39 and the cap film can also be improved. After performing ammonia plasma treatment, the nitride film (in this case, WN film) formed over the W interconnection 27 may also be removed by lightly performing dry etching.

On the other hand, when hydrogen plasma treatment is performed, SiH bonds are formed on the upper surface of the silicon oxide film 39, the surface of the silicon oxide film 39 in the side walls of the interconnection slot 42, the upper surface of the silicon oxide film 31b in the base part of the interconnection slot 42 and the surface of the silicon oxide film 31b in the side walls of the through hole 34. As a result, a substantially identical effect to that of ammonia plasma treatment is obtained.

Next, as shown in FIG. 79(b), the Ta film 45a and Cu film 46 are formed in sequence from the bottom layer in the same way as in Embodiment 6. The remaining steps are identical to those of Embodiment 6, and will not be repeated.

In Embodiment 7, in addition to the effect obtained in Embodiment 6, by performing ammonia plasma treatment or hydrogen plasma treatment also on the side walls of the interconnection slot 42 and through hole 34, the TDDB life is further improved, so that the reliability and yield of the semiconductor integrated circuit device can be further improved.

(Embodiment 8)

Figure 80A:
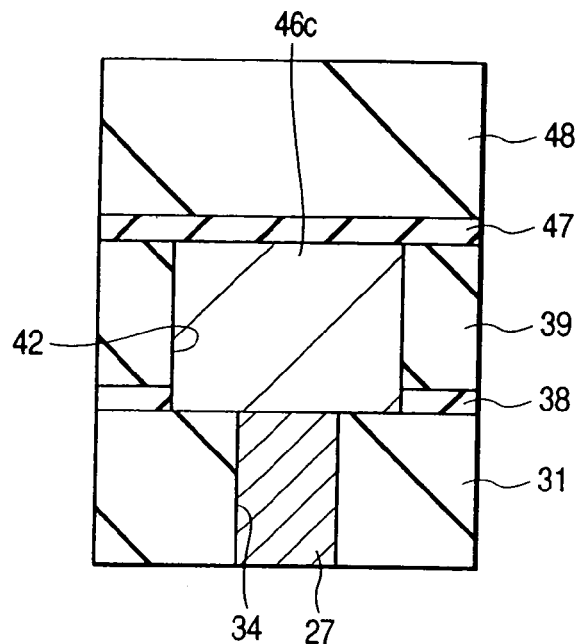
FIGS. 80(a) and 80(b) are sectional views of the essential parts of a copper embedded interconnection layer of a semiconductor integrated circuit device according to yet another embodiment of this invention.
Figure 80B:
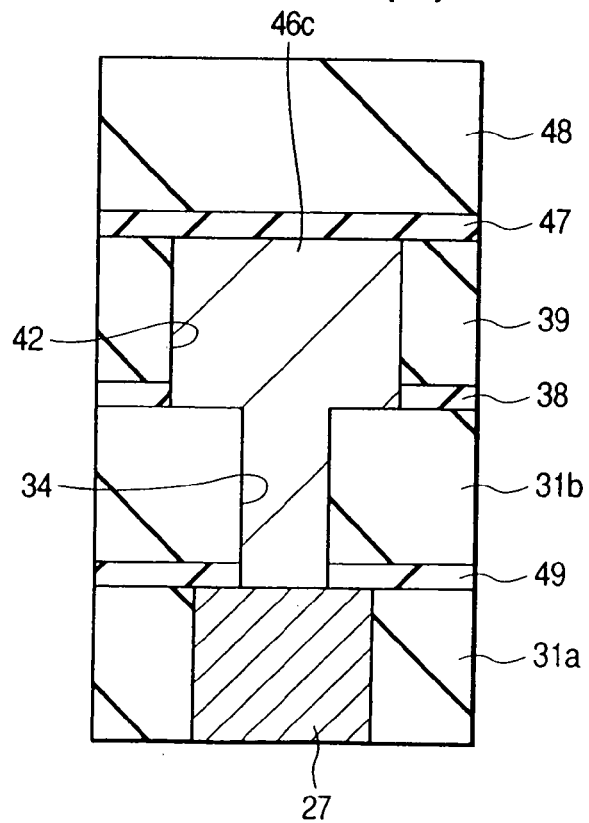

A specific example of the interconnection structure of the semiconductor integrated circuit device of Embodiment 8 will now be described with reference to FIGS. 80(a) and 80(b), which are sectional views showing part of the semiconductor integrated circuit device. FIG. 80(a) shows a point formed by the Single Damascene method, and FIG. 80(b) shows a point formed by the Dual Damascene method.

In Embodiment 8, the conducting barrier film is not formed. Specifically, only Cu is embedded in the interconnection slot 42 or through hole 34. Therefore, the side walls and base part of the Cu interconnection 46c are effectively in direct contact with the silicon oxide film 39. However, when the method described in Embodiment 7 is used, the side walls and base part of the Cu interconnection 46c are directly in contact with the thin silicon nitride film formed over the side walls and base part of the silicon oxide film 39 in the interconnection slot 42 and through hole 34.

The concentration and distribution of components other than Cu represented by the Cu interconnection 46c are identical to those described in Embodiment 6. The materials of the interlayer insulating films used instead of the silicon oxide films 31a, 31b, 31, 39, 48 are also identical. Further, dimensions, such as the line width (width of the interconnection slot 42) and adjacent line interval (distance between opposite lateral surfaces of adjacent interconnections), are identical to those described with reference to FIGS. 60(a) and 60(b) of Embodiment 6.

In this Embodiment 8 also, as described in Embodiment 6, the TDDB life can be enhanced. Therefore, the yield and reliability of the semiconductor integrated circuit device can be improved. In Embodiment 8, the conducting barrier film is not provided and only the Cu film 46 is embedded in the interconnection slot 42 and through hole 34, so that the interconnection resistance can be largely improved. Further, different interconnection layers are directly connected without the intermediary of the conducting barrier film (Ta film 45a or TiN film 45) (herein, a structure is shown as an example wherein the Cu film 46c and W interconnection 27 are directly connected, but Cu interconnections in different interconnection layers may also be directly connected), so that the connection resistance between different interconnection layers can be largely reduced, and the resistance of fine through holes can be decreased. Therefore, the performance of the semiconductor integrated circuit device can be enhanced even if the interconnection slots 42 and through holes 34 become finer.

Figure 81A:
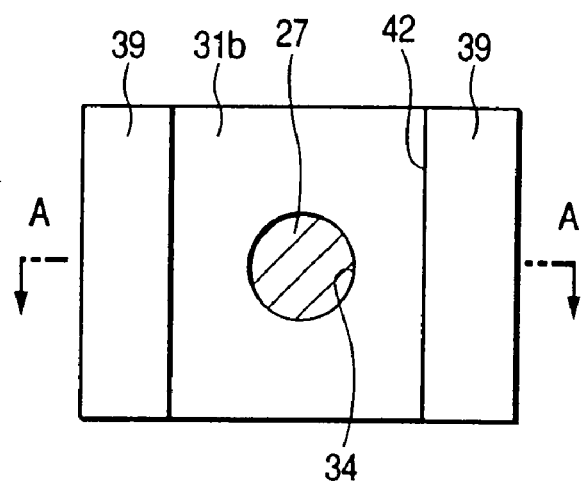
FIG. 81(a) is a plan view of the essential parts in a process for manufacturing a semiconductor integrated circuit device according to an embodiment of this invention.
Figure 81B:
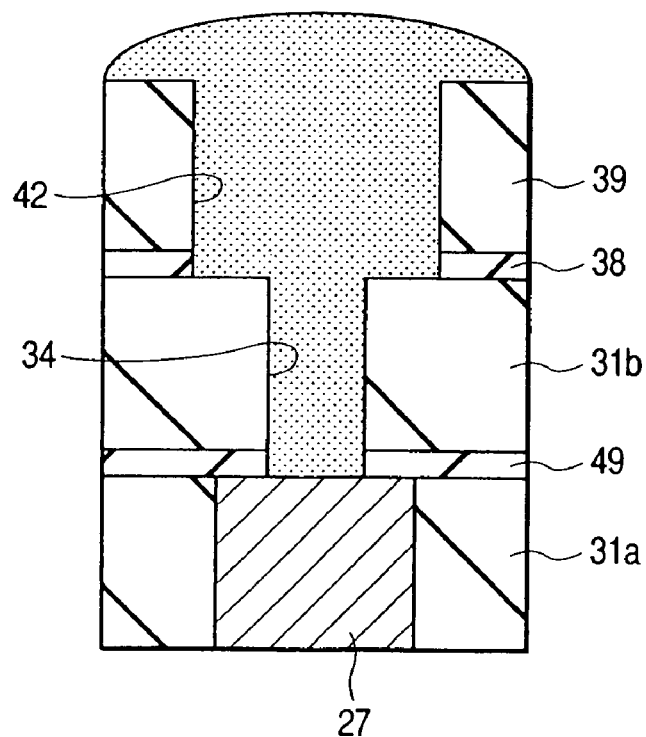
FIG. 81(b) is a sectional view taken along line A—A in FIG. 81(a).
Figure 82A:
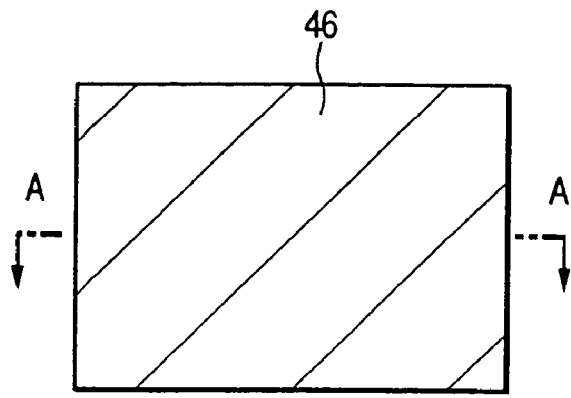
FIG. 82(a) is a plan view of the essential parts in a process for manufacturing a semiconductor integrated circuit device following the step in FIG. 81.

The method of forming this Cu interconnection structure is identical to that of Embodiments 6 and 7. As an example, the method of forming the Cu interconnection structure of Embodiment 8 by the Dual Damascene method will be described with reference to FIG. 81(a)–FIG. 84(b). FIGS. 81(a), 82(a), 83(a), and 84(a) show plan views of the essential parts during the fabrication of the semiconductor integrated circuit device, and FIGS. 81(b), 82(b), 83(b), and 84(b) show sectional views taken on a line A—A in FIGS. 81(a), 82(a), 83(a), and 84(a), respectively. FIGS. 81(a), 82(a), 83(a) are plan views wherein the metal films have been shaded to make the drawings easier to understand.

In Embodiment 8, after performing the fabrication steps described with reference to FIG. 66(a)–FIG. 73(b) of the aforesaid Embodiment 6, ammonia plasma treatment or hydrogen plasma treatment is performed as shown by the dotted shading of FIG. 81(b).

When ammonia plasma treatment is performed, as in Embodiment 7, the quality, degree of cleanliness and electrical stability of the upper surface of the silicon oxide film 39, the surface of the silicon oxide film 39 in the side walls of the interconnection slot 42, the upper surface of the silicon oxide film 31b in the base part of the interconnection slot 42 and the surface of the silicon oxide film 31b in the side walls of the through hole 34, can be improved, and the Cu diffusion preventing ability can be improved. As in the aforesaid Embodiment 1, adhesion between the silicon oxide film 39 and the cap film can also be improved. As in Embodiment 7, after performing ammonia plasma treatment, the nitride film (in this case, WN film) formed over the W interconnection 27 may also be removed by lightly performing dry etching.

Figure 82B:
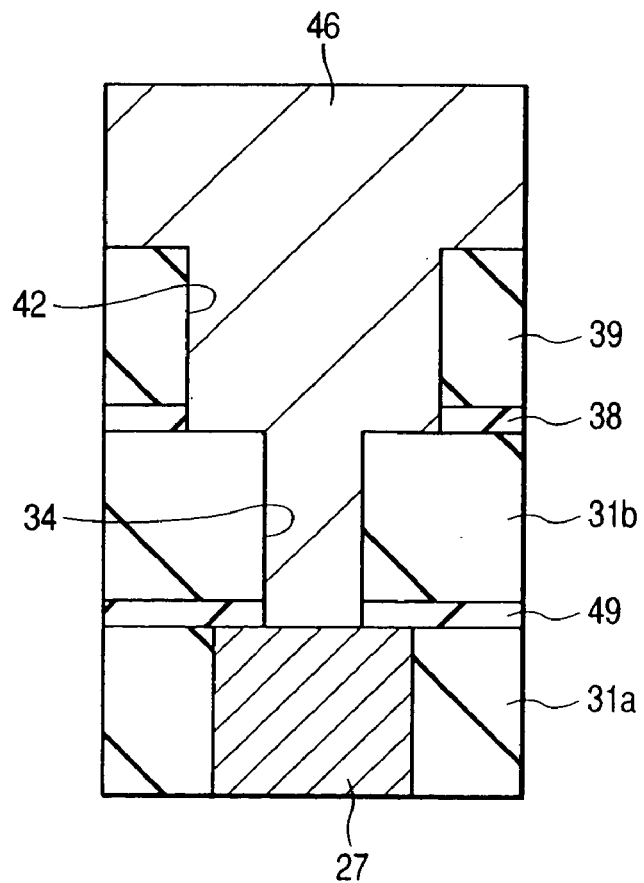
FIG. 82(b) is a sectional view taken along line A—A in FIG. 82(a).
Figure 83A:
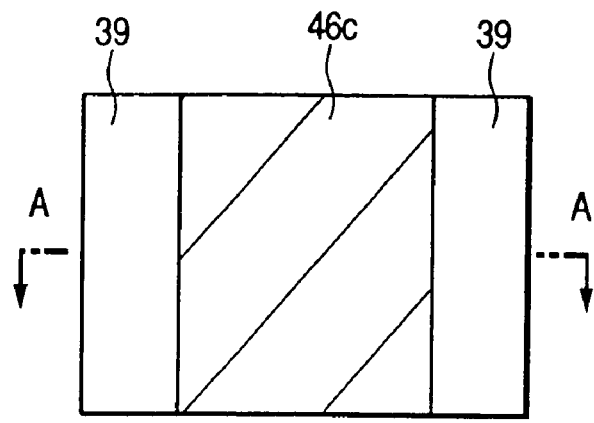
FIG. 83(a) is a plan view of the essential parts in a process for manufacturing a semiconductor integrated circuit device following the step in FIG. 82.

Next, as shown in FIG. 82(b), the Cu film 46 of high purity is deposited in the same way as in the Cu film forming step of Embodiment 6. Specifically, in Embodiment 8, the Cu film 46 of high purity is deposited directly over the silicon oxide film 39 (including the interior of the interconnection slot 42 and through hole 34) without depositing the conducting barrier film (Ta film 45a or TiN film 45). It may be considered that the Cu film 46 embedded in the interconnection slot 42 and through hole 34 is in direct contact with the thin silicon nitride film in its side walls and at its base. In this structure, therefore, it is probably difficult for Cu to ionize in the side walls and at the base of the Cu film 46.

Subsequently, as in Embodiment 6, after the Cu film 46 is polished and removed by CMP or the like, cleaning treatment is performed. In this way, as shown in FIG. 83(a), the Cu film 46c is formed. The Cu film 46c is basically formed of Cu.

Figure 83B:
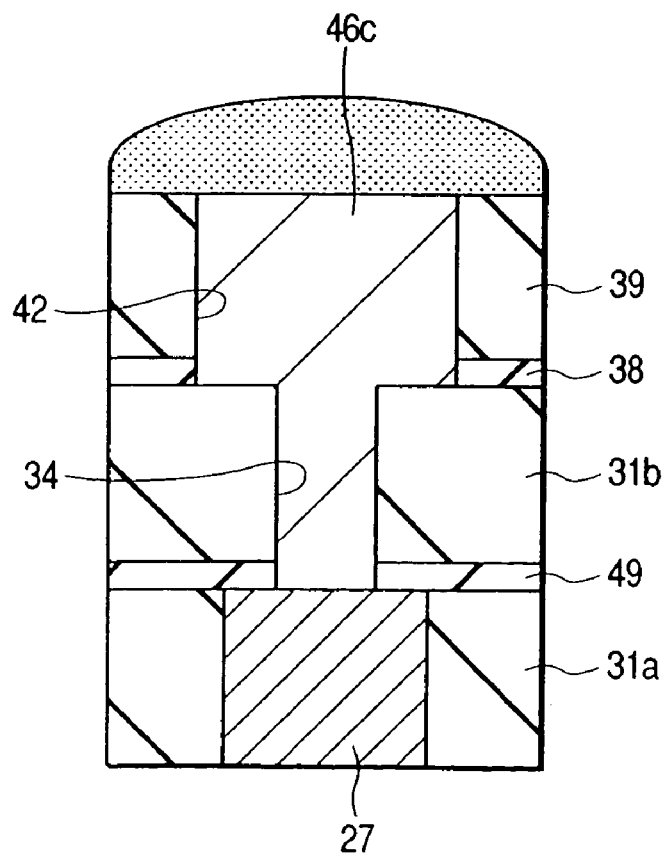
FIG. 83(b) is a sectional view taken along line A—A in FIG. 83(a).

Next, the above ammonia plasma treatment or hydrogen plasma treatment is performed on the upper surface of the silicon oxide film 39 and the upper surface (exposed surface) of the Cu film 46c, as shown by the dotted shading of FIG. 83(b). In this way, as in Embodiment 6, Cu diffusion can be prevented, and the TDDB life can be enhanced. Further, since the purity of Cu can be kept high, the resistance of the Cu interconnection in the finished semiconductor chip can be reduced.

Figure 84A:
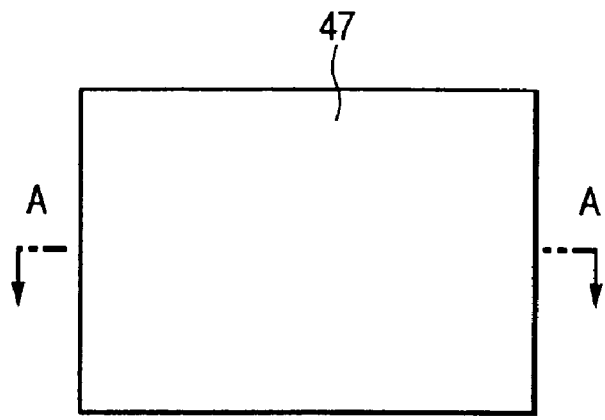
FIG. 84(a) is a plan view of the essential parts in a process for manufacturing a semiconductor integrated circuit device following the step in FIG. 83.
Figure 84B:
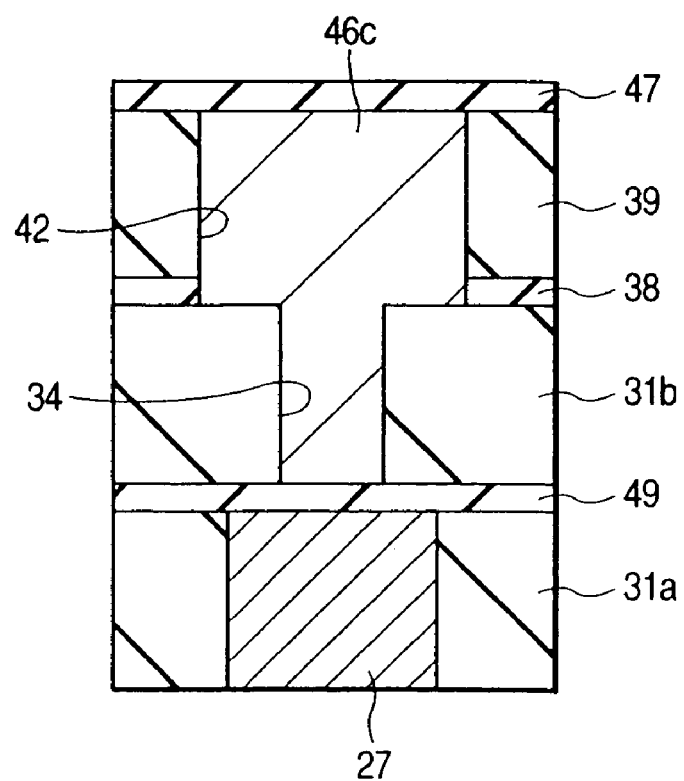
FIG. 84(b) is a sectional view taken along line A—A in FIG. 84(a).

Next, as shown in FIG. 84(b), similar to Embodiment 6, the silicon nitride film (cap film) 47 is deposited in the same way as in Embodiment 1, and the silicon oxide film 48 is deposited thereon by plasma CVD using, for example, TEOS gas as shown in FIG. 80(b).

In this Embodiment 8, in addition to the effect of Embodiments 1–7, the following effect is obtained. Since a conducting barrier film is not provided, the resistance of the Cu interconnection 46c can be largely reduced. Therefore, the performance of the semiconductor integrated circuit device can be improved.

This invention has been described by way of specific examples based on various embodiments, but the invention is not limited to these embodiments, various modifications being possible within the scope and spirit of the appended claims.

For example, it will be understood that, although Embodiments 1–8 can of course be used alone, they may be used in combination. For example, chemical mechanical polishing may be performed with an abrasive particle-free slurry using the technology of Embodiment 2, acid treatment subsequently applied using the technology of Embodiment 3, and ammonia, hydrogen or other plasma treatment performed using the technology of Embodiment 1.

In Embodiments 1–8, the formation of the silicon nitride film 47 after ammonia plasma treatment was performed continuously without a break in the vacuum, but after the ammonia plasma treatment, a break in the vacuum state may be performed first, and the silicon nitride film 47 formed later. If a break in the vacuum is not performed, the effect of the invention is further enhanced, but as a thin nitride layer is formed by ammonia plasma treatment, the formation of an oxide layer can be suppressed even if a break in the vacuum state is performed and the chip is exposed to the atmosphere. Therefore, even in the case of a vacuum break, the effect of this embodiment is still obtained to some extent.

In Embodiments 1–8, a case was described in which the Cu film was formed by sputtering, but if the conditions are such that the purity of Cu can be kept high, plating or CVD may also be used instead of sputtering.

In the above description, a case was described in which this invention as conceived by the Inventors was applied to CMOS-LSI technology, which is the background of the invention, but the invention is not limited to this field, and may be applied, for example, also to semiconductor integrated circuit devices comprising memory circuits, such as DRAM (Dynamic Random Access Memory), SRAM (Static Random Access Memory), flash memory (EEPROM: Electric Erasable Programmable Read Only Memory) or FRAM (Ferroelectric Random Access Memory), semiconductor integrated circuit devices comprising logic circuits such as microprocessors, or mixed semiconductor integrated circuit devices wherein the aforesaid memory circuits and logic circuits are provided on the same semiconductor substrate. This invention may also be applied to semiconductor integrated circuit devices, semiconductor devices, electronic circuit devices or electronic devices having at least a fine copper interconnection structure.

Of the various aspects and features of the invention disclosed in this Application, the advantages obtained by representative examples may be simply described as follows.

(1) According to one feature disclosed in this Application, by making the concentration of components other than copper in the embedded interconnection not more than 0.8 At. % in the finished semiconductor chip, the resistance of the embedded interconnection having copper as its main component can be reduced.

(2) According to another feature disclosed in this Application, as regards the side wall part of the aforesaid depression, by making the thickness of the thickest part of the conducting barrier film less than 10 nm, the resistance of the embedded interconnection having copper as its main component can be reduced.

(3) According to a further feature disclosed in this Application, by providing a construction in which there is no barrier film in the aforesaid depression, the resistance of the embedded interconnection having copper as its main component can be reduced.

(4) According to still another feature disclosed in this Application, by making the concentration of components other than copper in the embedded interconnection not more than 0.8 At. % in the finished semiconductor chip, the insulation breakdown resistance between embedded interconnections having copper as their main component can be improved.

(5) According to a still further feature disclosed in this Application, by providing a step wherein, after removing a metal film by chemical mechanical polishing to form an embedded interconnection layer, the upper surface of an insulating film and the embedded interconnection layer is plasma treated in an atmosphere of a gas having reducing properties, and providing a step of forming a cap insulating film over the insulating film and embedded metal interconnection layer after the plasma treatment, the insulation breakdown resistance between embedded interconnections having copper as their main component can be improved.

(6) According to yet another feature disclosed in this Application, by providing a step wherein, after removing a metal film by chemical mechanical polishing to form an embedded interconnection layer, the upper surface of an insulating film and the embedded interconnection layer is plasma treated in an atmosphere of a gas having reducing properties, and providing a step of forming a cap insulating film over the insulating film and embedded metal interconnection layer after the plasma treatment, adhesion between the interconnection layer of the embedded interconnection having copper as its principal component and the cap film can be improved.

(7) Due to the aforesaid features (1)–(6), the performance of the semiconductor integrated circuit device comprising an embedded interconnection having copper as its main component, can be improved.

(8) Due to the aforesaid features (4)–(6), the reliability of the semiconductor integrated circuit device comprising an embedded interconnection having copper as its main component, can be improved.

(9) Due to the aforesaid features (4)–(6), the yield of the semiconductor integrated circuit device comprising an embedded interconnection having copper as its main component, can be improved.

What is claimed:

1. A method of fabricating a semiconductor integrated circuit device comprising:
   (a) forming a first insulating film and second insulating film over a first major surface of a wafer;
   (b) forming a groove in the second insulating film and a hole in the first insulating film, the hole being connected to a bottom surface of the groove;
   (c) performing an ammonia plasma treatment to an exposed surface in the groove and hole and a top surface of the second insulating film,
   (d) forming a barrier metal film over inner surfaces of the groove and the hole and over an upper surface of the second insulating film;
   (e) forming a copper seed layer over the barrier metal layer inside and outside the groove and the hole by copper sputtering with a copper target having a purity of 99.999% or more;
   (f) forming a copper film containing copper as its principal component on the copper seed layer inside and outside the groove and the hole by electroplating so as to fill the groove and the hole;
   (g) removing the barrier metal film, the copper seed layer and the copper film formed on the copper seed layer outside the groove and the hole so as to leave a copper interconnection in the groove and the hole, thereby exposing the second insulating film;
   (h) performing an ammonia plasma treatment to the exposed surface of the second insulating film and an upper surface of the copper interconnection; and
   (i) forming an insulating barrier film on the exposed surface of the second insulating film and the upper surface of the copper interconnection by plasma CVD.

2. The method of fabricating a semiconductor integrated circuit device as defined in claim 1, wherein the purity of said copper target is not less than 99.9999%.

3. The method of fabricating a semiconductor integrated circuit device as defined in claim 1, wherein a total concentration of components other than copper in the copper interconnection, when step (h) is completed, does not exceed 0.8 At %.

4. The method of fabricating a semiconductor integrated circuit device as defined in claim 3, wherein the total concentration of components other than copper does not exceed 0.08 At %.

5. The method of fabricating a semiconductor integrated circuit device as defined in claim 3, wherein the total concentration of components other than copper does not exceed 0.05 At %.

6. The method of fabricating a semiconductor integrated circuit device as defined in claim 3, wherein the total concentration of components other than copper does not exceed 0.02 At %.

7. The method of fabricating a semiconductor integrated circuit device as defined in claim 1, wherein a film thickness of the thinnest part of the barrier metal film in the groove and the hole is less than 10 nm.

8. The method of fabricating a semiconductor integrated circuit device as defined in claim 7, wherein the film thickness is not more than 3 nm.

9. The method of fabricating a semiconductor integrated circuit device as defined in claim 7, wherein the film thickness is not more than 2 nm, or there is no metal barrier film.

10. The method of fabricating a semiconductor integrated circuit device as defined in claim 1, wherein a width of said groove does not exceed 0.4 µm.

11. The method of fabricating a semiconductor integrated circuit device as defined in claim 1, wherein a width of said groove does not exceed 0.25 µm.

12. The method of fabricating a semiconductor integrated circuit device as defined in claim 1, wherein a width of said groove does not exceed 0.2 µm.

13. A method of fabricating a semiconductor integrated circuit device comprising:
(a) forming a first insulating film and second insulating film over a first major surface of a wafer;
(b) forming a groove in the second insulating film and a hole in the first insulating film, the hole being connected to a bottom surface of the groove;
(c) performing an hydrogen plasma treatment to an exposed surface in the groove and hole and a top surface of the second insulating film;
(d) forming a barrier metal film over inner surface of the groove and the hole and over an upper surface of the second insulating film;
(e) forming a copper seed layer over the barrier metal layer inside and outside the groove and the hole by copper sputtering with a copper target having a purity of 99.999% or more;
(f) forming a copper film containing copper as its principal component on the copper seed layer inside and outside the groove and the hole by electroplating so as to fill the groove and the hole;
(g) removing the barrier metal film, the copper seed layer and the copper film formed on the copper seed layer outside the groove and the hole so as to leave a copper interconnecting in the groove and the hole, thereby exposing the second insulating film;
(h) performing an ammonia plasma treatment to the exposed surface of the second insulating film and an upper surface of the copper interconnection; and
(i) forming an insulating barrier film on the exposed surface of the second insulating film and the upper surface of the copper interconnection by plasma CVD, wherein a total concentration of components other than copper in the copper interconnection, when step (h) is completed, does not exceed 0.8 At %.

14. The method of fabricating a semiconductor integrated circuit device as defined in claim 13, wherein the purity of said copper target is not less than 99.9999%.

15. The method of fabricating a semiconductor integrated circuit device as defined in claim 13, wherein the total concentration of components other than copper does not exceed 0.2 At %.

16. The method of fabricating a semiconductor integrated circuit device as defined in claim 13, wherein the total concentration of components other than copper does not exceed 0.08 At %.

17. The method of fabricating a semiconductor integrated circuit device as defined in claim 13, wherein the total concentration of components other than copper does not exceed 0.05 At %.

18. The method of fabricating a semiconductor integrated circuit device as defined in claim 13, wherein a film thickness of the thinnest part of the barrier metal film in the groove and the hole is less than 10 nm.

19. The method of fabricating a semiconductor integrated circuit device as defined in claim 18, wherein the film thickness is not more than 5 nm.

20. The method of fabricating a semiconductor integrated circuit device as defined in claim 18, wherein the film thickness is not more than 2 nm, or there is no metal barrier film.

* * * * *